US011164887B2

(12) United States Patent
Seo et al.

(10) Patent No.: US 11,164,887 B2
(45) Date of Patent: Nov. 2, 2021

(54) VERTICAL MEMORY DEVICES AND METHODS OF MANUFACTURING THE SAME

(71) Applicant: SAMSUNG ELECTRONICS CO., LTD., Suwon-si (KR)

(72) Inventors: Yujin Seo, Suwon-si (KR); Byoungil Lee, Suwon-si (KR); Subin Kang, Suwon-si (KR); Jimo Gu, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 100 days.

(21) Appl. No.: 16/749,110

(22) Filed: Jan. 22, 2020

(65) Prior Publication Data

US 2020/0357816 A1 Nov. 12, 2020

(30) Foreign Application Priority Data

May 9, 2019 (KR) ........................ 10-2019-0054233

(51) Int. Cl.

*H01L 27/11582* (2017.01)
*H01L 27/1157* (2017.01)
*H01L 27/11565* (2017.01)

(52) U.S. Cl.

CPC .... *H01L 27/11582* (2013.01); *H01L 27/1157* (2013.01); *H01L 27/11565* (2013.01)

(58) Field of Classification Search

CPC ................................................ H01L 27/11582

See application file for complete search history.

(56) References Cited

U.S. PATENT DOCUMENTS

| | | | |
|---|---|---|---|
| 8,564,050 | B2 | 10/2013 | Park et al. |
| 9,245,962 | B1 | 1/2016 | Yang et al. |
| 9,472,569 | B2 | 10/2016 | Lee et al. |
| 9,520,407 | B2 | 12/2016 | Fukuzumi et al. |
| 9,548,313 | B2 | 1/2017 | Yada et al. |
| 9,627,405 | B1 | 4/2017 | Lee |
| 9,748,267 | B2 | 8/2017 | Zhang et al. |
| 9,824,966 | B1 | 11/2017 | Kanakamedala et al. |
| 9,997,534 | B2 | 6/2018 | Son et al. |
| 10,115,733 | B2 | 10/2018 | Fukuzumi et al. |
| 2019/0027494 | A1 | 1/2019 | Fukuzumi et al. |

FOREIGN PATENT DOCUMENTS

| | | | |
|---|---|---|---|
| JP | 2015-149413 | A | 8/2015 |
| KR | 10-2017-0112292 | A | 10/2017 |

*Primary Examiner* — Christopher A Johnson

(74) *Attorney, Agent, or Firm* — Lee IP Law, P.C.

(57) ABSTRACT

A vertical memory device includes channels on a substrate, a channel connecting pattern, gate electrodes, and an etch stop pattern and a blocking pattern sequentially stacked. The channels extend in a first direction perpendicular to an upper surface of the substrate. The channel connecting pattern extends in a second direction parallel to the upper surface of the substrate to cover outer sidewalls of the channels. The gate electrodes are spaced apart from each other in the first direction on the channel connecting pattern, and extend in the second direction to surround the channels. The etch stop pattern and the blocking pattern are sequentially stacked in a third direction parallel to the upper surface of the substrate and crossing the second direction on an end portion of the channel connecting pattern in the third direction, and include different materials from each other.

20 Claims, 71 Drawing Sheets

VERTICAL MEMORY DEVICES AND METHODS OF MANUFACTURING THE SAME

CROSS-REFERENCE TO RELATED APPLICATION

Korean Patent Application No. 10-2019-0054233, filed on May 9, 2019, in the Korean Intellectual Property Office, and entitled: "Vertical Memory Devices and Methods of Manufacturing the Same," is incorporated by reference herein in its entirety.

BACKGROUND

1. Field

Embodiments relate to a vertical memory device and a method of manufacturing the same.

2. Description of the Related Art

During a fabrication of a VNAND flash memory device, a sacrificial layer may be formed between a substrate and a mold, channels may be formed through the mold and the sacrificial layer, openings may be formed through the mold and the sacrificial layer, the sacrificial layer exposed by the openings may be removed to form gaps, and the gaps may be filled with polysilicon layers so that the channels may be connected with each other.

SUMMARY

The embodiments may be realized by providing a vertical memory device including a substrate; channels on the substrate, each of the channels extending in a first direction perpendicular to an upper surface of the substrate; a channel connecting pattern extending in a second direction parallel to the upper surface of the substrate to cover outer sidewalls of the channels, the channel connecting pattern connecting the channels with each other; gate electrodes on the channel connecting pattern and spaced apart from each other in the first direction, each of the gate electrodes extending in the second direction to surround the channels; and an etch stop pattern and a blocking pattern sequentially stacked in a third direction on an end of the channel connecting pattern, the third direction being parallel to the upper surface of the substrate and crossing the second direction, and the etch stop pattern and the blocking pattern including different materials from each other.

The embodiments may be realized by providing a vertical memory device including a substrate; a channel connecting pattern on the substrate; gate electrodes on the channel connecting pattern and spaced apart from each other in a first direction perpendicular to an upper surface of the substrate, each of the gate electrodes extending in a second direction parallel to the upper surface of the substrate; a channel on the substrate and extending in the first direction through the gate electrodes and the channel connecting pattern; and a seed pattern between the substrate and the channel connecting pattern and between the channel and the channel connecting pattern, the seed pattern including silicon and impurities.

The embodiments may be realized by providing a vertical memory device including a substrate including a first region and a second region surrounding the first region; channels on the first region of the substrate, each of the channels extending in a first direction perpendicular to an upper surface of the substrate; a channel connecting pattern on the first region of the substrate and extending in a second direction parallel to the upper surface of the substrate, the channel connecting pattern covering outer sidewalls of the channels and connecting the channels with each other; a sacrificial layer structure on the second region of the substrate and extending in the second direction at a height substantially equal to that of the channel connecting pattern, the sacrificial layer structure including a first sacrificial layer, a second sacrificial layer, and a third sacrificial layer sequentially stacked in the first direction; a support layer on the channel connecting pattern and the sacrificial layer structure; and gate electrodes on the support layer and spaced apart from each other in the first direction, each of the gate electrodes extending in the second direction to surround the channels.

The embodiments may be realized by providing a vertical memory device including a substrate including a cell region and an extension region surrounding the cell region; channels on the cell region of the substrate, each of the channels extending in a first direction perpendicular to an upper surface of the substrate, wherein memory cells are on the cell region of the substrate, and contact plugs for applying signals to the memory cells are on the extension region of the substrate; a channel connecting pattern on the cell region of the substrate, the channel connecting pattern covering outer sidewalls of the channels and connecting the channels with each other; a gate electrode structure including gate electrodes spaced apart from each other in the first direction on the cell region and the extension region of the substrate, each of the gate electrodes surrounding the channels; a common source line (CSL) extending through the gate electrode structure and the channel connecting pattern to contact the upper surface of the substrate, the CSL extending in a second direction parallel to the upper surface of the substrate to divide each of the gate electrode structure and the channel connecting pattern in a third direction parallel to the upper surface of the substrate and crossing the second direction; and a spacer on a sidewall of the CSL, wherein a maximum width in the third direction of the spacer on the cell region of the substrate is greater than a maximum width in the third direction of the spacer on the extension region of the substrate.

The embodiments may be realized by providing a vertical memory device including a substrate; channels on the substrate, each of the channels extending in a first direction perpendicular to an upper surface of the substrate; a channel connecting pattern on the substrate, the channel connecting pattern covering outer sidewalls of the channels and connecting the channels with each other; a gate electrode structure on the substrate and including gate electrodes spaced apart from each other in the first direction, each of the gate electrodes surrounding the channels; and a common source line (CSL) extending through the gate electrode structure and the channel connecting pattern to contact the upper surface of the substrate, the CSL extending in a second direction parallel to the upper surface of the substrate to divide each of the gate electrode structure and the channel connecting pattern in a third direction parallel to the upper surface of the substrate and crossing the second direction, wherein an etch stop pattern, a blocking pattern, and a spacer including silicon oxide, a metal oxide, and silicon oxide, respectively, are sequentially stacked between the channel connecting pattern and the CSL in the third direction.

The embodiments may be realized by providing a method of manufacturing a vertical memory device, the method including sequentially forming a sacrificial layer structure and a support layer on a substrate; alternately and repeatedly stacking an insulation layer and a sacrificial layer on the support layer; forming a channel through the sacrificial layer structure, the support layer, the insulation layer, and the sacrificial layer to contact an upper surface of the substrate; forming a first opening through the insulation layer, the sacrificial layer, and the support layer to expose at least a portion of the sacrificial layer structure; removing the at least portion of the sacrificial layer structure exposed by the first opening to form a first gap exposing a portion of a lower surface of the support layer; oxidizing the exposed portion of the lower surface of the support layer and removing the oxidized portion; removing the sacrificial layer structure to form a second gap exposing an outer sidewall of the channel; forming a channel connecting pattern to partially fill the second gap, the channel connecting pattern surrounding the channel and exposing a portion of the upper surface of the substrate; oxidizing the exposed portion of the upper surface of the substrate and a sidewall of the channel connecting pattern to form an etch stop pattern; removing the sacrificial layer to form a third gap; and forming a gate electrode in the third gap.

The embodiments may be realized by providing a method of manufacturing a vertical memory device, the method including sequentially forming a sacrificial layer structure and a support layer on a substrate; alternately and repeatedly stacking an insulation layer and a sacrificial layer on the support layer; forming a channel through the sacrificial layer structure, the support layer, the insulation layer, and the sacrificial layer to contact an upper surface of the substrate; forming an opening through the insulation layer, the sacrificial layer, and the support layer to expose at least a portion of the sacrificial layer structure; removing the at least portion of the sacrificial layer structure exposed by the opening to form a first gap exposing a portion of a lower surface of the support layer; removing the exposed portion of the lower surface of the support layer; removing the sacrificial layer structure to form a second gap exposing an outer sidewall of the channel; forming a seed layer on an exposed upper surface of the substrate, the lower surface of the support layer, and the outer sidewall of the channel exposed by the second gap, the seed layer including amorphous silicon, carbon, nitrogen, or oxygen; forming a channel connecting pattern to partially fill the second gap, the channel connecting pattern surrounding the channel and exposing a portion of the seed layer on the upper surface of the substrate; removing the sacrificial layer to form a third gap; and forming a gate electrode in the third gap.

The embodiments may be realized by providing a method of manufacturing a vertical memory device, the method including forming a sacrificial layer structure on a substrate; alternately and repeatedly stacking an insulation layer and a sacrificial layer on the sacrificial layer structure; forming a channel through the sacrificial layer structure, the insulation layer, and the sacrificial layer to contact an upper surface of the substrate; forming an opening through the insulation layer and the sacrificial layer to expose at least a portion of the sacrificial layer structure; removing the at least portion of the sacrificial layer structure exposed by the opening to form a first gap exposing the upper surface of the substrate and an outer sidewall of the channel; forming a seed layer on the exposed upper surface of the substrate and the outer sidewall of the channel exposed by the first gap, the seed layer including amorphous silicon, carbon, nitrogen, or oxygen; forming a channel connecting pattern to partially fill the first gap, the channel connecting pattern surrounding the channel and exposing a portion of the seed layer on the upper surface of the substrate; removing the exposed portion of the seed layer to expose the upper surface of the substrate; removing the sacrificial layer to form a second gap; and forming a gate electrode in the second gap.

BRIEF DESCRIPTION OF THE DRAWINGS

Features will be apparent to those of skill in the art by describing in detail exemplary embodiments with reference to the attached drawings in which.

DETAILED DESCRIPTION

Hereinafter, a direction substantially perpendicular to an upper surface of a substrate may be defined as a first direction, and two directions substantially parallel to the upper surface of the substrate and crossing each other may be defined as second and third directions, respectively. In example embodiments, the second and third directions may be substantially perpendicular to each other.

Figure 1:
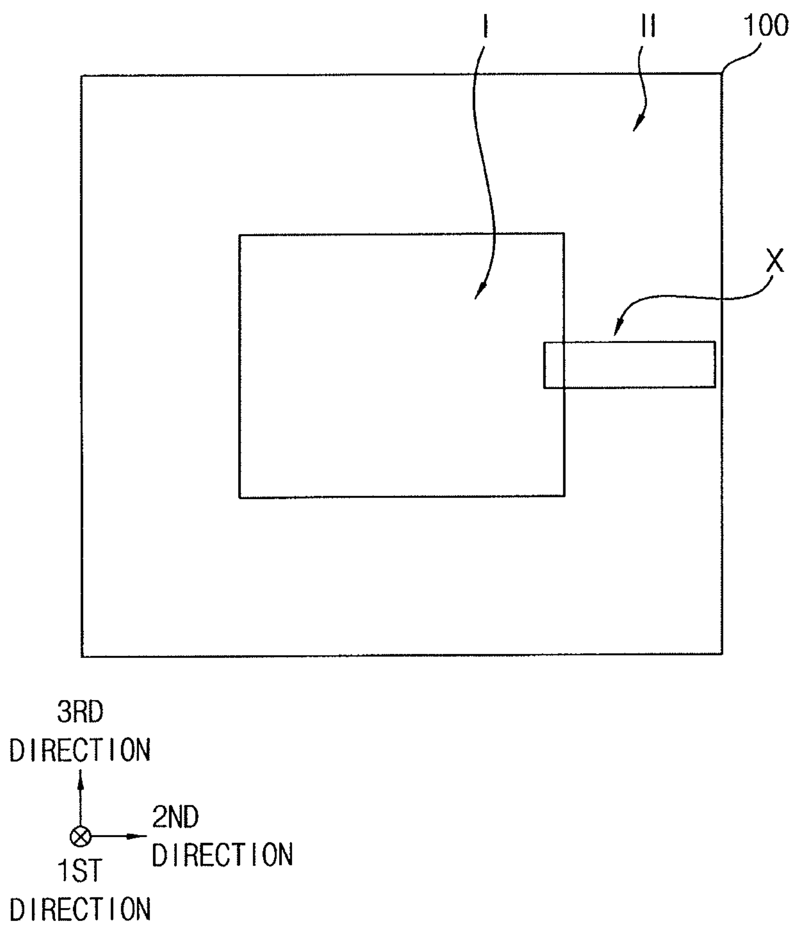
FIGS. 1 to 7 illustrate plan views and cross-sectional views of a vertical memory device in accordance with example embodiments.
Figure 2:
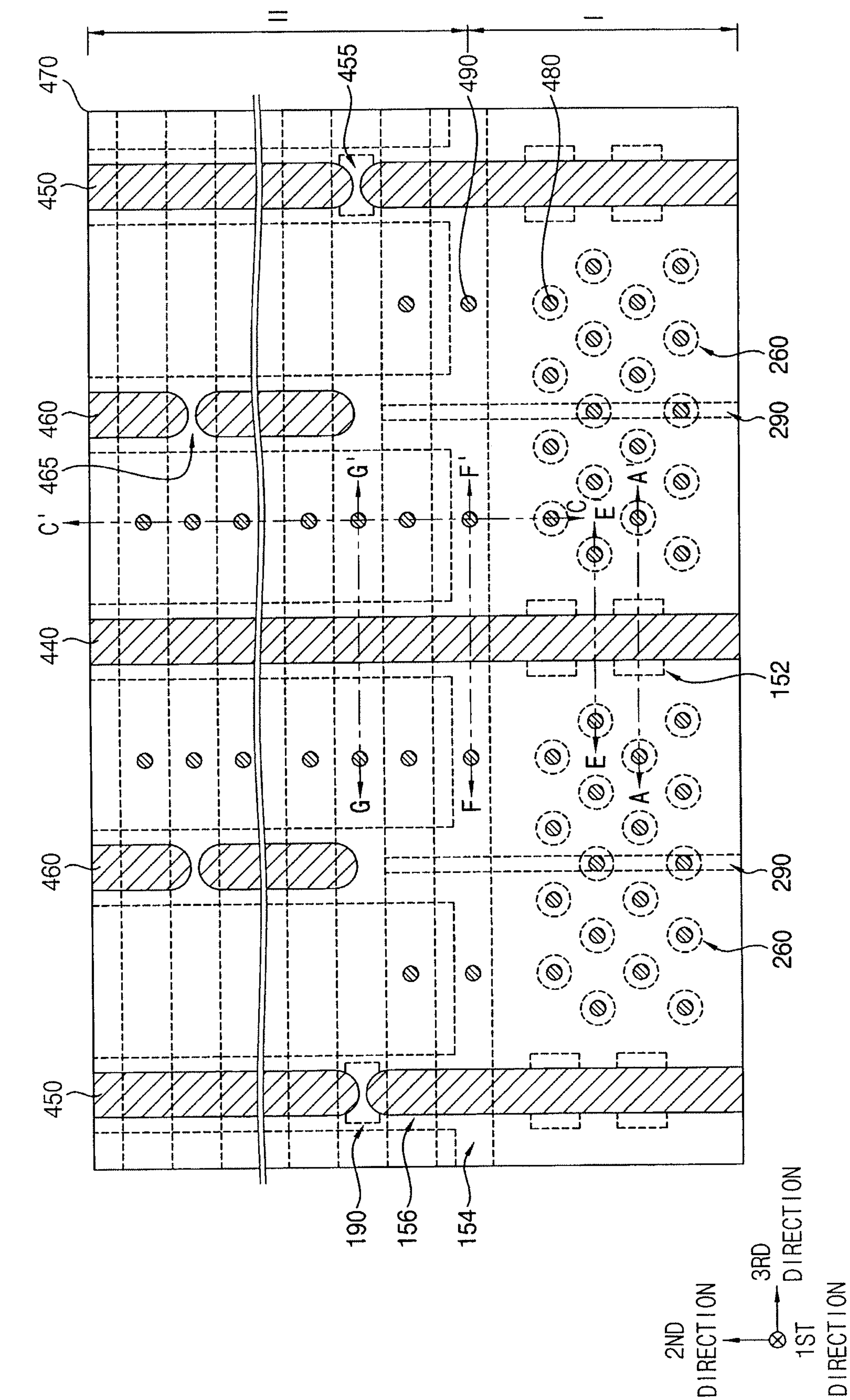

FIGS. 1 to 7 illustrate plan views and cross-sectional views of a vertical memory device in accordance with example embodiments. For example, FIGS. 1 and 2 are plan views, and FIGS. 3 to 7 are cross-sectional views.

Figure 3:
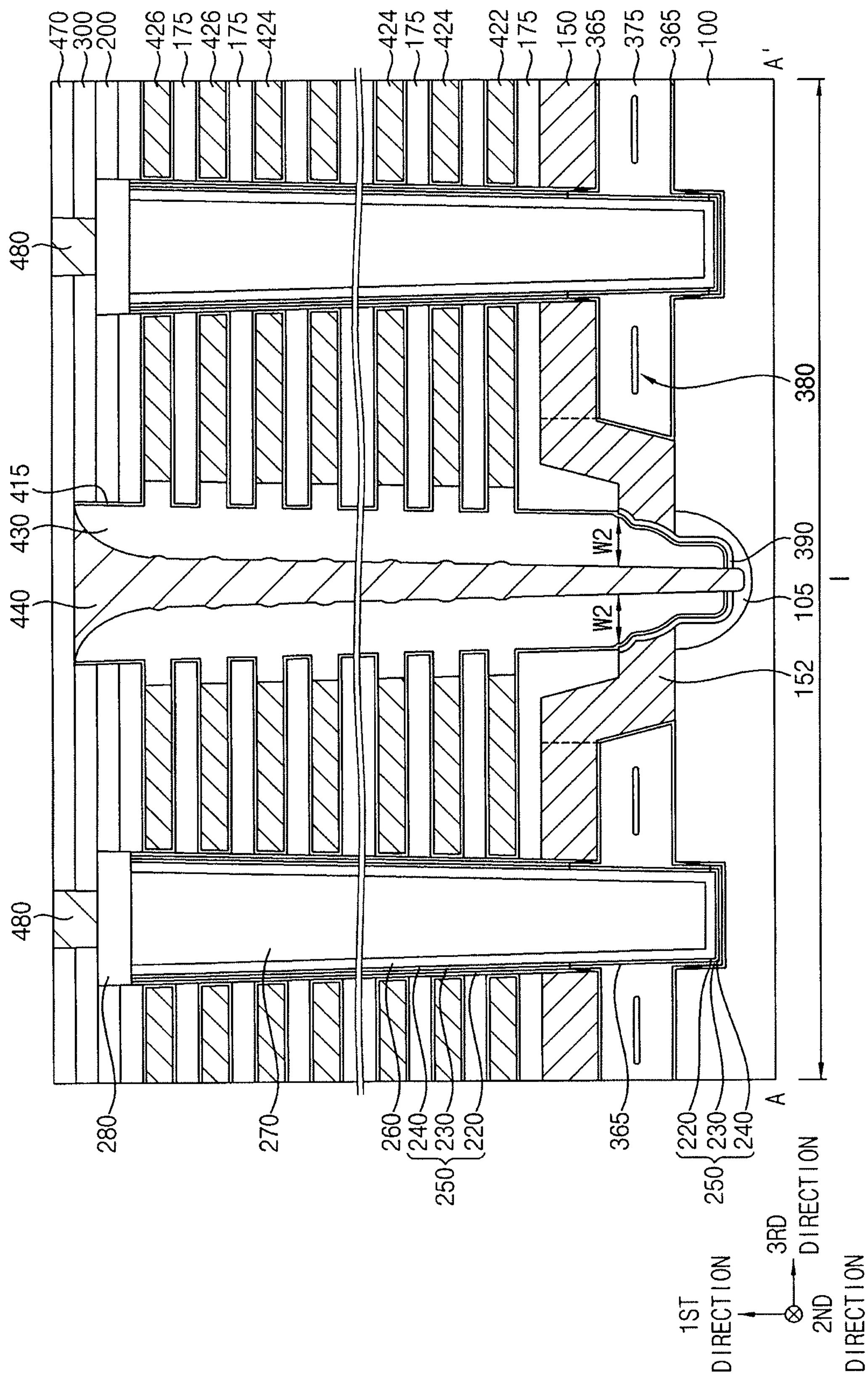
Figure 4:
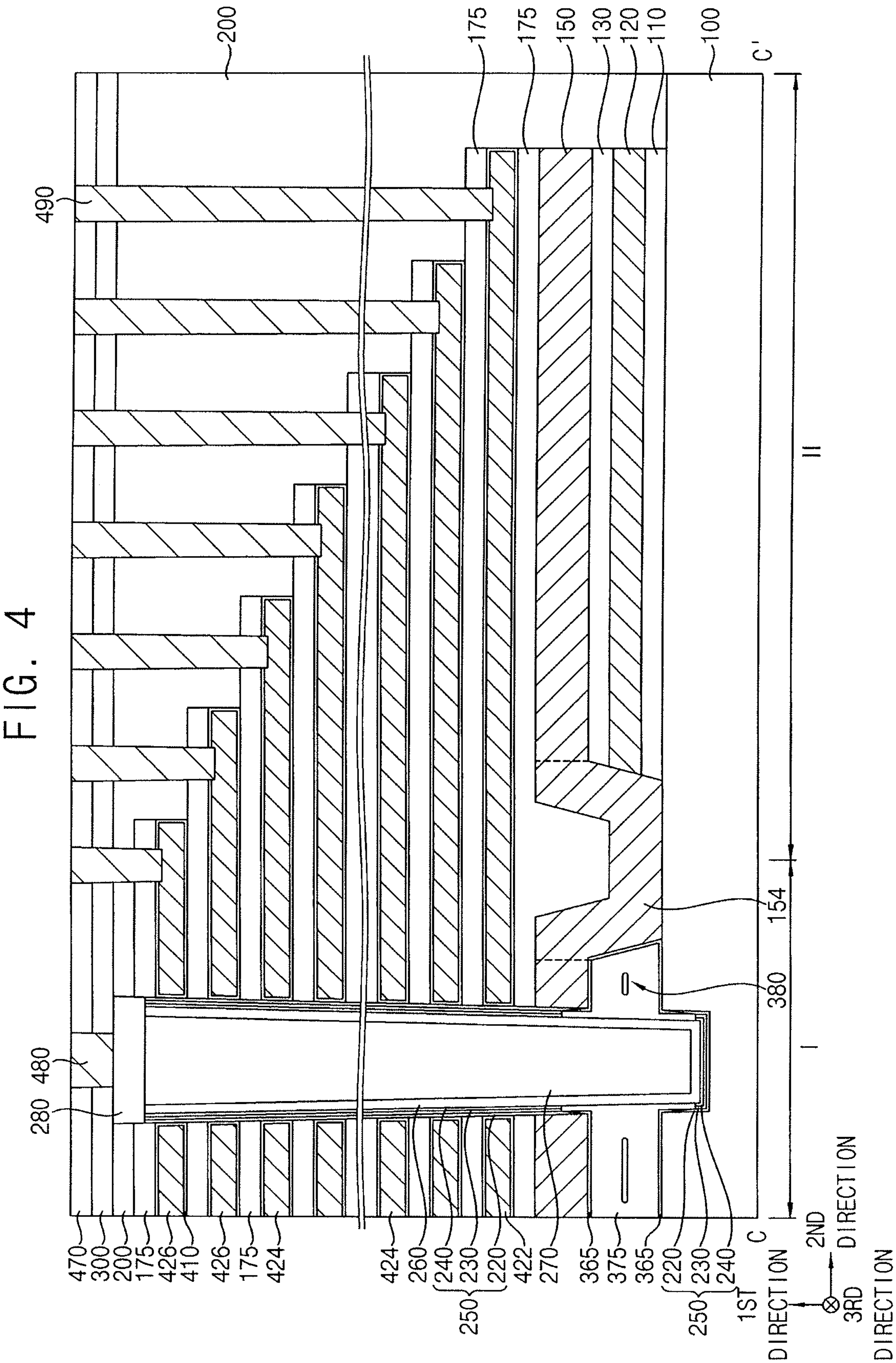
Figure 5A:
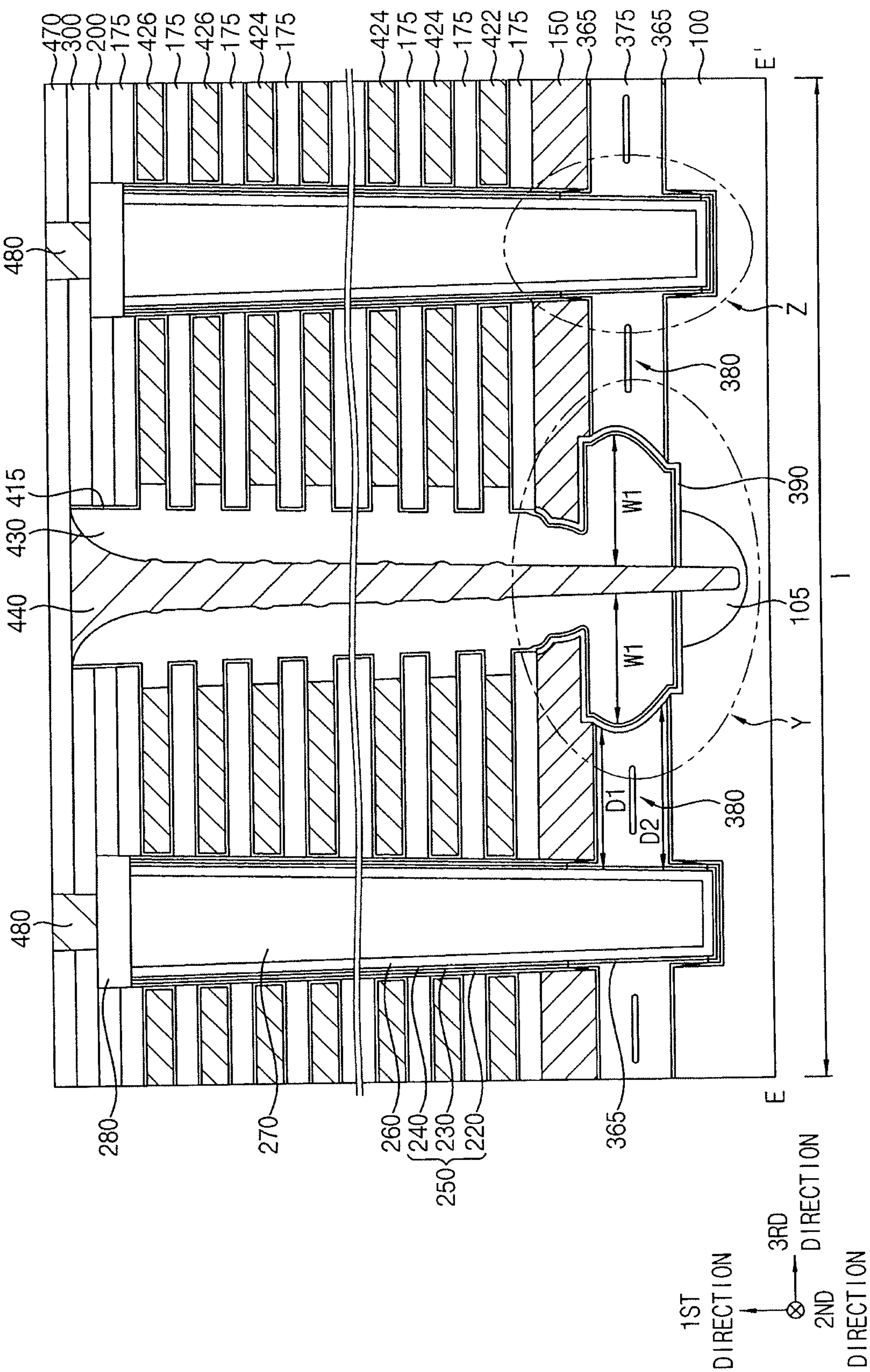
Figure 5B:
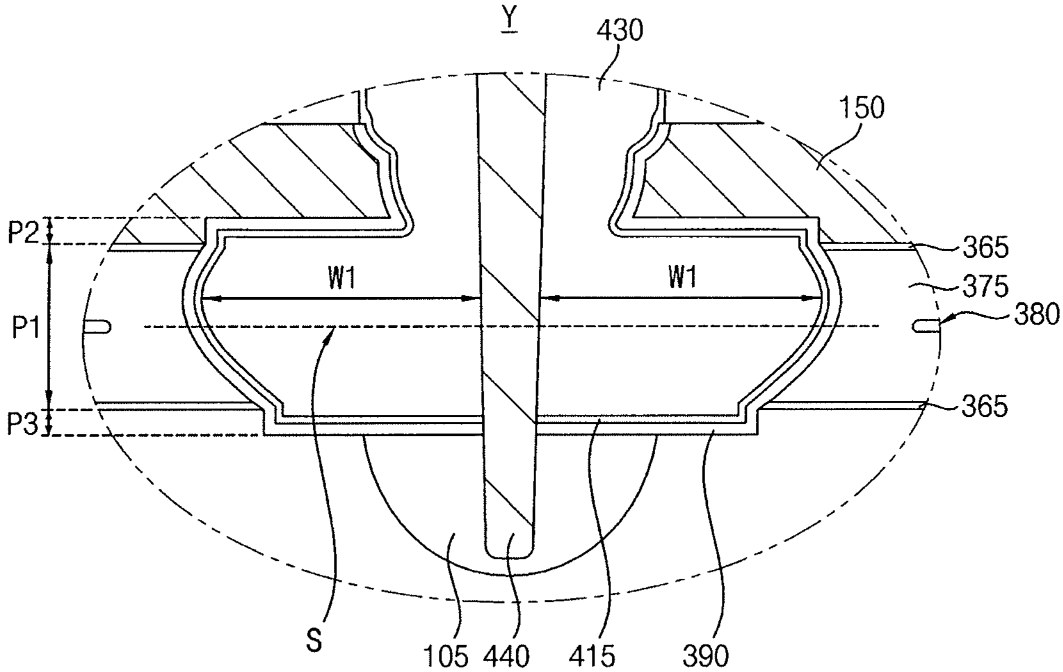
Figure 5C:
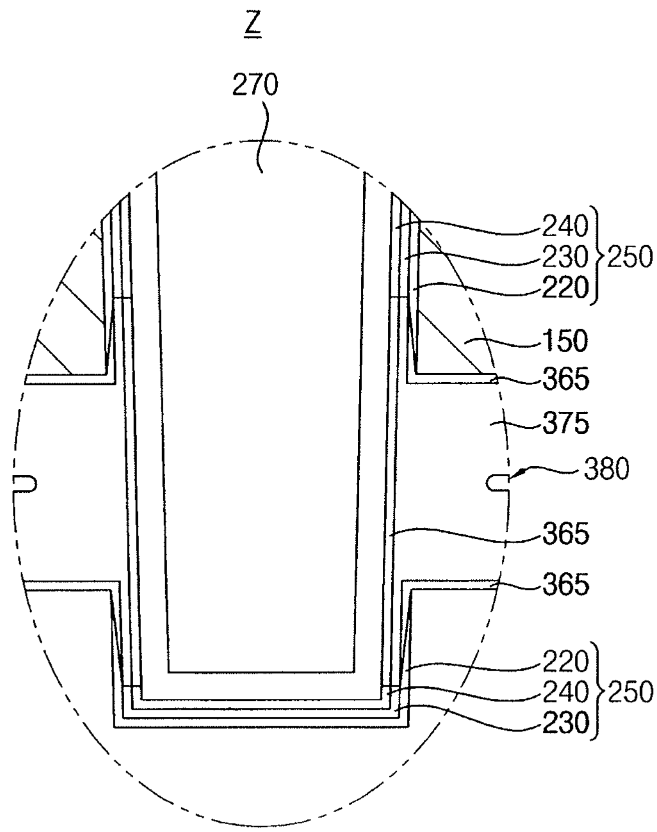
Figure 6:
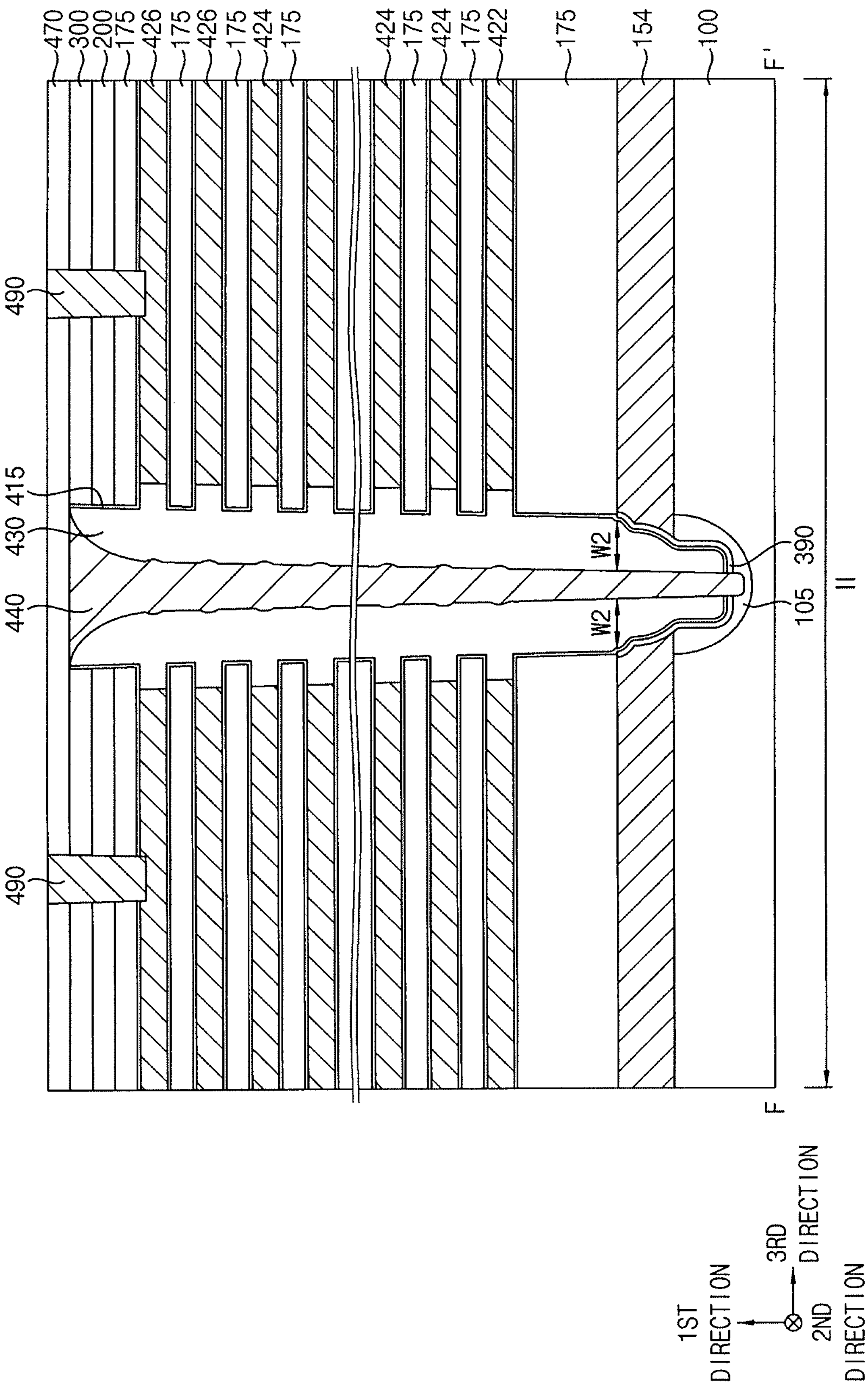
Figure 7:
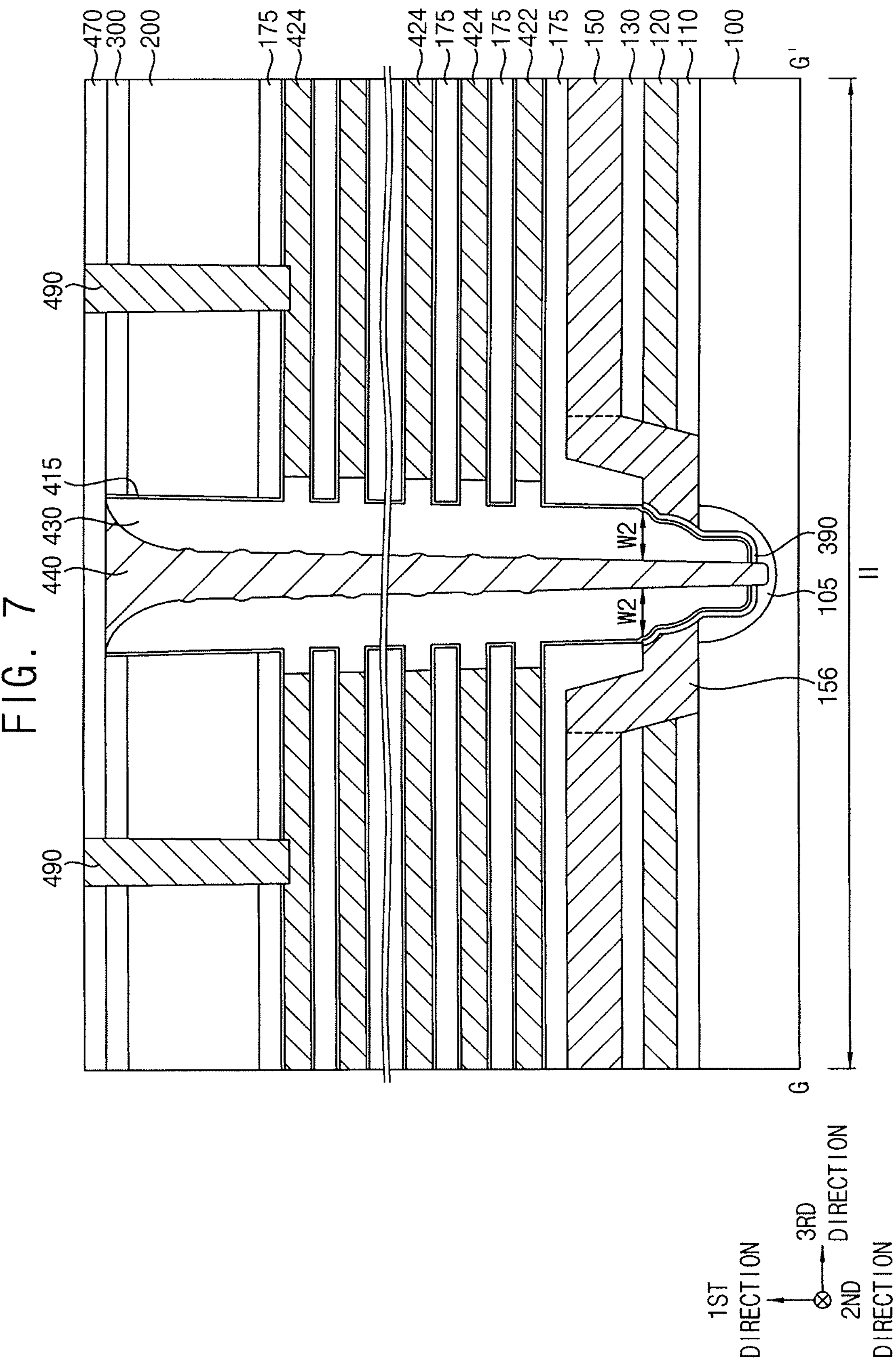

FIG. 3 illustrates a cross-sectional view taken along a line A-A' of FIG. 1, FIG. 4 illustrates a cross-sectional view taken along a line C-C' of FIG. 1, FIG. 5A illustrates a cross-sectional view taken along a line E-E' of FIG. 1, FIG. 6 illustrates a cross-sectional view taken along a line F-F' of FIG. 1, and FIG. 7 illustrates a cross-sectional view taken along a line G-G' of FIG. 1. FIGS. 2 to 5A, and 6 to 7 are drawings about a region X of FIG. 1, and FIGS. 5B and 5C are drawings about regions Y and Z, respectively, of FIG. 5A.

Referring to FIGS. 1 to 7, the vertical memory device may include channels 260 extending in the first direction on a substrate 100, a channel connecting pattern 375 covering outer sidewalls of the channels 260 to connect the channels 260 with each other, a gate electrode structure including gate electrodes 422, 424, and 426 spaced apart from each other in the first direction on the channel connecting pattern 375 to surround the channels 260, first and second common source lines (CSLs) 440 and 450 extending in the second direction on the substrate 100 to divide each of (e.g., extend between) the gate electrodes 422, 424, and 426 and the channel connecting pattern 375 in the third direction, and a first etch stop pattern 390 and a second blocking pattern 415 sequentially stacked in the third direction on a sidewall of an end of the channel connecting pattern 375 (e.g., the end of the channel connecting pattern 375 being relative to or in the third direction).

The vertical memory device may further include an impurity region 105 at an upper portion of the substrate 100, a support layer 150 between the channel connecting pattern 375 and a lowermost one of the gate electrodes 422, 424, and 426, a support pattern structure including support patterns 152, 154, and 156 contacting an upper surface of the substrate 100 and being connected to the support layer 150, a seed pattern 365 (between the channel connecting pattern 375 and the upper surface of the substrate 100, a lower surface of the support layer 150, or the outer sidewall of each channel 260), a sacrificial layer structure including first, second, and third sacrificial layers 110, 120, and 130 on the substrate 100, an insulation pattern 175 between adjacent or neighboring ones of the gate electrodes 422, 424, and 426 in the first direction, a charge storage structure 250 covering the outer sidewall and a bottom (e.g., substrate-facing) surface of each channel 260, a filling pattern 270 filling a space defined by each channel 260, a pad 280 (on each channel 260, the filling pattern 270, and the charge storage structure 250), first to third division layers 190, 290, and 460, first and second conductive connecting portions 455 and 465, a second spacer 430 (on a sidewall of each of the first and second CSLs 440 and 450 and the third division layer 460), first to third insulating interlayers 200, 300 and 470 sequentially stacked on the gate electrode structure, a first contact plug 480 (extending through the second and third insulating interlayers 300 and 470 to contact an upper surface of the pad 280), a second contact plug 490 (extending through the first to third insulating interlayers 200, 300 and 470 and the insulation patterns 175 to contact an upper surface of each of the gate electrodes 422, 424 and 426), and bit lines and upper wirings electrically connected to the first and second contact plugs 480 and 490, respectively.

The substrate 100 may include silicon, germanium, silicon-germanium or a III-V compound such as GaP, GaAs, GaSb, or the like. In an implementation, the substrate 100 may be a silicon-on-insulator (SOI) substrate or a germanium-on-insulator (GOI) substrate. As used herein, the term “or” is not an exclusive term, e.g., “A or B” would include, A, B, or A and B.

The substrate 100 may include a first region I in which memory cells may be formed, and a second region II in which the second contact plugs 490 (for applying signals to the memory cells) may be formed. The second region II of the substrate 100 may at least partially surround the first region I of the substrate 100. In an implementation, the first and second regions I and II of the substrate 100 may be referred to as a cell region and an extension region, respectively.

The channel 260 may be on the first region I of the substrate 100, and may have, e.g., a cup shape. The outer sidewall of the channel 260 may be covered by the charge storage structure 250. An inner space defined by the channel 260 may be filled with the filling pattern 270. The channel 260 may include, e.g., undoped polysilicon, and the filling pattern 270 may include an oxide, e.g., silicon oxide.

In an implementation, the channel 260 may be formed in each of the second and third directions to form a channel array. One channel array including channels 260 surrounded by one gate electrode structure between neighboring ones of the first and second CSLs 440 and 450 in the third direction may be connected by the channel connecting pattern 375.

The charge storage structure 250 may include an upper portion covering most of the outer sidewall of the channel 260 and extending through the gate electrode structure and a lower portion covering the bottom surface of the channel 260 on the substrate 100. For example, the upper and lower portions of the charge storage structure 250 may be spaced apart from each other in the first direction by a portion of the channel connecting pattern 375 contacting a lower outer sidewall of the channel 260. A lower surface of the upper portion of the charge storage structure 250 and an upper surface of the lower portion of the charge storage structure 250 may contact the channel connecting pattern 375.

The charge storage structure 250 may include a tunnel insulation pattern 240, a charge storage pattern 230, and a first blocking pattern 230 sequentially stacked in a horizontal direction (e.g., the second direction and/or third direction) from the outer sidewall of the channel 260. For example, the tunnel insulation pattern 240, the charge storage pattern 230, and the first blocking pattern 220 may include an oxide, e.g., silicon oxide, a nitride, e.g., silicon nitride, and an oxide, e.g., silicon oxide, respectively.

In an implementation, bottom (e.g., substrate-facing) surfaces of the tunnel insulation pattern 240 and the charge storage pattern 230 of the upper portion of the charge storage structure 250 may be higher (e.g., farther from the substrate 100 in the first direction) than a bottom surface of the first blocking pattern 220 of the upper portion of the charge storage structure 250. In an implementation, a height (e.g., in the first direction) of the bottom surface of the first blocking pattern 220 of the upper portion of the charge storage structure 250 may gradually decrease as the bottom surface of the first blocking pattern 220 becomes more distant from the outer sidewall of the channel 260 in the horizontal direction (e.g., the first blocking pattern 220 of the upper portion of the charge storage structure 250 may have a slanted or inclined bottom surface, as illustrated in FIG. 5C.

The pad 280 may be on the channel 260, the charge storage structure 250, and the filling pattern 270, and may be connected to the channel 260. The pad 280 may include, e.g., doped polysilicon.

The channel connecting pattern 375 may be on the first region I of the substrate 100 and may extend in the second direction. In an implementation, a plurality of channel connecting patterns 375 spaced apart from each other in the third direction (e.g., by each of the first and second CSLs 440 and 450 and the second spacer 430 covering each of opposite sidewalls thereof in the third direction) may be on the substrate 100.

In an implementation, the sidewall of the end of the channel connecting pattern 375 may be recessed inwardly (e.g., in the third direction) toward a central portion of the channel connecting pattern 375.

In an implementation, the sidewall of the end of the channel connecting pattern 375 may have a shape that is not symmetrical with respect to or about an imaginary line S extending in the horizontal direction (e.g., in the third direction) through a central portion of the channel connecting pattern 375 (e.g., a sidewall profile of a portion of the channel connecting pattern 375 that is distal to the substrate 100 may be different from a sidewall profile of a portion of the channel connecting pattern 375 that is proximate to the substrate 100 relative to a line bisecting the channel connecting pattern 375). In an implementation, a first distance D1 in the third direction from one of the channels 260 to an upper portion of the sidewall of the end of the channel connecting pattern 375 may be less than a second distance D2 in the third direction from the one of the channels 260 to a lower portion of the sidewall of the end of the channel connecting pattern 375.

The channel connecting pattern 375 may include, e.g., polysilicon doped with impurities.

In an implementation, the channel connecting pattern 375 may include an air gap 380 therein. In an implementation, the air gap 380 may not be formed at a portion, e.g., the end of the channel connecting pattern 375 adjacent to or proximate to each of the first and second CSLs 440 and 450, and may be formed at a portion of the channel connecting pattern 375 far from or distal to each of the first and second CSLs 440 and 450.

The gate electrode structure may include the gate electrodes 422, 424, and 426 stacked at a plurality of levels, respectively, spaced apart from each other in the first direction, and the insulation pattern 175 may be between neighboring ones of the gate electrodes 422, 424, and 426. The insulation pattern 175 may include an oxide, e.g., silicon oxide. In an implementation, the gate electrode structure may include at least one first gate electrode 422, a plurality of second gate electrodes 424, and at least one third gate electrode 426 sequentially stacked in the first direction. A plurality of gate electrode structures may be spaced apart from each other in the third direction (by the first and second CSLs 440 and 450 and/or the third division layer 460 extending in the second direction and the second spacer 430 covering each of opposite sidewalls thereof in the third direction).

In an implementation, the gate electrode structure may form a staircase structure of which a length in the second direction may decrease from a lowermost level (e.g., closer to the substrate 100) toward an uppermost level (e.g., farther from the substrate 100) in the first direction. Each step layer of the staircase structure may include one of the gate electrodes and one of the insulation patterns 175 directly thereon.

Each of the first to third gate electrodes 422, 424, and 426 may include a gate conductive pattern and a gate barrier pattern covering a surface of the gate conductive pattern. The gate conductive pattern may include a low resistance metal, e.g., tungsten, titanium, tantalum, platinum, or the like, and the gate barrier pattern may include a metal nitride, e.g., titanium nitride, tantalum nitride, or the like.

Each of the first and second CSLs 440 and 450 (extending in the second direction) and the second spacer 430 may divide or separate each or groups of the gate electrodes 422, 424, and 426 in the third direction. The first CSL 440 may continuously extend on the first and second regions I and II of the substrate 100, and the second CSL 450 may (e.g., discontinuously) extend on the first and second regions I and II of the substrate 100 with a cut portion on the second region II of the substrate 100.

In an implementation, the cut portion of the second CSL 450 may overlap the first division layer 190 in the first direction, and two gate electrodes at opposite sides of the cut portion of the second CSL 450 in the third direction may not be divided from each other due to the cut portion of the second CSL 450. A portion of the gate electrodes connecting neighboring ones of the gate electrodes in the third direction may be referred to as the first conductive connecting portion 455.

The first division layer 190 may extend through and divide the first gate electrode 422 on the second region II of the substrate 100, and a plurality of first division layers 190 may be formed in the third direction. The first division layer 190 may include an oxide, e.g., silicon oxide.

The third division layer 460 may extend in the second direction on the second region II of the substrate 100 between neighboring (in the third direction) ones of the first and second CSLs 440 and 450, and may divide or separate each of the gate electrodes 422, 424 and 426 together with the second spacer 430 covering each of opposite sidewalls of the third division layer 460. In an implementation, the third division layer 460 may extend in the second direction and may have a cut portion like that of the second CSL 450, and a portion of two gate electrodes at opposite sides of the cut portion of the third division layer 460 in the third direction may be referred to as the second conductive connecting portion 465.

The second division layer 290 may extend on the first and second regions I and II of the substrate 100 in the second direction in one channel block including the channels 260 connected with each other by one channel connecting pattern 375, and may extend through upper portions of ones of the channels 260 in the channel block.

Figure 19:
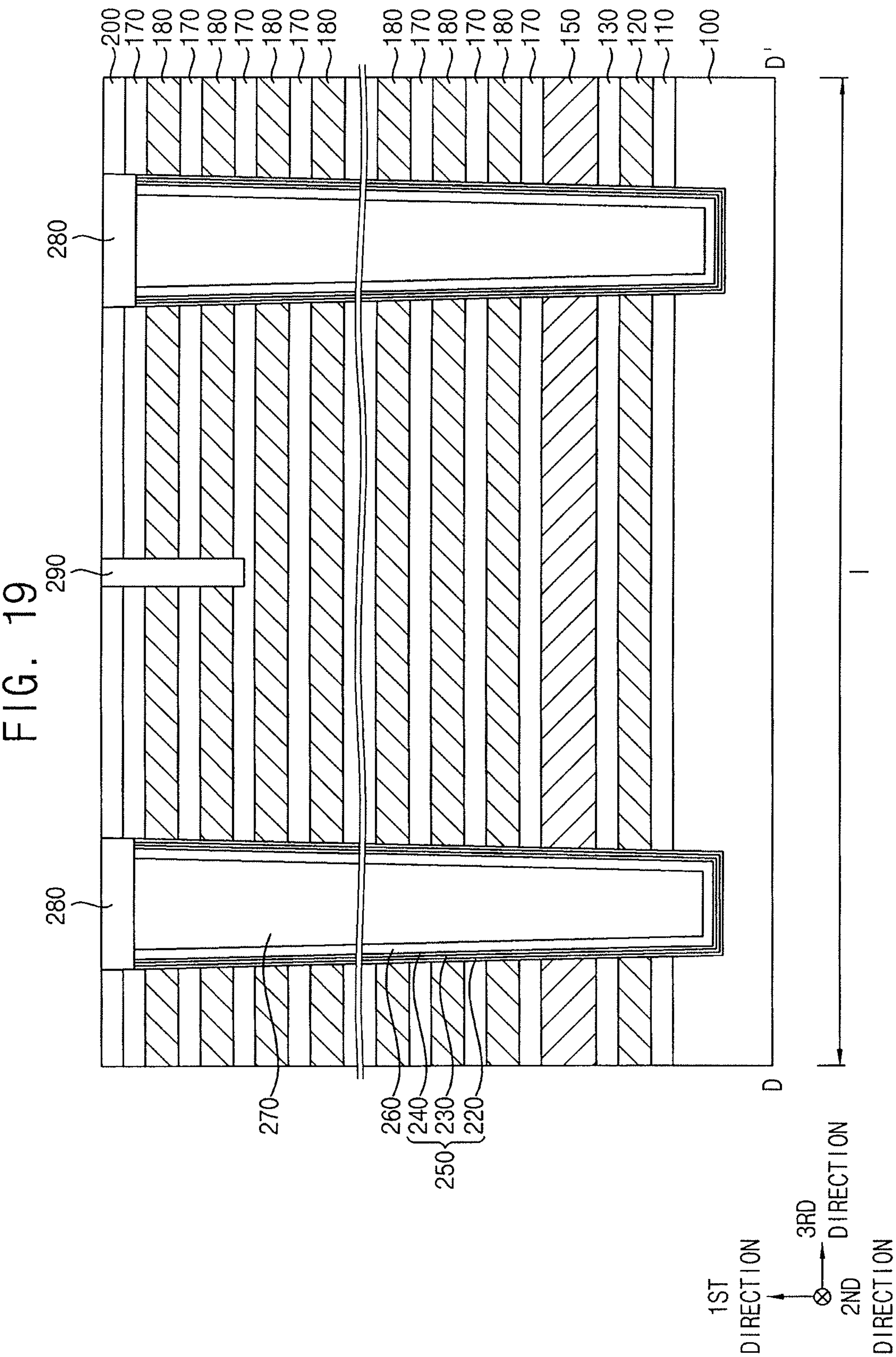

Referring to FIG. 19, the second division layer 290 may extend through not only the upper portions of the ones of the channels 260 but also the first insulating interlayer 200, the third gate electrode 426 and ones of the insulation patterns 175 at upper two levels, respectively, and further a portion of one of the insulation patterns 175 at a third level from above or from a top. The second division layer 290 may extend on the first region I of the substrate 100 in the second direction, and may further extend on the second region II of the substrate 100 in the second direction through upper two step layers of the staircase structure.

Each of the first and second CSLs 440 and 450 and the third division layer 460 may include a metal, e.g., tungsten, copper, aluminum, or the like.

Each of opposite sidewalls (in the third direction) of each of the first and second CSLs 440 and 450 and the third division layer 460 may be covered by the second spacer 430, and may be insulated from neighboring ones of the gate electrodes 422, 424 and 426. The second spacer 430 may include an oxide, e.g., silicon oxide.

The impurity region 105 may be at an upper portion of the substrate 100 contacting a bottom surface of each of the first and second CSLs 440 and 450 and the third division layer 460. The impurity region 105 may include, e.g., single crystalline silicon doped with n-type impurities. A contact resistance between each of the first and second CSLs 440 and 450 and the third division layer 460 and the substrate 100 may be reduced due to the impurity region 105.

The support layer 150 may extend in the second direction on the first and second regions I and II of the substrate 100. The support layer 150 may be on the channel connecting pattern 375 on the first region I of the substrate 100, and may be on the sacrificial layer structure on the second region II of the substrate 100. The sacrificial layer structure may include first, second and third sacrificial layers 110, 120, and 130 sequentially stacked on the second region II of the substrate 100. The first to third sacrificial layers 110, 120, and 130 may include an oxide, e.g., silicon oxide, a nitride, e.g., silicon nitride, and an oxide, e.g., silicon oxide, respectively.

In an implementation, a bottom surface of an end of the support layer 150 (e.g., in or relative to the third direction) may be higher than bottom surfaces of other portions thereof.

The support pattern structure may be connected to the support layer 150. The support pattern structure may face the channel connecting pattern 375 on the first region I of the substrate 100, and may face the sacrificial layer structure on the second region II of the substrate 100 to contact a sidewall of the sacrificial layer structure.

In an implementation, the support pattern structure may include the first support pattern 152 on the first region I of the substrate 100, the second support pattern 154 extending in the third direction on a boundary between the first and second regions I and II of the substrate 100, and the third support pattern 156 extending from the second support pattern 154 on the second region II of the substrate 100.

In an implementation, a plurality of first support patterns 152 may be spaced apart from each other in the second direction, and each of the plurality of first support patterns 152 may be connected to, e.g., an end of the support layer 150 in the third direction. A plurality of third support patterns 156 may be spaced apart from each other in the third direction. For example, the sacrificial layer structure may be between neighboring ones of the third support patterns 156 in the third direction on the second region II of the substrate 100, and a sidewall of the sacrificial layer structure may contact sidewalls of the third support patterns 156.

The support layer 150 may include doped or undoped polysilicon, and the support pattern structure may include a material substantially the same as that of the support layer 150.

In an implementation, each of the first and second CSLs 440 and 450 and the third division layer 460 may extend through and divide the support layer 150 or the support pattern structure in the third direction.

In an implementation, the sidewall of the end of the channel connecting pattern 375 in the third direction may be recessed toward a central portion of the channel connecting pattern 375 in the third direction, and correspondingly, a portion of a sidewall of the second spacer 430 facing the sidewall of the end portion of the channel connecting pattern 375 may protrude toward the central portion of the channel connecting pattern 375.

In an implementation, at a height lower than a lower or bottom (e.g., substrate-facing) surface of the first gate electrode 422 (e.g., at a level closer to the substrate 100 than the bottom surface of the first gate electrode 422), a maximum width (first width W1) in the third direction of the second spacer 430 (covering each of opposite sidewalls of a portion of each of the first and second CSLs 440 and 450) extending through the support layer 150 (e.g., in a plan view), may be greater than a maximum width (second width W2) in the third direction of the second spacer 430 covering each of opposite sidewalls of a portion of each of the first and second CSLs 440 and 450 extending through the first to third support patterns 152, 154 and 156 (e.g., in a plan view). For example, a maximum width in the third direction of the second spacer 430 on the first region I of the substrate 100 may be greater than a maximum width in the third direction of the second spacer 430 on the second region II of the substrate 100.

A bottom surface of the second spacer 430 covering each of opposite sidewalls of the portion of each of the first and second CSLs 440 and 450 extending through the first to third support patterns 152, 154 and 156 (e.g., in a plan view) may be deeper (e.g., in the substrate 100) than a bottom surface of the second spacer 430 covering each of opposite sidewalls of the portion of each of the first and second CSLs 440 and 450 extending through the support layer 150 (e.g., in a plan view).

For example, a bottom surface of the second spacer 430 on the first region I of the substrate 100 may have a varying depth, and a bottom surface of the second spacer 430 on the second region II of the substrate 100 may have a constant depth.

The first etch stop pattern 390 and the second blocking pattern 415 may be sequentially stacked in the third direction between the sidewall of the end of the channel connecting pattern 375 and the second spacer 430. The first etch stop pattern 390 and the second blocking pattern 415 may also be between the upper surface of the substrate 100 and the second spacer 430, between a bottom surface and a sidewall of the support layer 150 and the second spacer 430, and between a sidewall of the support pattern structure and the second spacer 430. In an implementation, each of the first etch stop pattern 390 and the second blocking pattern 415 may be conformally formed, and may be divided by the first and second CSLs 440 and 450 and the third division layer 460 in the third direction.

According to the shapes of the sidewall of the end portion of the channel connecting pattern 375 in the third direction and a bottom surface of the support layer 150 adjacent thereto, the first etch stop pattern 390 may include a (e.g., curved) first portion P1 protruding (e.g., convexly protruding) toward a central portion of the channel connecting pattern 375 in the third direction, and (e.g., flat) second and third portions P2 and P3 extending in the first direction upwardly and downwardly, respectively. A distance (in the third direction) from one channel 260 to the second portion P2 of the first etch stop pattern 390 may be less than a distance (in the third direction) from the channel 260 to the third portion P3 of the first etch stop pattern 390.

The first etch stop pattern 390 may include, e.g., silicon oxide, and the second blocking pattern 415 may include a metal oxide, e.g., aluminum oxide.

The second blocking pattern 415 may also cover lower and upper surfaces and a sidewall of each of the gate electrodes 422, 424 and 426.

The seed pattern 365 may include silicon and impurities. The impurities may include, e.g., carbon, nitrogen, and oxygen.

The first to third insulating interlayers 200, 300 and 470 may include an oxide, e.g., silicon oxide, and may be merged with each other.

The first contact plug 480 may be on the pad 280, and currents applied by the bit line may flow through the first contact plug 480 and the pad 280 into the channel 260. The second contact plug 490 may be on the second region II of the substrate 100 so that signals may be applied to each of the gate electrodes 422, 424 and 426.

In the vertical memory device, the air gap 380 may be in the channel connecting pattern 375 for connecting the channels 260. In an implementation, the air gap 380 may not be formed at a portion of the channel connecting pattern 375 adjacent to the second spacer 430 and may be spaced apart therefrom. For example, metal may not penetrate into the air gap 380 so that the deterioration of characteristics of other elements may be prevented. In an implementation, the seed pattern 365 may be between the channel connecting pattern 375 and the substrate 100, the support layer 150, or the channel 260, and when the channel connecting pattern 375 is formed, the air gap 380 may not be enlarged due to the crystallinity difference therebetween. In an implementation, the seed pattern 365 may be on the upper surface of the substrate 100 and the sidewall of the channel connecting pattern 375, and when an etching process for forming the gate electrodes 422, 424 and 426 is performed, the substrate 100 and the channel connecting pattern 375 may not be damaged. These characteristics will be described below in detail with reference to FIGS. 8 to 44.

FIGS. 8 to 44 illustrate plan views and cross-sectional views of stages in a method of manufacturing a vertical memory device in accordance with example embodiments. FIGS. 8, 10, 14, 18, 20, 30, 32 and 40 are the plan views, and FIGS. 9, 11-13, 15-17, 19, 21-29, 31, 33 and 41-44 are the cross-sectional views. All these drawings are about the region X of FIG. 1.

Figure 11:
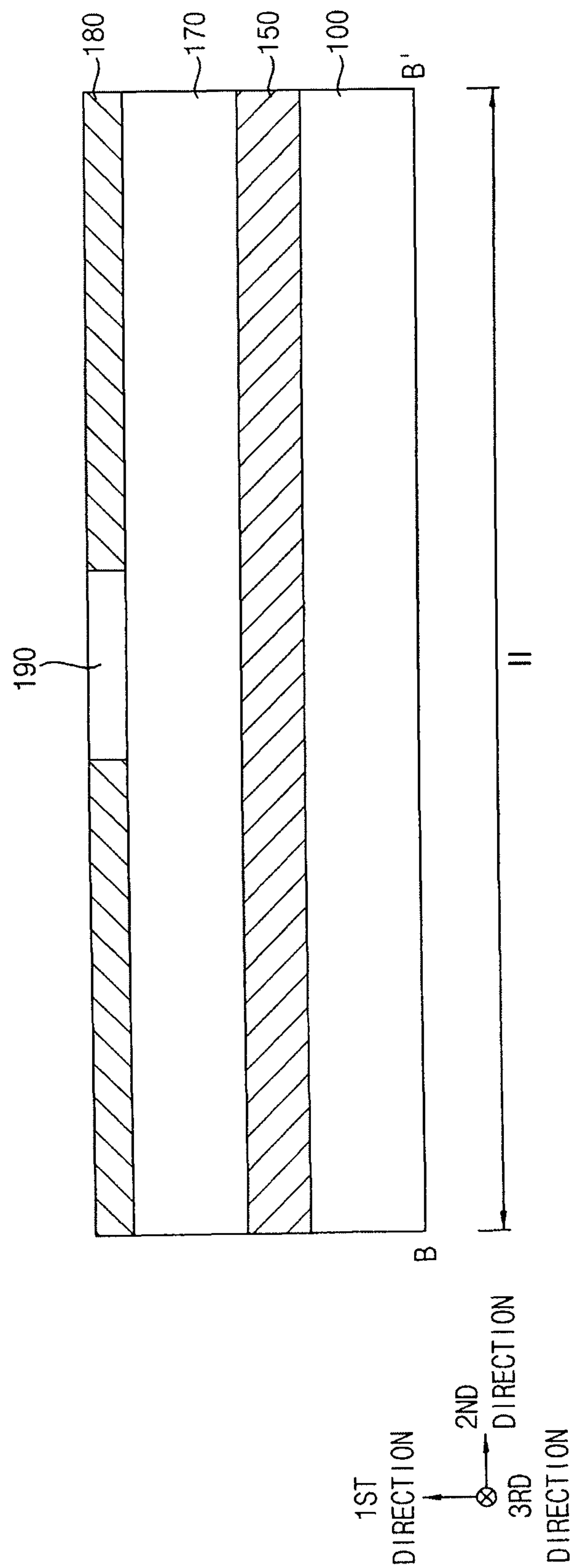
Figure 12:
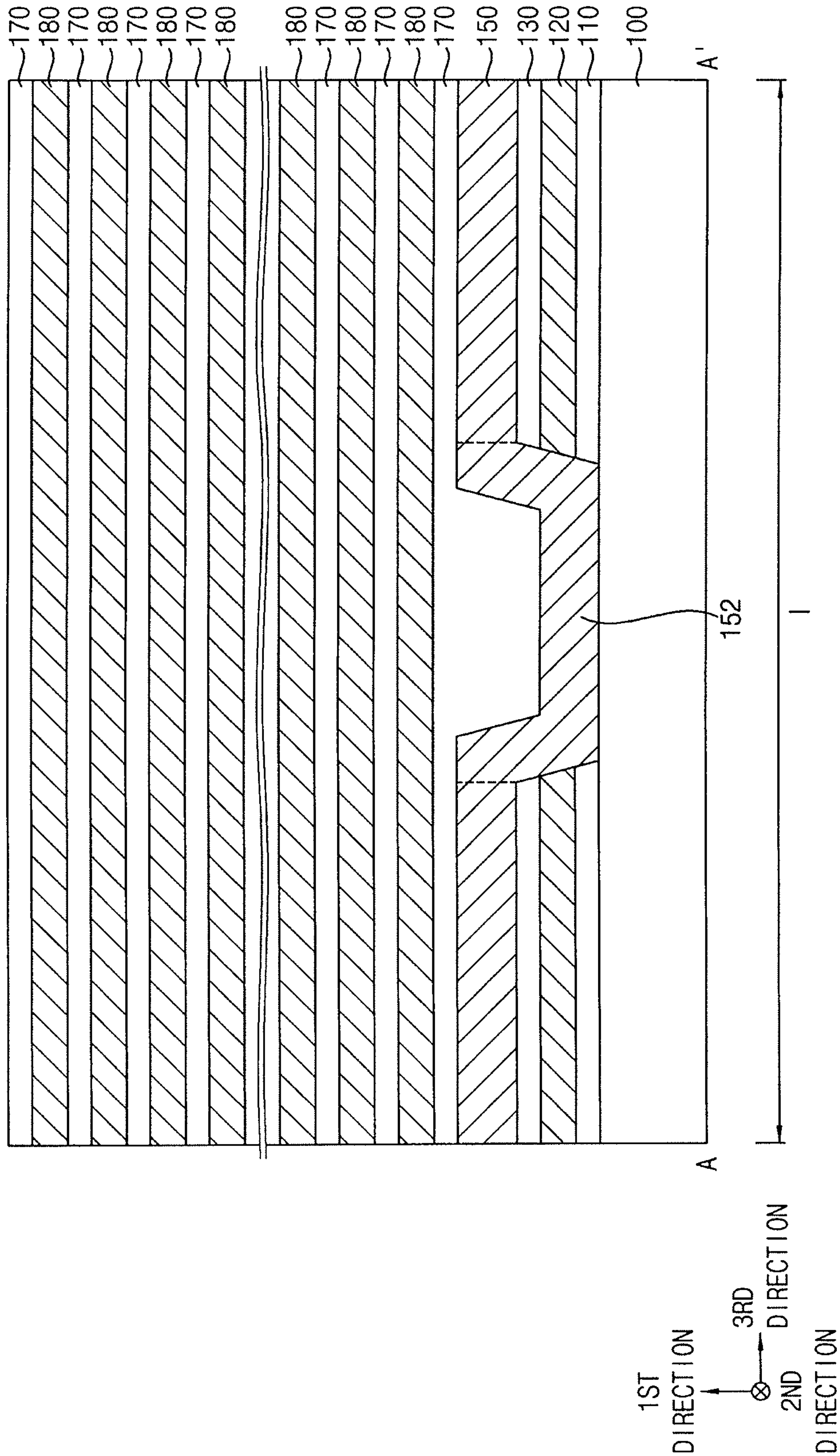
Figure 13:
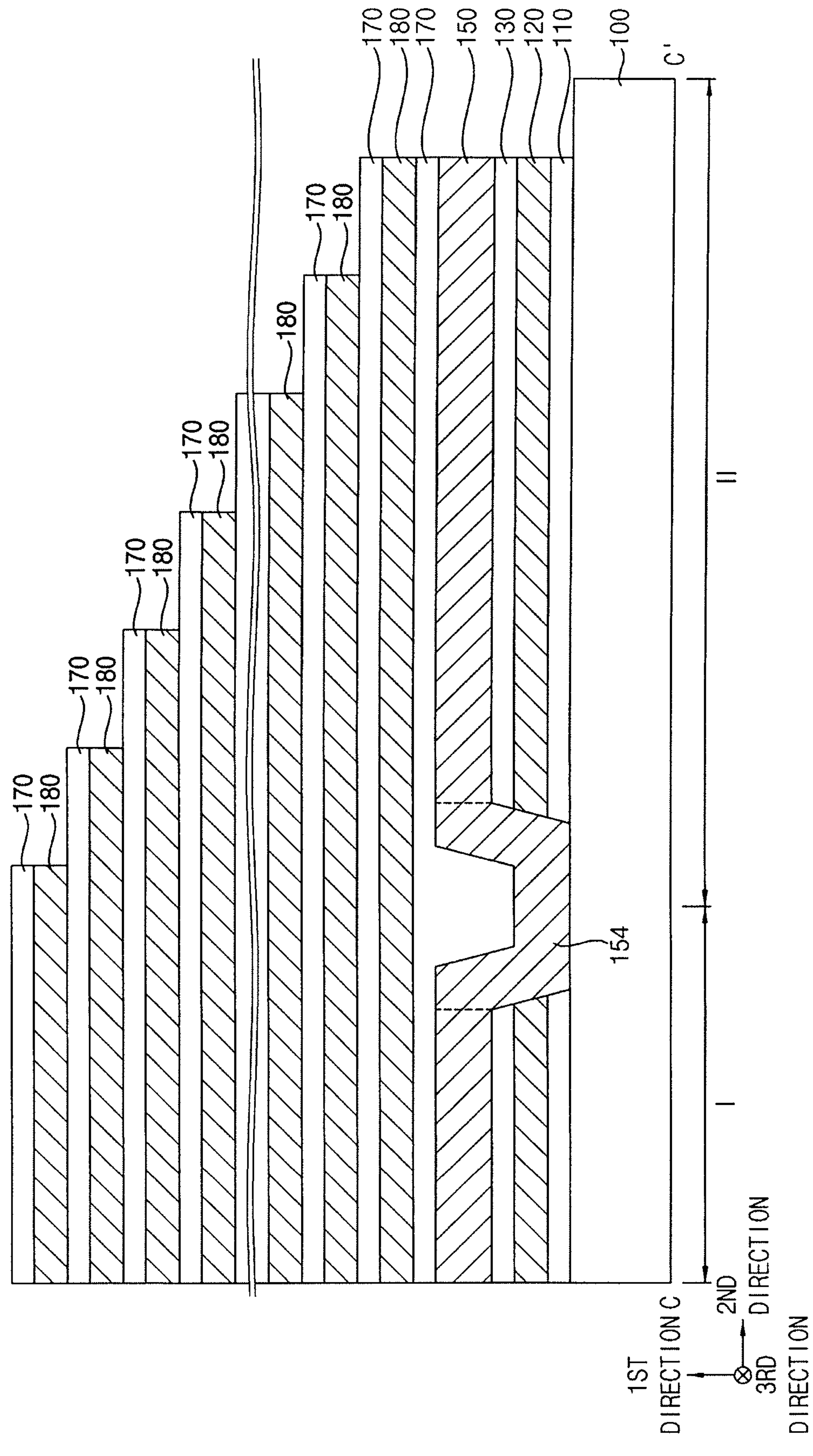
Figure 15:
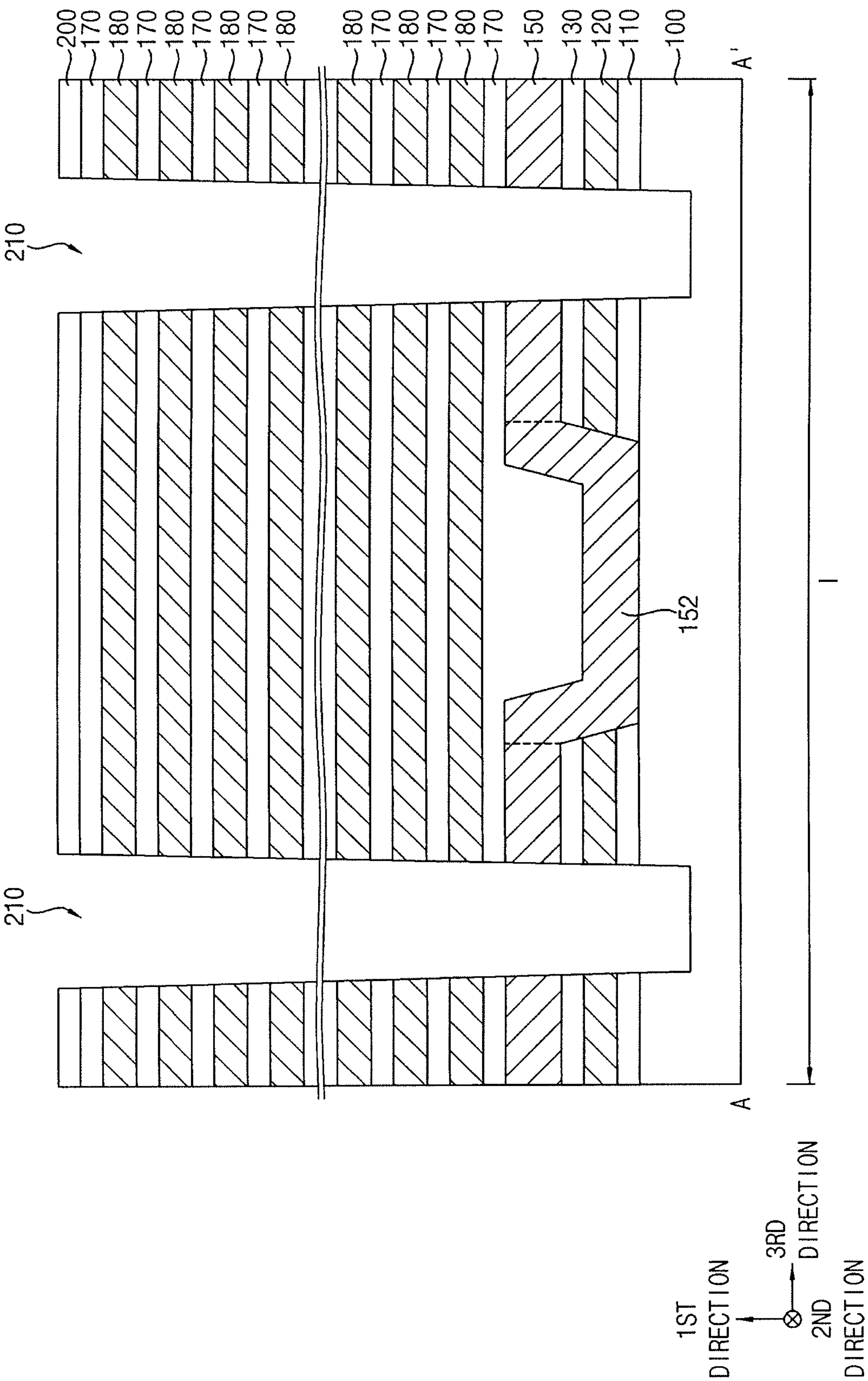
Figure 16:
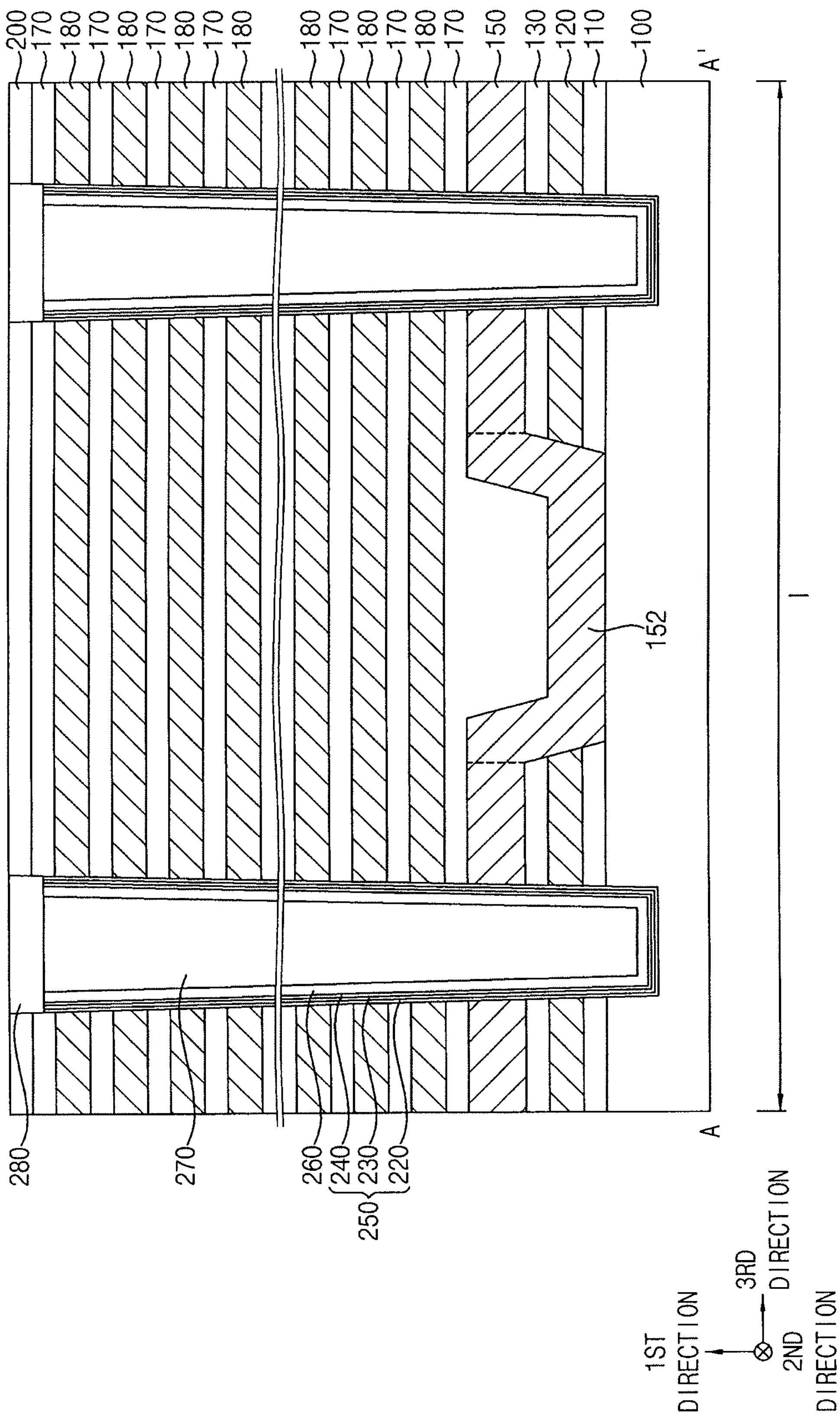
Figure 17:
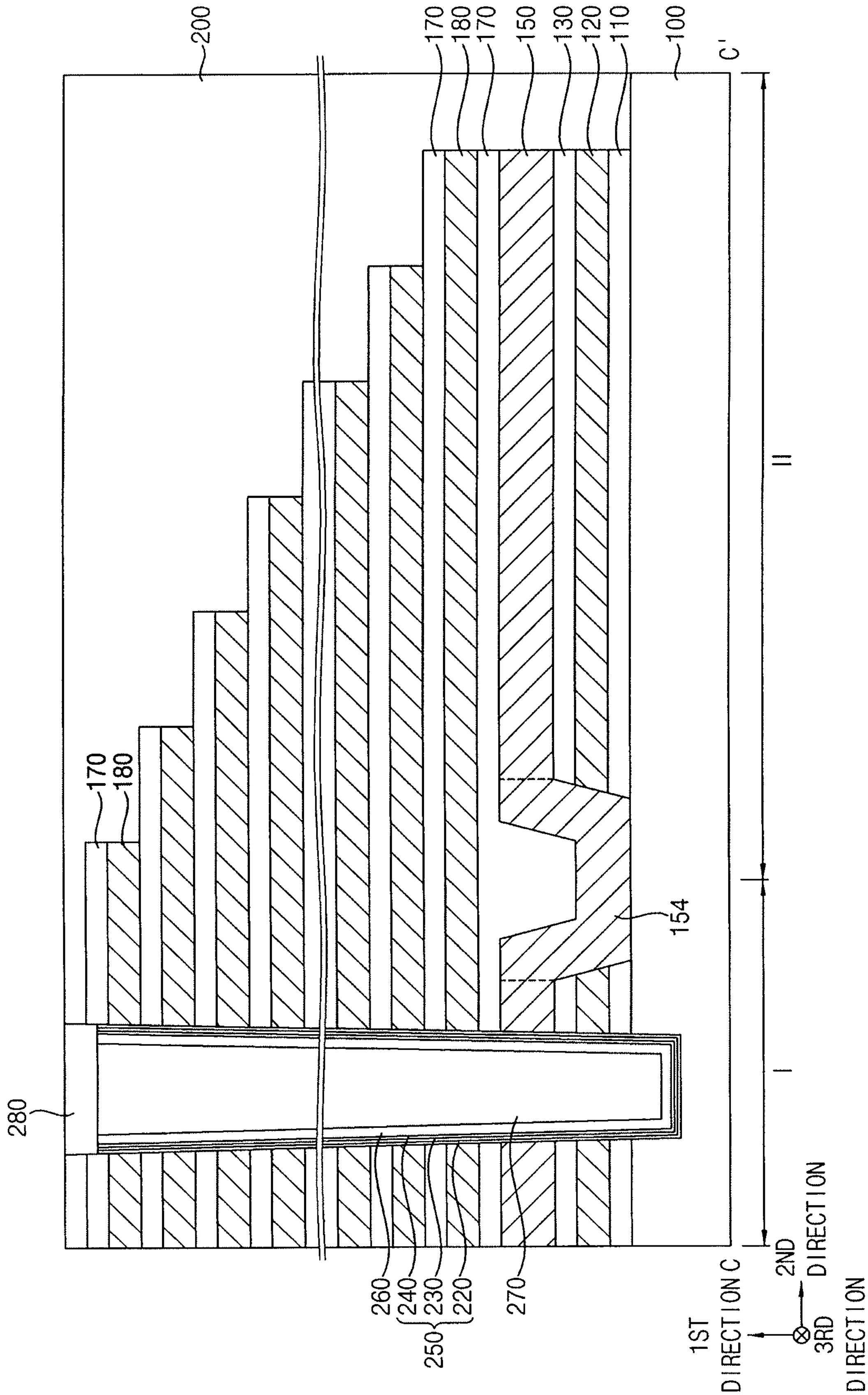
Figure 43:
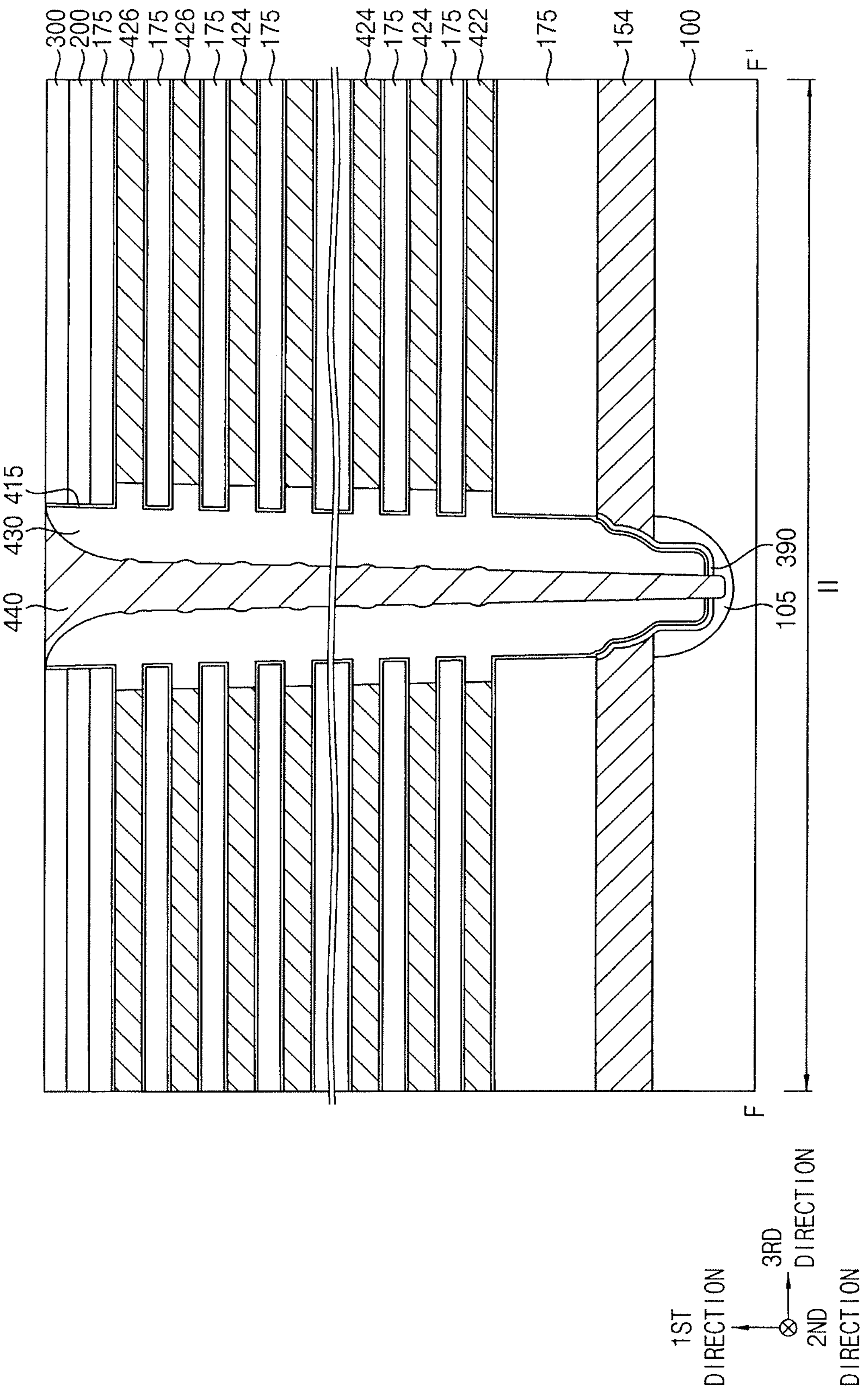
Figure 44:
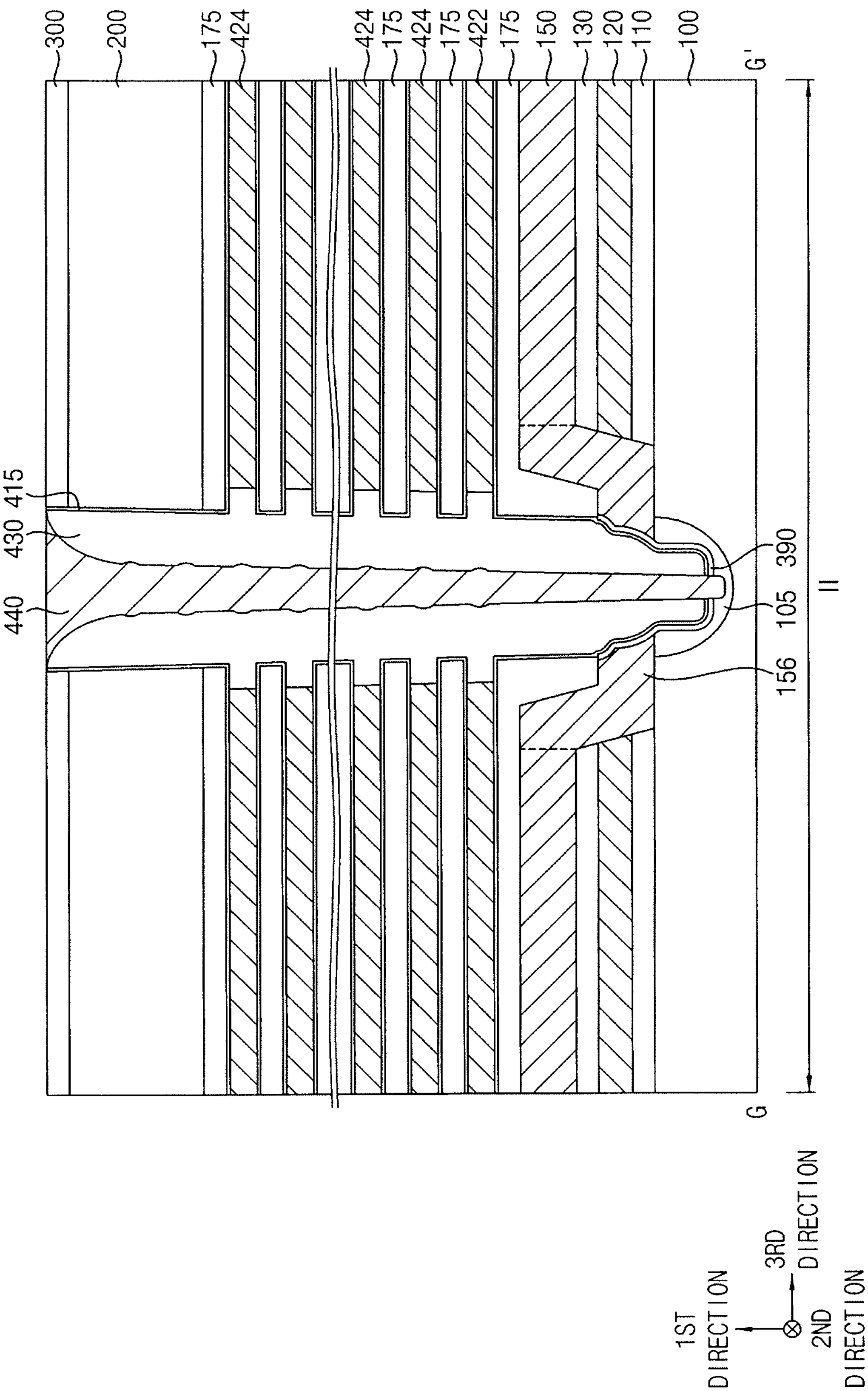

FIGS. 9, 12, 15-16, 21, 23, 26, 28, 33, 35, 38 and 41 illustrate cross-sectional views taken along lines A-A', respectively, of corresponding plan views, FIG. 11 illustrates a cross-sectional view taken along a line B-B' of a corresponding plan view, FIGS. 13 and 17 illustrate cross-sectional views taken along lines C-C', respectively, of corresponding plan views, FIG. 19 illustrates a cross-sectional view taken along a line D-D' of a corresponding plan view, FIGS. 22, 24-25, 27, 29, 31, 34, 36-37, 39 and 42 illustrate cross-sectional views taken along lines E-E' of corresponding plan views, FIG. 43 is a cross-sectional view taken along a line F-F' of a corresponding plan view, and FIG. 44 is a cross-sectional view taken along a line G-G' of a corresponding plan view.

Figure 8:
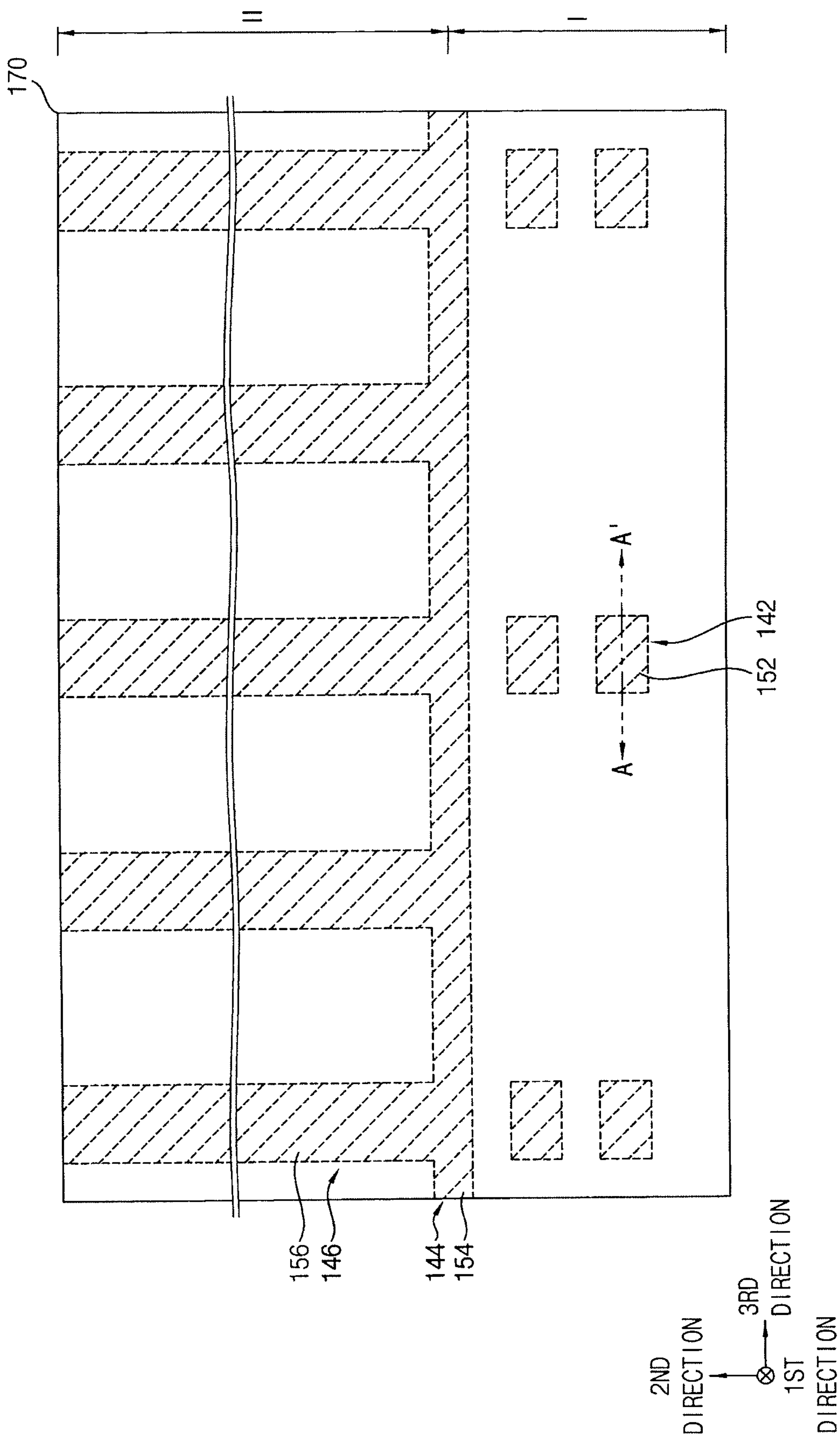
FIGS. 8 to 44 illustrate plan views and cross-sectional views of stages in a method of manufacturing a vertical memory device in accordance with example embodiments.
Figure 9:
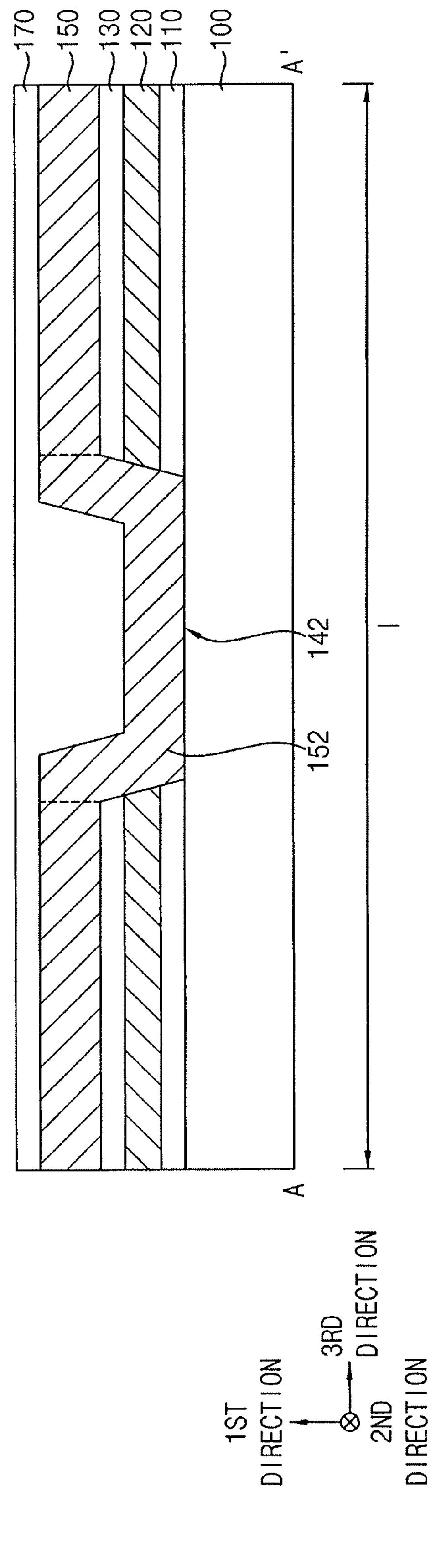

Referring to FIGS. 8 and 9, first, second, and third sacrificial layers 110, 120, and 130 may be sequentially stacked on a substrate 100, the first to third sacrificial layers 110, 120, and 130 may be partially removed to form first, second, and third openings 142, 144, and 146, each of which may expose upper surface of the substrate 100, and a support layer 150 may be formed on the substrate 100 and the third sacrificial layer 130 to at least partially fill each of the first to third openings 142, 144, and 146.

For example, n-type impurities may be implanted into the substrate 100.

The first and third sacrificial layers 110 and 130 may include an oxide, e.g., silicon oxide, the second sacrificial layer 120 may include a nitride, e.g., silicon nitride, the support layer 150 may include a material having an etching selectivity with respect to the first to third sacrificial layers 110, 120, and 130, e.g., polysilicon doped with n-type impurities or undoped polysilicon. In an implementation, the support layer 150 may be formed by depositing amorphous silicon, and crystallizing the amorphous silicon by a heat treatment process or by deposition process of other layers so that the support layer 150 may include polysilicon.

In an implementation, a plurality of first openings 142 may be formed (e.g., spaced apart) in the second direction on the first region I of the substrate 100, an may be also formed (e.g., spaced apart) in the third direction. The second opening 144 may extend in the third direction on or at a boundary between the first and second regions I and II of the substrate 100, and the third opening 146 may be connected to the second opening 144 on the second region II of the substrate 100 to extend in the second direction. A plurality of second openings 144 may be formed (e.g., spaced apart) in the third direction. In an implementation, the first openings 142 in the second direction may be aligned with the third opening 146 extending in the second direction.

The support layer 150 may have a constant thickness, and a first recess may be formed on a portion of the support layer 150 in each of the first to third openings 142, 144, and 146. Hereinafter, the portions of the support layers 150 in the first to third openings 142, 144, and 146 may be referred to as first to third support patterns 152, 154, and 156, respectively.

An insulation layer 170 may be formed on the support layer 150 to fill the first recesses, and an upper portion thereof may be planarized. The insulation layer 170 may include an oxide, e.g., silicon oxide, and the planarization process may include a chemical mechanical polishing (CMP) process and/or an etch back process.

Figure 10:
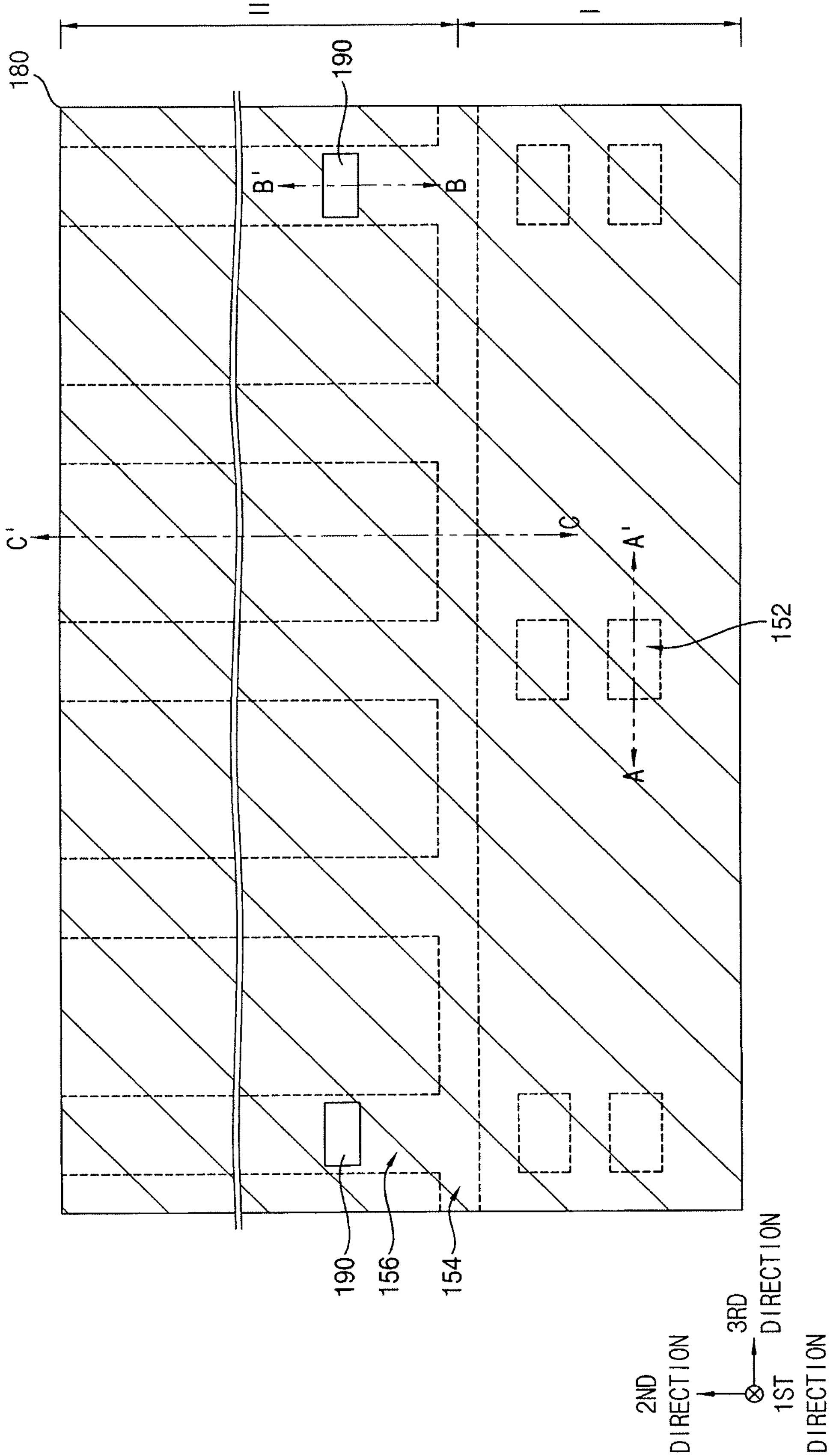

Referring to FIGS. 10 and 11, a fourth sacrificial layer 180 may be formed on the insulation layer 170, and a first division layer 190 may be formed through a portion of the fourth sacrificial layer 180 on the second region II of the substrate 100.

The first division layer 190 may be formed by partially removing the fourth sacrificial layer 180 to form a fourth opening and filling the fourth opening with an insulating material. In an implementation, a plurality of first division layers 190 may be formed to be spaced apart from each other in the third direction, and may be formed at respective locations overlapping (in the first direction) with first conductive connecting portions 455 (refer to FIG. 40) to be subsequently formed. In an implementation, the first division layer 190 may overlap the third support pattern 156 in the first direction.

The fourth sacrificial layer 180 may include a material having an etching selectivity with respect to the insulation layer 170, e.g., a nitride such as silicon nitride, and the first division layer 190 may have a material having an etching selectivity with respect to the fourth sacrificial layer 180, e.g., an oxide such as silicon oxide.

Referring to FIGS. 12 and 13, the insulation layer 170 and the fourth sacrificial layer 180 may be alternately and repeatedly formed in the first direction on the fourth sacrificial layer 180 to form a mold on the substrate 100.

A photoresist pattern may be formed on an uppermost one of the insulation layers 170 to partially cover the uppermost one of the insulation layers 170, and the uppermost one of the insulation layers 170 and an uppermost one of the fourth sacrificial layers 180 thereunder may be etched using the photoresist pattern as an etching mask. Thus, one of the insulation layers 170 under the uppermost one of the fourth sacrificial layers 180 may be partially exposed. After a trimming process for reducing an area of the photoresist pattern, the uppermost one of the insulation layers 170, the uppermost one of the fourth sacrificial layers 180, the partially exposed one of the insulation layers 170 and one of the fourth sacrificial layers 180 thereunder may be etched using the reduced photoresist pattern as an etching mask. The trimming process and the etching process may be repeatedly performed so that a staircase structure including a plurality of step layers each of which include one of the fourth sacrificial layers 180 and one of the insulation layers 170 directly thereon may be formed on the second region II of the substrate 100, and the mold including the staircase structure may be formed on the first and second regions I and II of the substrate 100.

Figure 14:
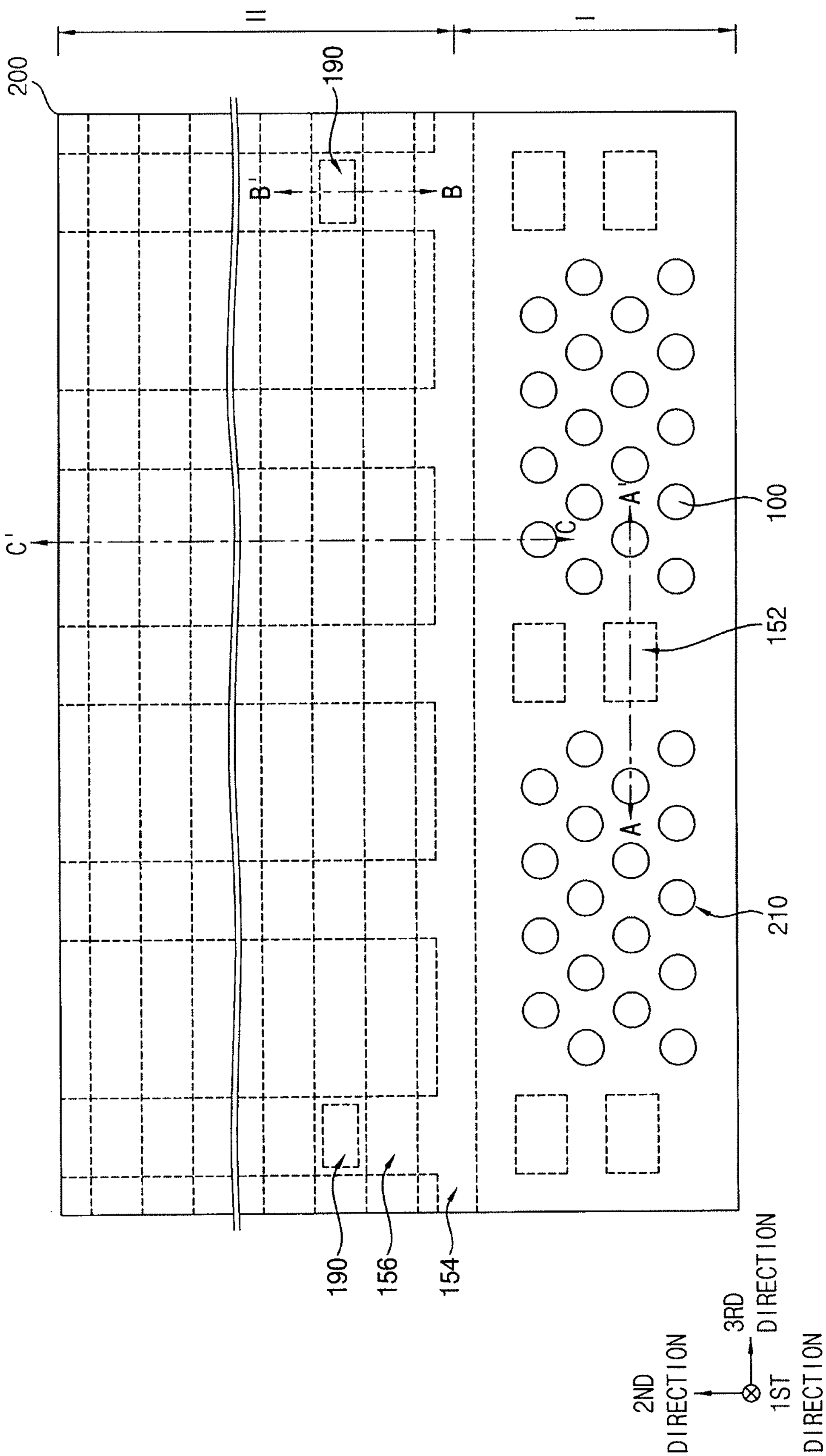

Referring to FIGS. 14 and 15, a first insulating interlayer 200 may be formed on the uppermost one of the insulation layers 170, and a channel hole 210 may be formed through the first insulating interlayer 200 and the mold to expose an upper surface of the substrate 100 by a dry etching process.

The first insulating interlayer 200 may include an oxide, e.g., silicon oxide.

In an implementation, the dry etching process may be performed until the upper surface of the substrate 100 is exposed, and an upper portion of the substrate 100 may be further removed in the dry etching process. In an implementation, a plurality of channel holes 210 may be formed in each of the second and third directions, and a channel hole array may be defined.

Referring to FIGS. 16 and 17, a charge storage structure 250, a channel 250, a filling pattern 270, and a pad 280 may be formed in the channel hole 210.

For example, a charge storage structure layer and a channel layer may be sequentially formed on a sidewall of the channel hole 210, the exposed upper surface of the substrate 100, and an upper surface of the first insulating interlayer 200, a filling layer may be formed on the channel layer to fill a remaining portion of the channel hole 210, and the filling layer, and the channel layer and the charge storage structure layer may be planarized until the upper surface of the first insulating interlayer 200 is exposed.

By the planarization process, the charge storage structure 250 and the channel 260 (each of which may have a cup shape and are sequentially stacked on the sidewall of the channel hole 210 and the upper surface of the substrate 100) may be formed, and the filling pattern 270 may fill an inner space formed by the channel 260.

As the channel hole 210 in which the channel 260 is formed may define the channel hole array, the channel 260 in the channel hole 210 may also define a channel array.

In an implementation, the charge storage structure 250 may include a first blocking pattern 220, a charge storage pattern 230, and a tunnel insulation pattern 240 that are sequentially stacked. For example, the first blocking pattern 220, the charge storage pattern 230, and the tunnel insulation pattern 240 may include an oxide, e.g., silicon oxide, a nitride, e.g., silicon nitride, and an oxide, e.g., silicon oxide, respectively.

The channel 260 may include, e.g., undoped polysilicon, and the filling pattern 270 may include an oxide, e.g., silicon oxide.

Upper portions of the filling pattern 270, the channel 260, and the charge storage structure 250 may be removed to form a second recess, a pad layer may be formed on the first insulating interlayer 200 to fill the recess, and the pad layer may be planarized until the upper surface of the first insulating interlayer 200 may be exposed to form the pad 280. The pad 280 may include, e.g., doped polysilicon.

Figure 18:
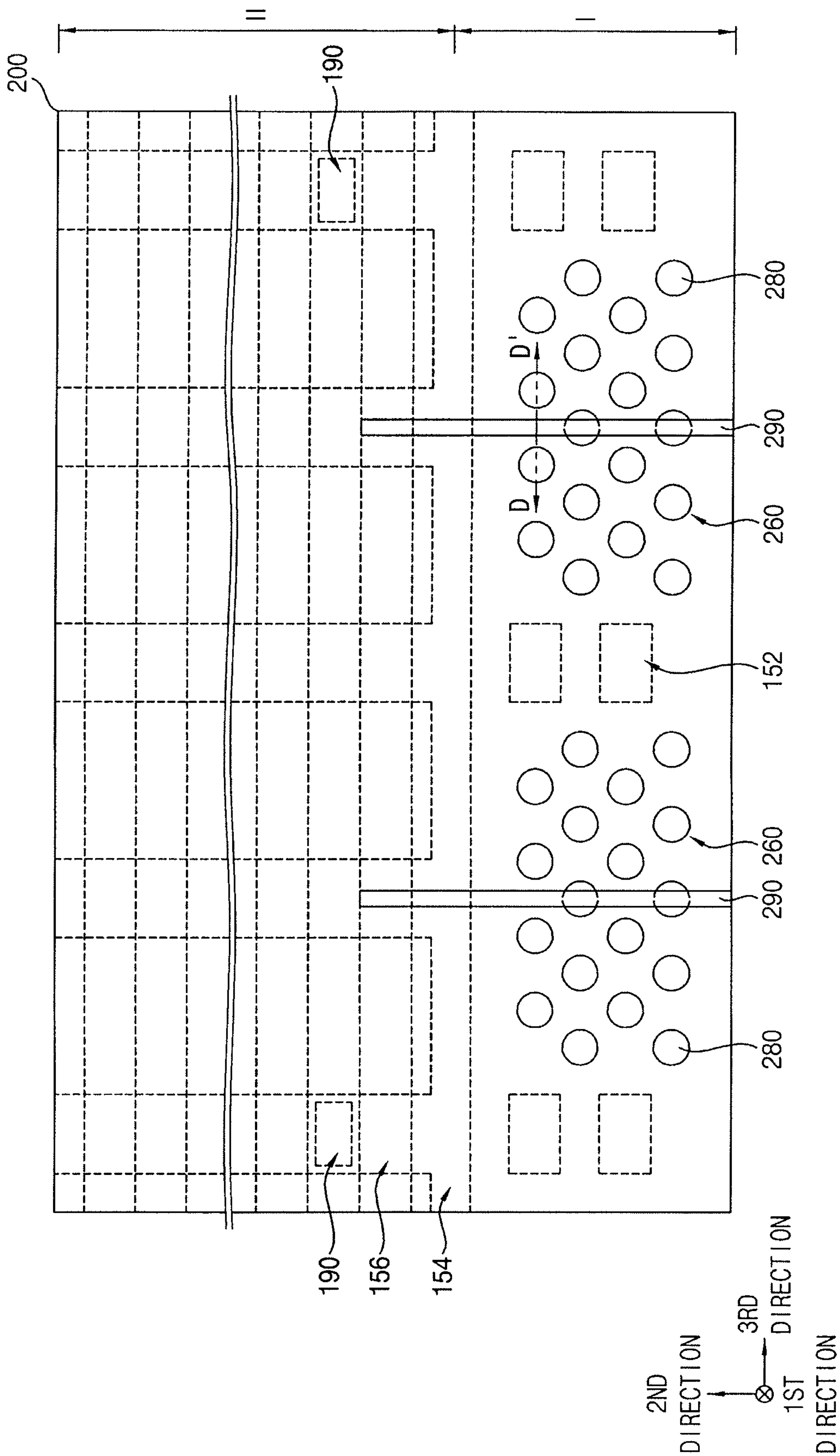

Referring to FIGS. 18 and 19, a second division layer 290 may be formed through selected ones of the fourth sacrificial layers 180 and the insulation layers 170.

The second division layer 290 may be formed by forming an etching mask on the first insulating interlayer 200, etching the first insulating interlayer 200, the selected ones of the insulation layers 170 and the fourth sacrificial layers 180 to form a fifth opening, and filling the fifth opening with an insulating material.

In an implementation, the second division layer 290 may extend through upper portions of selected ones of the channels 260. In an implementation, the second division layer 290 may extend through the first insulating interlayer 200, ones of the fourth sacrificial layers 180 at upper two levels, respectively, and ones of the insulation layers 170 at upper two levels, respectively, and further one of the insulation layers 170 thereunder. The second division layer 290 may extend in the second direction on the first and second regions I and II of the substrate 100, and may extend through two upper step layers of the staircase structure. For example, the selected ones of the fourth sacrificial layers 180 at the two upper levels, respectively, may be divided by the second division layer 290 in the third direction.

Figure 20:
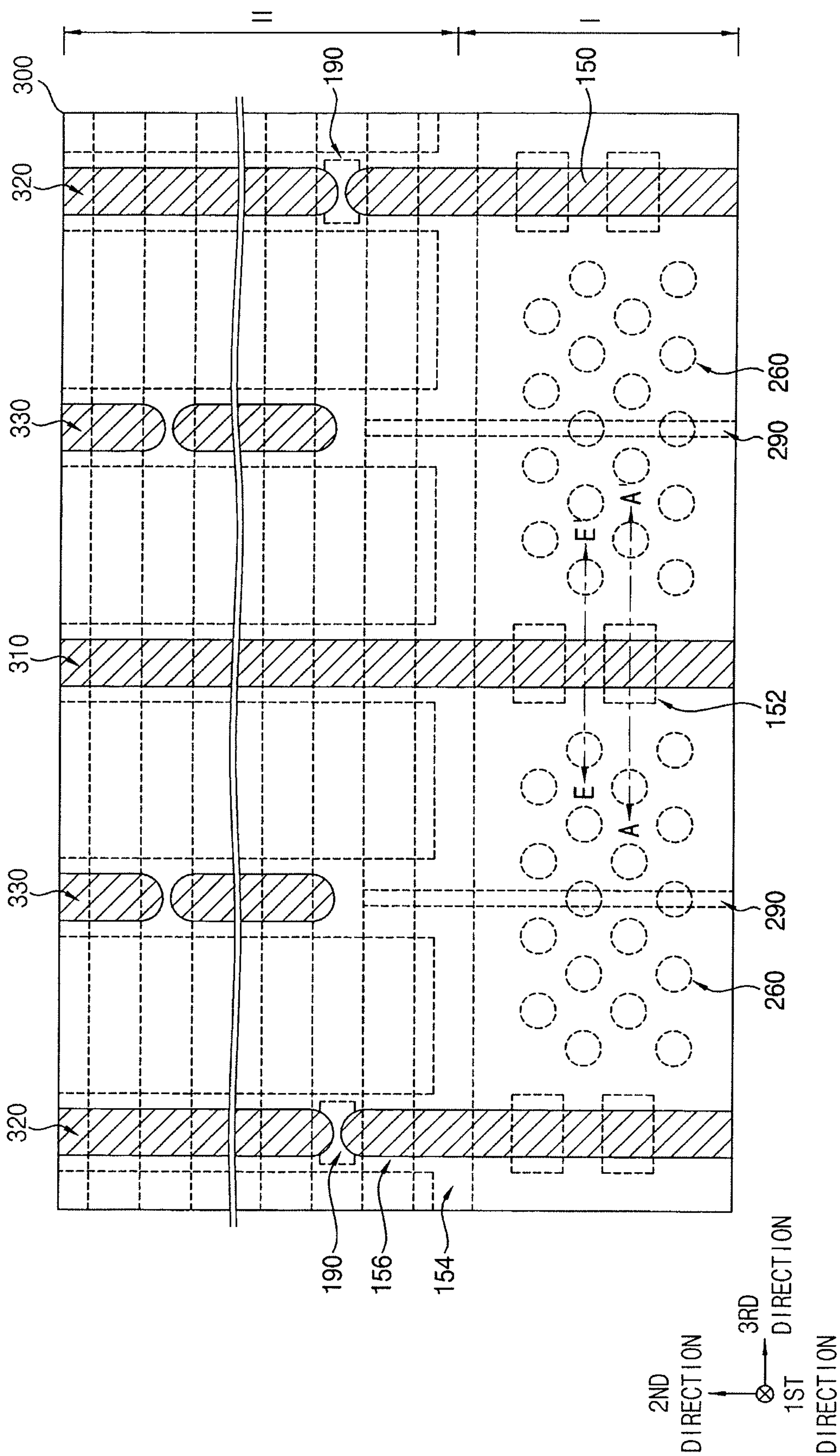
Figure 21:
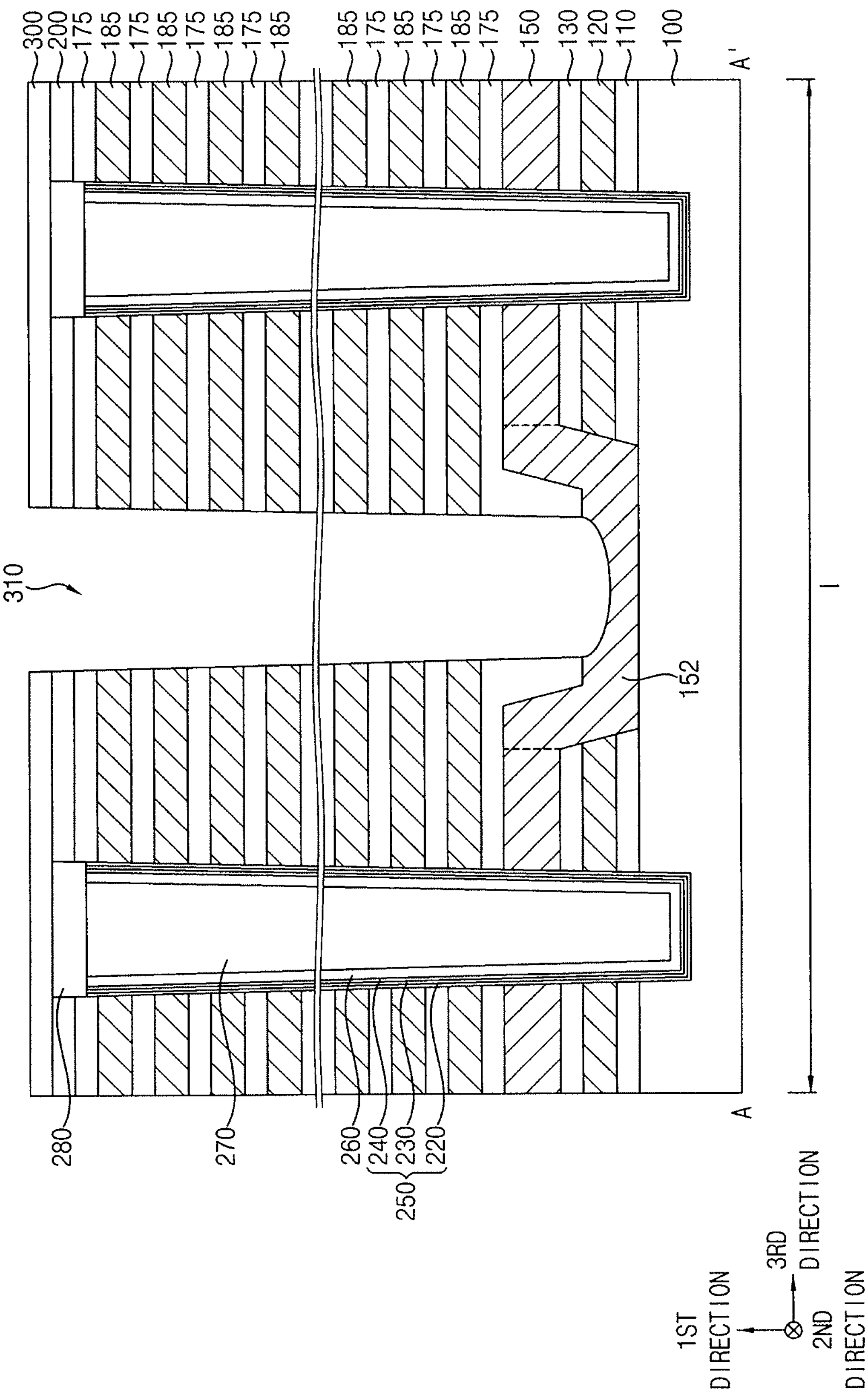
Figure 22:
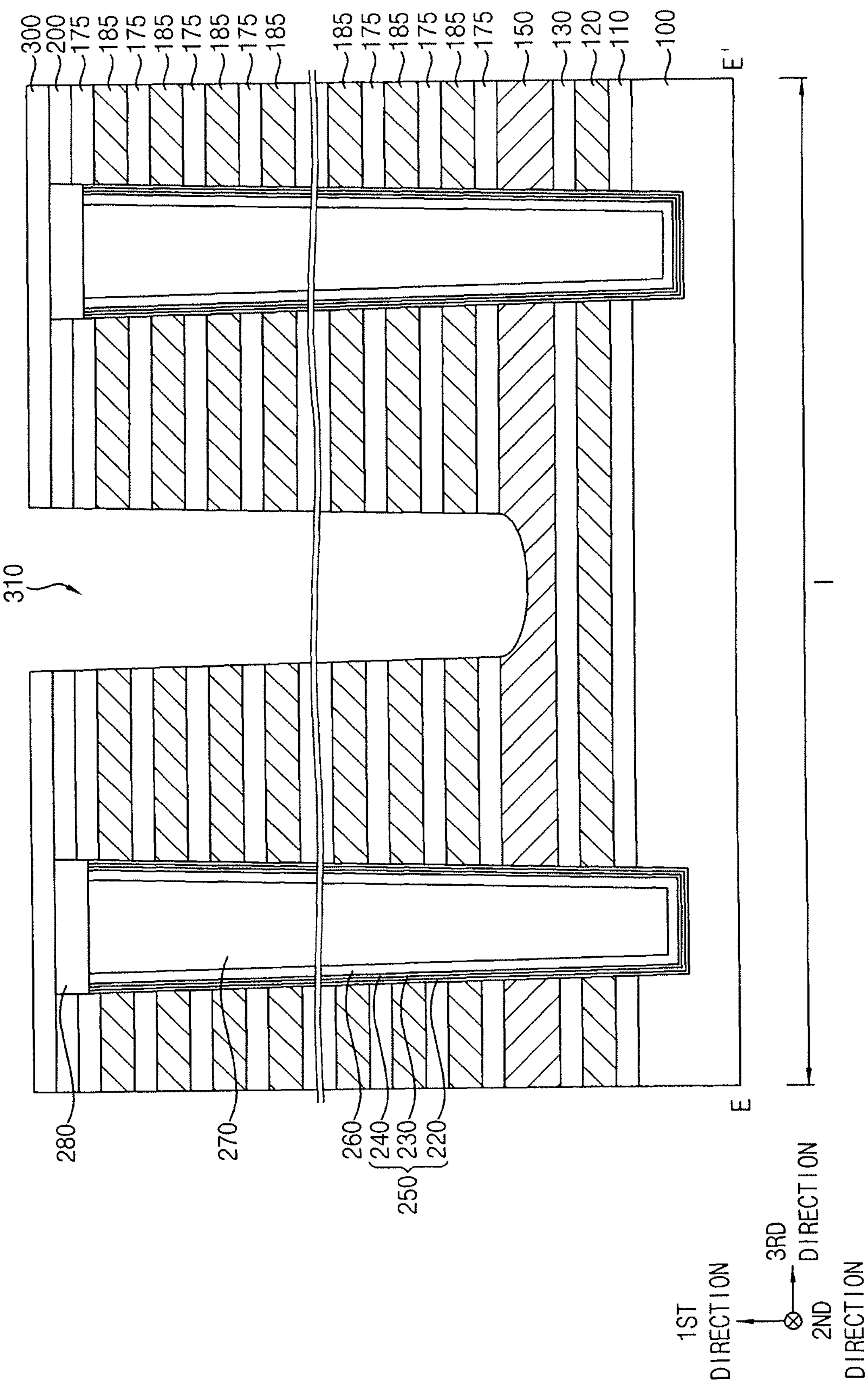

Referring to FIGS. 20 to 22, a second insulating interlayer 300 may be formed on the first insulating interlayer 200 and the pad 280, and sixth to eighth openings 310, 320 and 330 may be formed through the first and second insulating interlayers 200 and 300 and the mold by a dry etching process.

In an implementation, the dry etching process may be performed until an upper surface of the support layer 150 or upper surfaces of the first to third support patterns 152, 154, and 156 are exposed, and an upper portion of the support layer 150 or upper portions of the first to third support patterns 152, 154, and 156 may be also removed during the dry etching process. As the sixth to eighth openings 310, 320, and 330 are formed, the insulation layers 170 and the fourth sacrificial layers 180 of the mold may be exposed.

In an implementation, each of the sixth to eighth openings 310, 320, and 330 may extend in the second direction, and a plurality of sixth openings 310, a plurality of seventh openings 320, and a plurality of eighth openings 330 may be formed in the third direction. Each of the sixth to eighth openings 310, 320, and 330 may expose an upper surface of the third support pattern 156 on the second region II of the substrate 100, each of the sixth and seventh openings 310 and 320 may expose an upper surface of the first support pattern 152 on the first region I of the substrate 100, and the eighth opening 330 may be aligned with the second division layer 290 in the second direction.

As the sixth to eighth openings 310, 320, and 330 are formed, the insulation layer 170 may be transformed into an insulation pattern 175 extending in the second direction, and the fourth sacrificial layer 180 may be transformed into a fourth sacrificial pattern 185 extending in the second direction.

In an implementation, the sixth opening 310 may continuously extend in the second direction on the first and second regions I and II of the substrate 100, and the seventh opening 320 may be discontinuous at a portion on the second region II of the substrate 100. For example, the fourth sacrificial patterns 185 extending in the second direction at opposite sides, respectively, of the seventh opening 320 in the third direction may be connected with each other at the discontinuous portion of seventh opening 320. In an implementation, the discontinuous portion of the seventh opening 320, or a connecting portion of the fourth sacrificial patterns 185 may overlap one of the fourth sacrificial patterns 185 at a third level and the first division layer 190 in the first direction.

In an implementation, the eighth opening 330 may not extend continuously and may be discontinuous at a portion on the second region II of the substrate, and a plurality of eighth openings 330 may be formed to be spaced apart from each other in the second direction on the second region II of the substrate 100.

Figure 23:
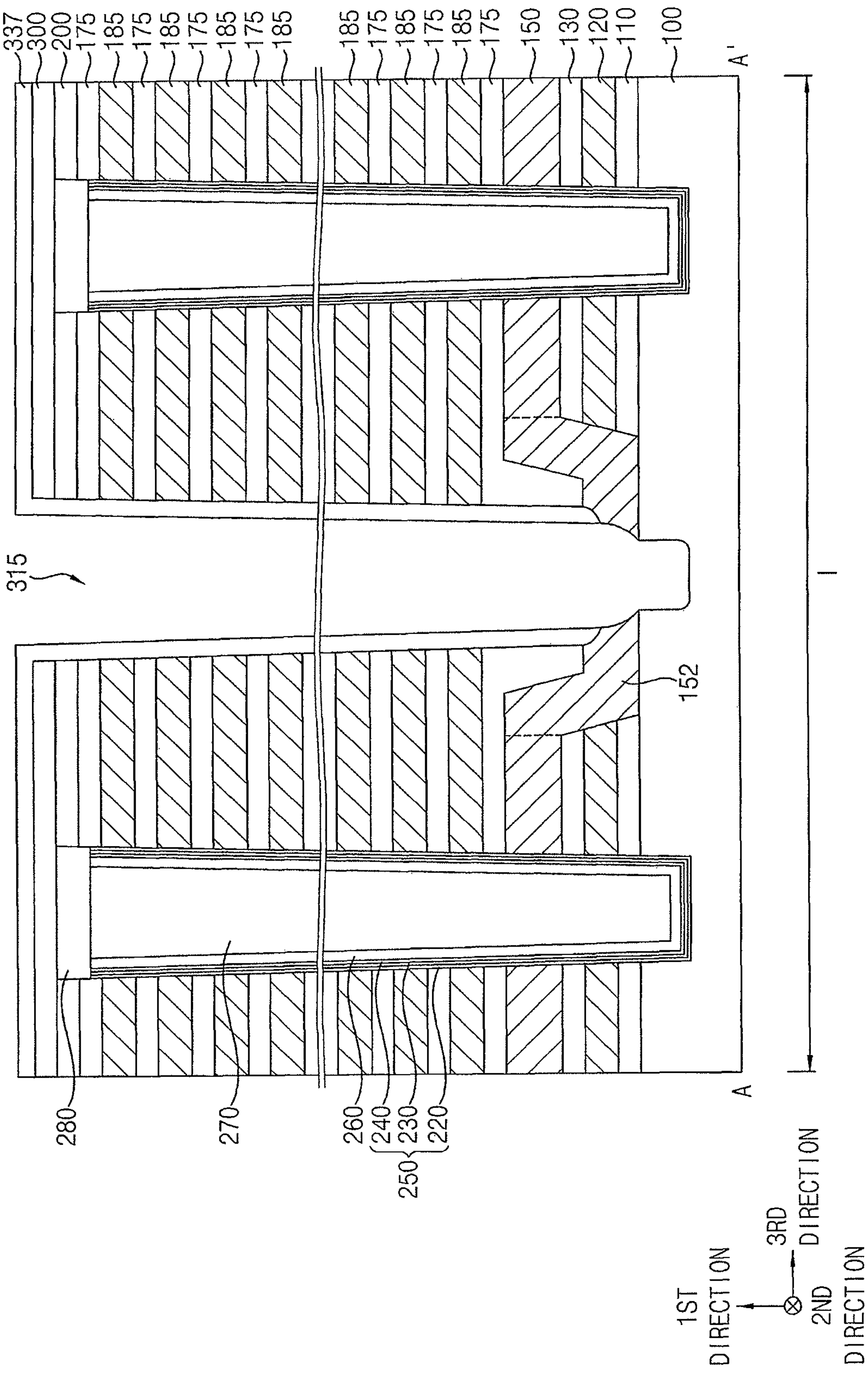
Figure 24:
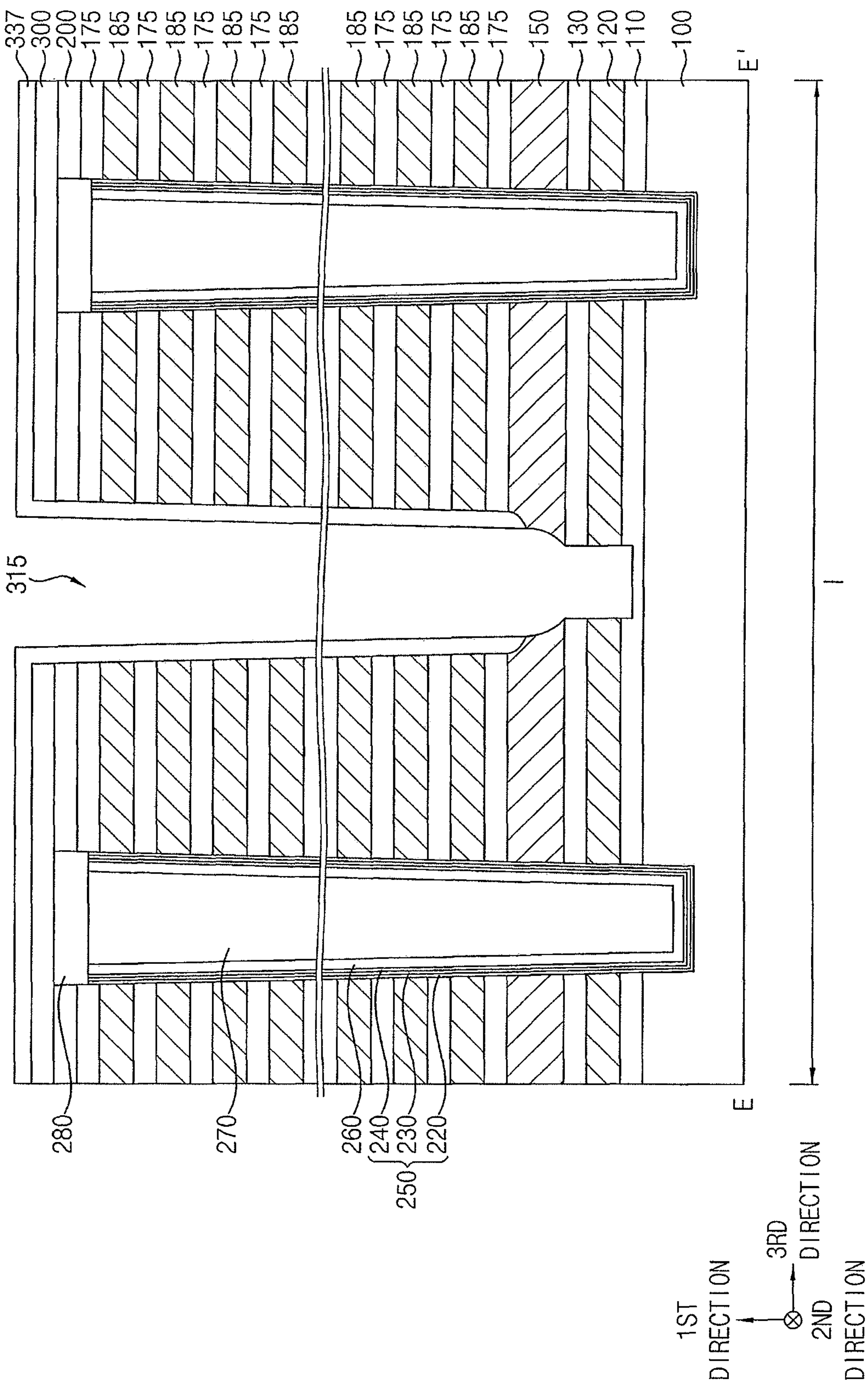

Referring to FIGS. 23 and 24, a first spacer layer may be formed on sidewalls of the sixth to eighth openings 310, 320, and 330 and an upper surface of the second insulating interlayer 300, and portions of the first spacer layer on bottoms of the sixth to eighth openings 310, 320, and 330 may be removed by an anisotropic etching process to form a first spacer 337, and upper surfaces of the support layer 150 and the first to third support patterns 152, 154, and 156 may be partially exposed.

Figure 30:
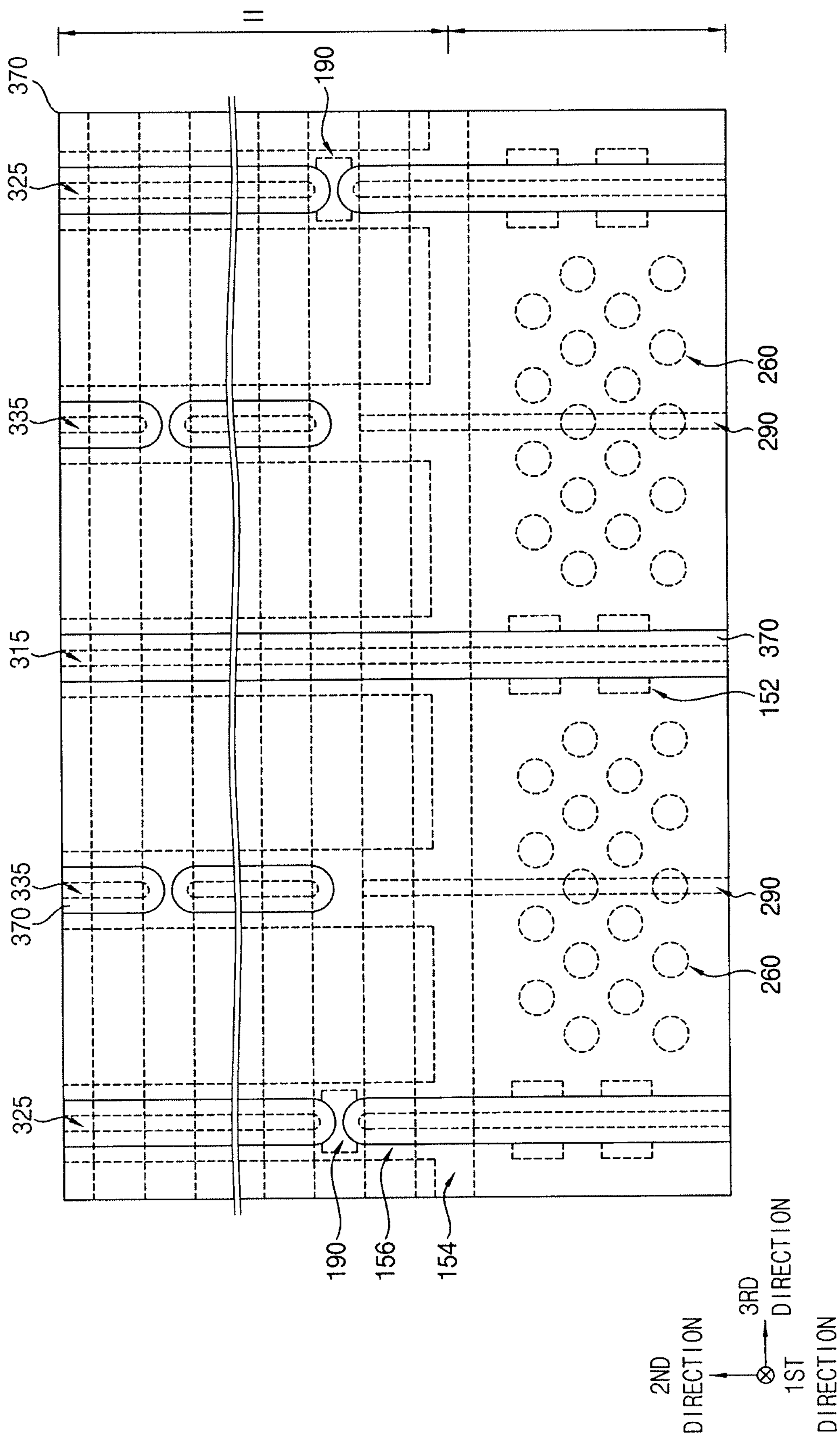

The exposed portions of the support layer 150 and the first to third support patterns 152, 154, and 156 and portions of the second and third sacrificial layers 120 and 130 thereunder may be removed so that the sixth to eighth openings 310, 320, and 330 may be enlarged downwardly to form ninth to eleventh openings 315, 325, and 335, respectively (refer to FIG. 30). Each of the ninth and tenth openings 315 and 325 may expose an upper surface of the first sacrificial layer 110 on the first region I of the substrate 100, and each of the ninth to eleventh openings 315, 325, and 335 may expose an upper surface of the substrate 100 on an edge of the first region I and the second region II of the substrate 100. Each of the ninth and tenth openings 315 and 325 may expose the upper surface of the first sacrificial layer 110, and may further extend through an upper portion of the first sacrificial layer 110. Each of the ninth to eleventh openings 315, 325, and 335 may expose the upper surface of the substrate 100, and further extend through an upper portion of the substrate 100.

In an implementation, the first spacer 337 may include, e.g., undoped amorphous silicon or undoped polysilicon. When the first spacer 337 includes undoped amorphous silicon, the undoped amorphous silicon may be crystallized during other deposition processes.

In an implementation, the first spacer 337 may already be formed when the ninth to eleventh openings 315, 325, and 335 are formed, and downwardly enlarged portions thereof, e.g., lower portions of the ninth to eleventh openings 315, 325, and 335 may have widths smaller than those of the sixth to eighth openings 310, 320, and 330, respectively, e.g., upper portions of the ninth to eleventh openings 315, 325 and 335, respectively.

When the second and third sacrificial layers 120 and 130 are partially removed, the sidewalls of the sixth to eighth openings 310, 320, and 330 may be covered by the first spacer 337, and the insulation patterns 175 and the fourth sacrificial patterns 185 included in the mold may not be removed.

Hereinafter, not all of the ninth to eleventh openings 315, 325, and 335 will be illustrated, but only the ninth opening 315 will be illustrated, however, except for special cases, explanations on the ninth opening 315 may be applied to the tenth opening 325 and/or the eleventh opening 335.

Figure 25:
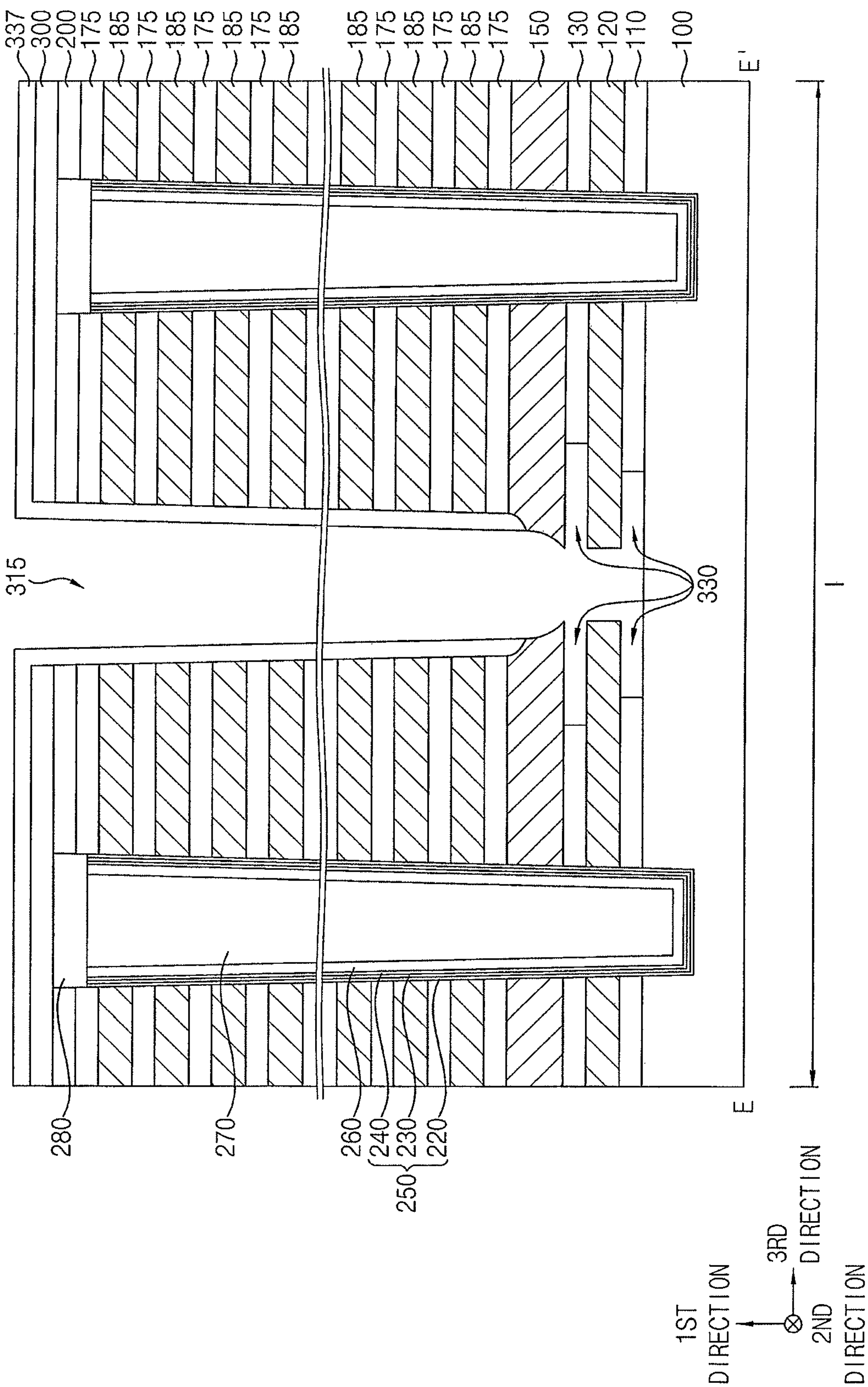

Referring to FIG. 25, the first and third sacrificial layers 110 and 130 exposed by the ninth opening 315 may be partially removed to form first gaps 330.

In an implementation, the first gaps 330 may be formed by removing only portions of the first and third sacrificial layers 110 and 130 adjacent to the ninth opening 315, and may be removed by a wet etching process using, e.g., hydrofluoric acid or by a dry etching process using, e.g., hydrogen fluoride.

As the first gaps 330 are formed, a lower portion of the support layer 150 and an upper portion of the substrate 100 adjacent to the ninth opening 315 may be exposed.

In an implementation, the third sacrificial layer 130 may be partially removed and the first sacrificial layer 110 may be barely removed by the ninth opening 315, and lower and upper ones of the first gaps 330 that may be formed by removing the first and third sacrificial layers 110 and 130, respectively, may have widths in the third direction that are different from each other. The upper ones of the first gaps 330 may have a width in the third direction that is greater than that of the lower ones of the first gaps 330. For example, a distance in the third direction from the upper ones of the first gap 330 to the channel 260 or the charge storage structure 250 may be less than a distance in the third direction from the lower ones of the first gap 330 to the channel 260 or the charge storage structure 250.

Figure 26:
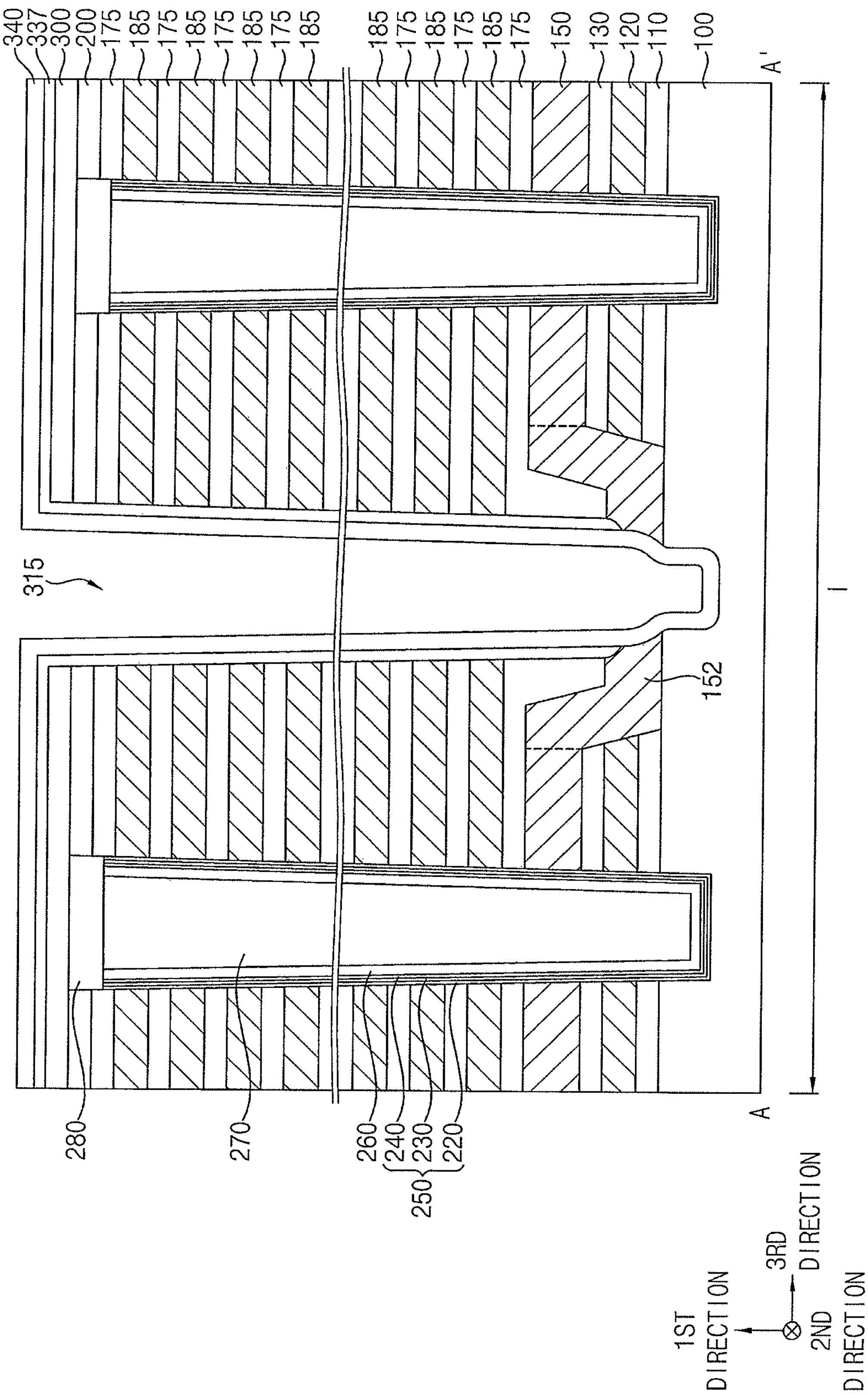
Figure 27:
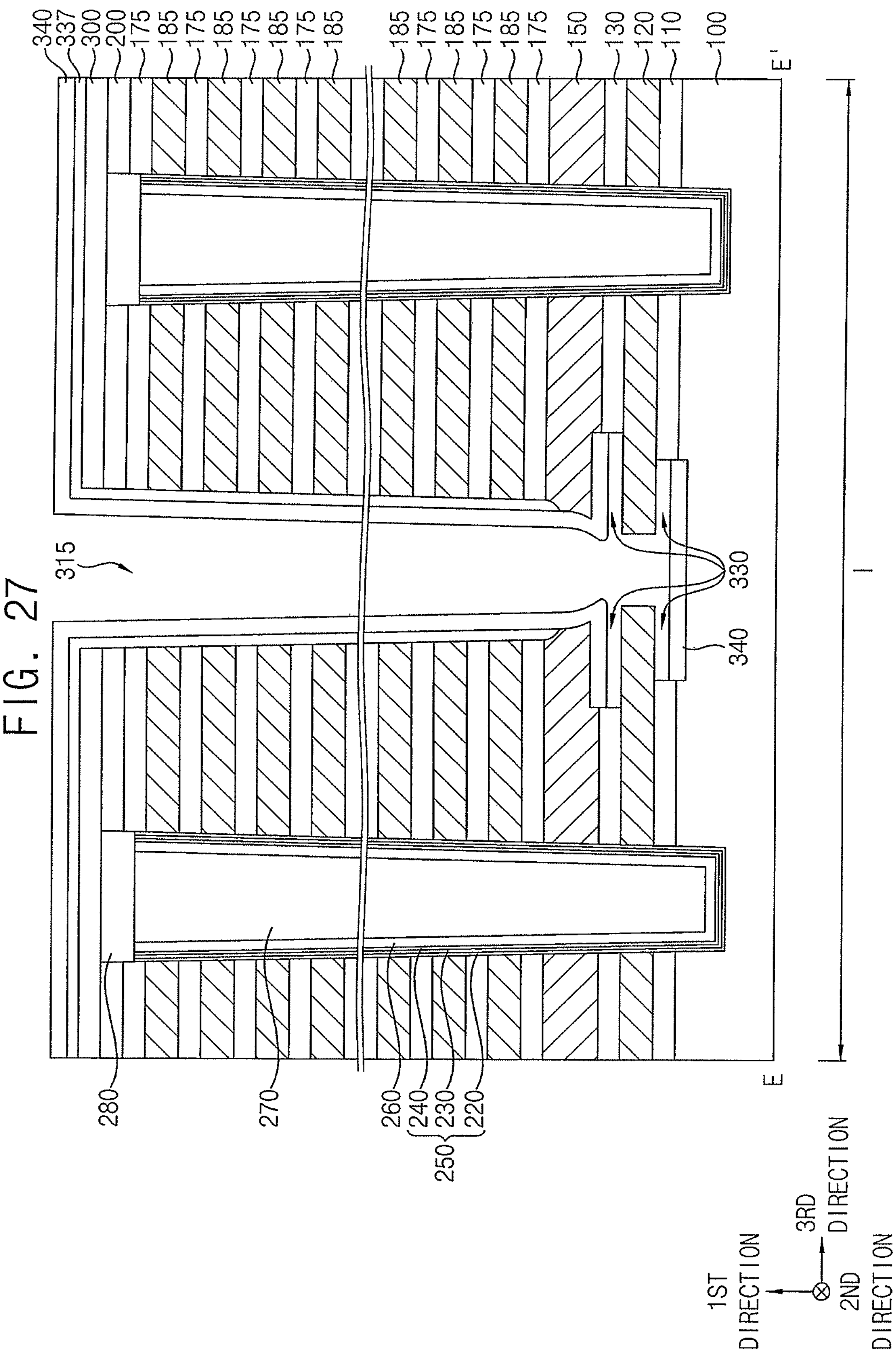

Referring to FIGS. 26 and 27, silicon-containing layers may be oxidized by, e.g., a wet oxidation process. For example, the upper portion of the substrate 100, the upper portions of the first to third support patterns 152, 154, and 156, and the lower portion of the support layer 150 exposed by the ninth opening 315 and the first gaps 330, and a surface of the first spacer 337 may be oxidized to be converted into a fifth sacrificial pattern 340.

Figure 28:
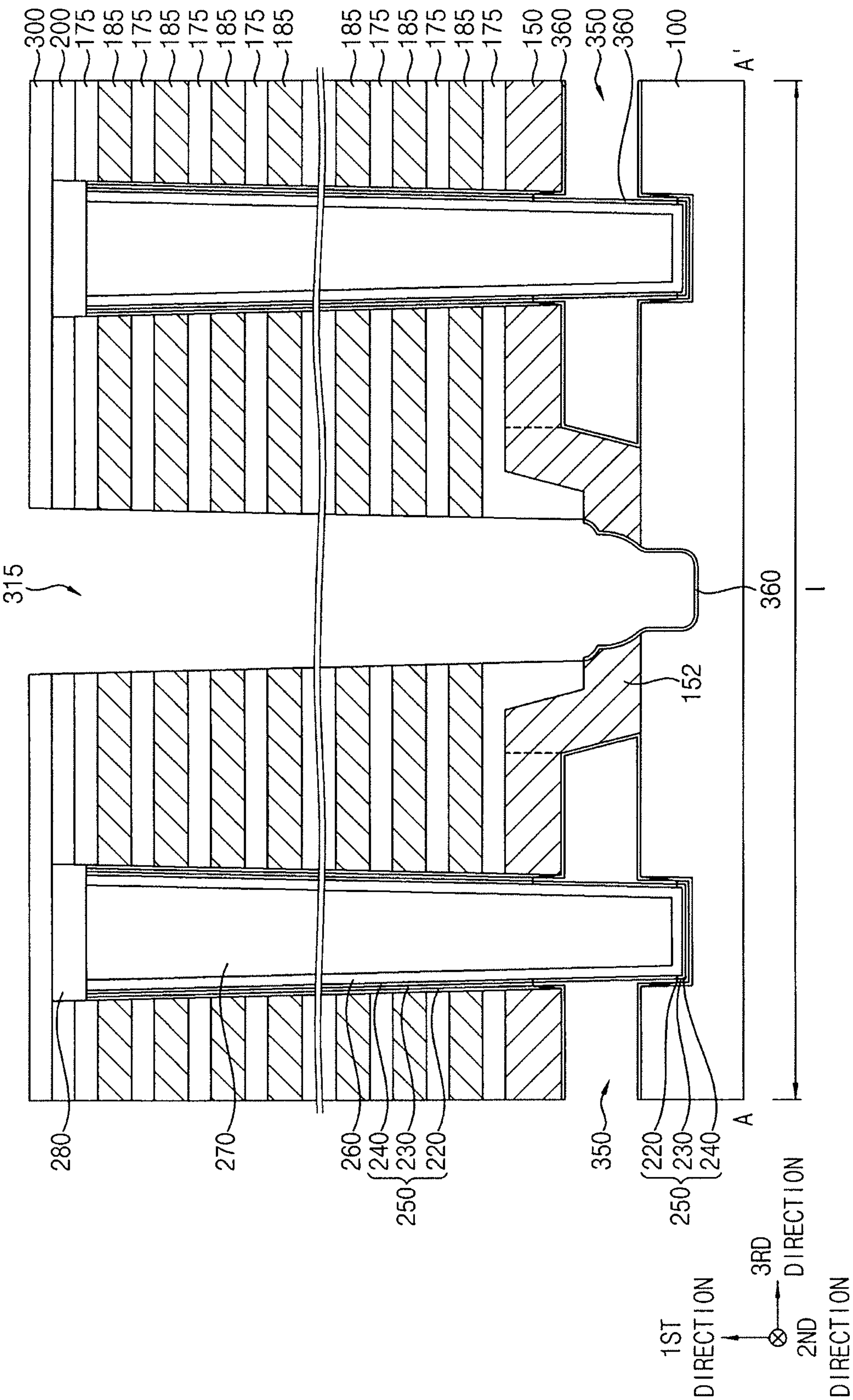
Figure 29:
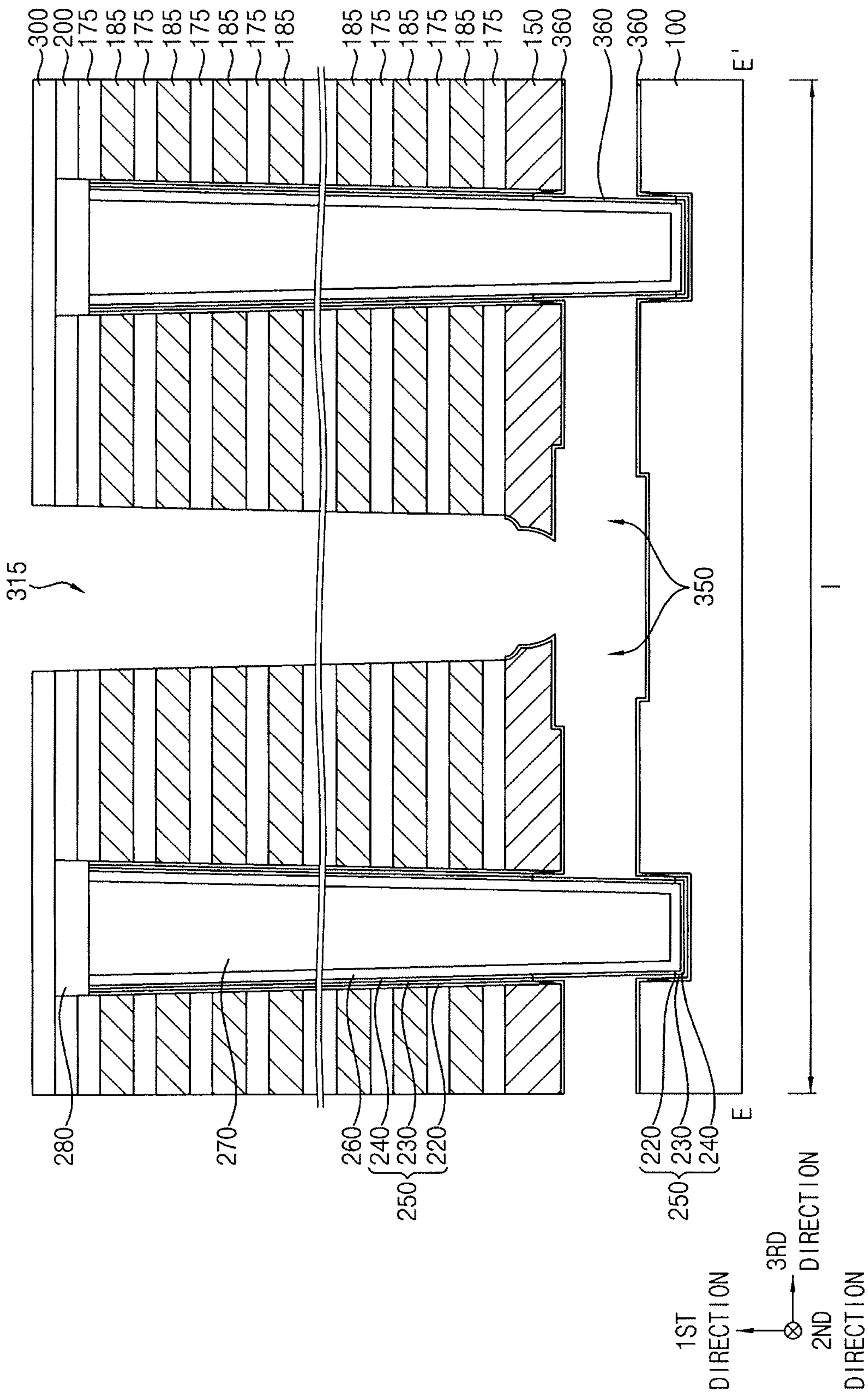

Referring to FIGS. 28 and 29, the fifth sacrificial pattern 340 and the first and third sacrificial layers 110 and 130 may be removed, and the second sacrificial layer 120 may be removed to form a second gap 350.

In an implementation, the fifth sacrificial pattern 340 and the first to third sacrificial layers 110, 120, and 130 may be removed by a wet etching process using, e.g., hydrofluoric acid (HF), and the second sacrificial layer 120 may be removed by a wet etching process using, e.g., phosphoric acid ($H_3PO_4$).

When the fifth sacrificial pattern 340 and the first to third sacrificial layers 110, 120 and 130 are removed to form the second gap 350, a portion of the charge storage structure 250 exposed by the second gap 350 may be also removed to expose an outer sidewall of the channel 260, and the charge storage structure 250 may be divided into an upper portion (extending through the mold to cover most of the outer sidewall of the channel 260) and a lower portion (covering a bottom surface of the channel 260 on the substrate 100).

In an implementation, a portion of the second gap 350 adjacent to the outer sidewall of the channel 260 may have an upper surface that is higher than a lower surface of the support layer 150 and a lower surface lower than an upper surface of the substrate 100.

In an implementation, a bottom (e.g., substrate-facing) surface of the upper portion of the charge storage structure 250 and a top surface (e.g., a surface facing away from the substrate 100) of the lower portion of the charge storage structure 250 may not have a constant height. For example, bottom surfaces of the tunnel insulation pattern 240 and the charge storage pattern 230 of the upper portion of the charge storage structure 250 may be higher than a bottom surface of the first blocking pattern 220 included therein. In an implementation, the bottom surfaces of the tunnel insulation pattern 240 and the charge storage pattern 230 of the upper portion of the charge storage structure 250 may be substantially flat, and the bottom surface of the first blocking pattern 220 may be gradually lower as a distance from the outer sidewall of the channel 260 in the horizontal direction increases (e.g., may be slanted or inclined).

In an implementation, a top surface of the lower portion of the charge storage structure 250 may not have a constant height. For example, top surfaces of the tunnel insulation pattern 240 and the charge storage pattern 230 of the lower portion of the charge storage structure 250 may be lower than a top surface of the first blocking pattern 220. In an implementation, the top surfaces of the tunnel insulation pattern 240 and the charge storage pattern 230 of the lower portion of the charge storage structure 250 may be substantially flat, and the top surface of the first blocking pattern 220 may be gradually higher as a distance from the outer sidewall of the channel 260 in the horizontal direction increases. In an implementation, the top surface of the first blocking pattern 220 of the lower portion of the charge storage structure 250 may be substantially flat.

As described above, the fifth sacrificial pattern 340, which may be formed by oxidizing the lower portion of the support layer 150 and the upper portion of the substrate 100 exposed by the first gaps 330, may be removed, and a width in the first direction of a portion of the second gap 350 adjacent the ninth opening 315 may be greater than a width in the first direction of other portions thereof.

As the second gap 350 is formed, the support layer 150 and the first to third support patterns 152, 154, and 156 may not be removed, and thus the mold may not fall down.

The first spacer 337 may be removed, and a seed layer 360 may be formed on the silicon-containing layers, e.g., on an upper surface of the substrate 100, upper surfaces of the first to third support patterns 152, 154, and 156, a lower surface and a sidewall of the support layer 150, and an outer sidewall of the channel 260.

In an implementation, the seed layer 360 may include amorphous silicon, and may further include impurities, e.g., carbon, nitrogen, and/or oxygen.

Figure 31:
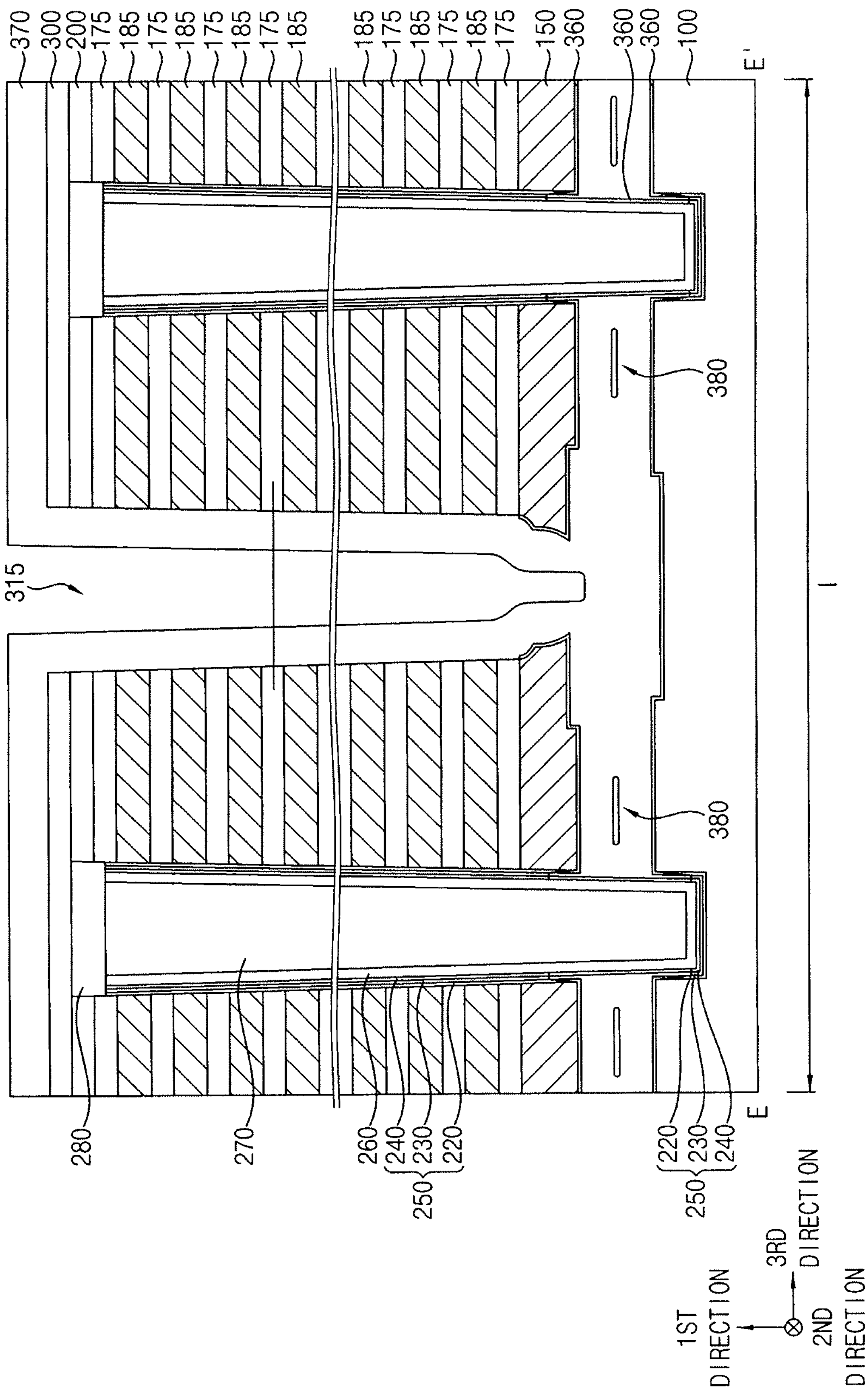

Referring to FIGS. 30 and 31, a channel connecting layer 370 may be formed to fill the second gap 350.

The channel connecting layer 370 may be formed on the seed layer 360 in the second gap 350, and may be further formed on a sidewall and a bottom of the ninth opening 315 and an upper surface of the second insulating interlayer 300.

The channel connecting layer 370 may include, e.g., amorphous silicon doped with n-type impurities. The channel connecting layer 370 may be crystallized later during other deposition processes so as to include polysilicon.

An air gap 380 may be formed in the channel connecting layer 370 in the second gap 350. In an implementation, the air gap 380 may be formed at an area far from the ninth opening 315 in the third direction. For example, the air gap 380 may not be formed at areas corresponding to the first gaps 330 and a space between the first gaps 330 in the channel connecting layer 370. The width in the first direction of the portion of the second gap 350 adjacent to the ninth opening 315 may be greater than that of other portions thereof, and the channel connecting layer 370 may more easily fill the portion of the second gap 350 adjacent the ninth opening 315 than other portions thereof so that the air gap 380 may be formed at the other portions.

When the channel connecting layer 370 is formed, the seed layer 360 has already been formed on the silicon-containing layers, e.g., on the upper surface of the substrate 100, the upper surfaces of the first to third support patterns 152, 154 and 156, the lower surface and the sidewall of the support layer 150, and the outer sidewall of the channel 260, and, even if the channel connecting layer 370 is crystallized, the air gap 380 may not be formed at an area adjacent the ninth opening 315 because of the crystallinity difference between the silicon-containing layers.

As the channel connecting layer 370 is formed to fill the second gap 350, the channels 260 forming the channel array may be connected with each other.

Figure 32:
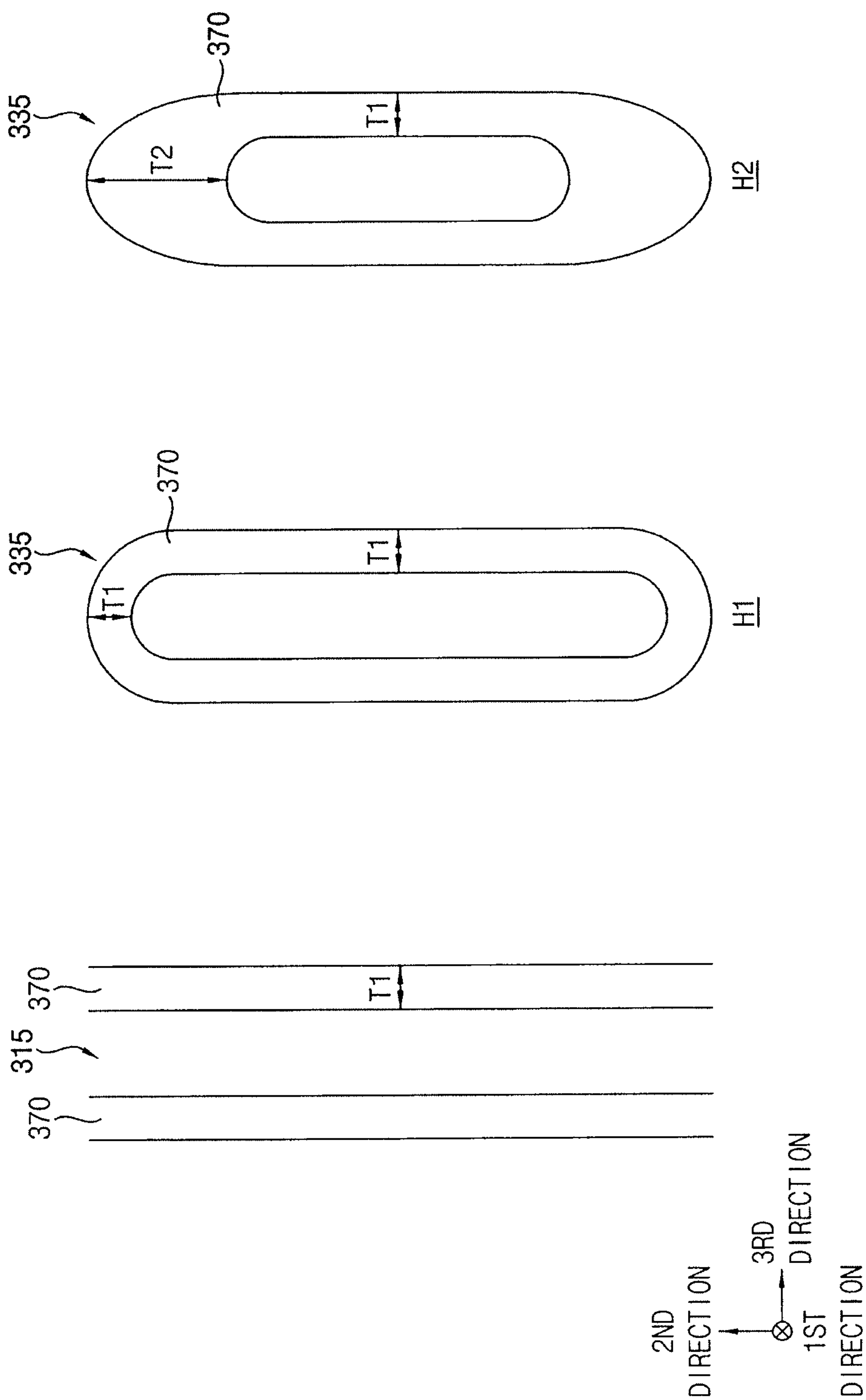

FIG. 32 illustrates the thickness of the channel connecting layer 370 in the ninth and eleventh openings 315 and 335. For example, the channel connecting layer 370 in the ninth opening 315 may extend in the second direction and may have a first thickness T1 in the third direction, e.g., inwardly from sidewalls of the ninth opening 315.

At a first height H1 in the first direction from the upper surface of the substrate 100, portions of the channel connecting layer 370 on the sidewalls of the eleventh opening 335 may have the first thickness T1 as measured in the second and/or third directions (e.g., inwardly from the sidewalls of the eleventh opening 335). In an implementation, at a second height H2 (lower than the first height H1 in the first direction from the upper surface of the substrate 100, e.g., closer to the substrate 100), a portion of the channel connecting layer 370 extending inwardly from a sidewall of the eleventh opening 335 that extends along the second direction may have the first thickness T1 and a portion of the channel connecting layer 370 extending inwardly from a sidewall of the eleventh opening 335 that extends along the third direction may have a second thickness T2 in the second direction that is greater than the first thickness T1.

When an etching process for forming the eleventh opening 335 is performed, each of opposite ends of the eleventh opening 335 in the second direction at the first height H1 may have a shape of a semicircle, and each of opposite ends of the eleventh opening 335 in the second direction at the second height H2 lower than the first height H1 may have a shape of an ellipse. For example, at the second height H2, a thickness of the channel connecting layer 370 at each of opposite ends of the eleventh opening 335 in the second direction may be greater than a thickness of the channel connecting layer 370 at each of opposite ends of the eleventh opening 335 in the third direction.

Figure 33:
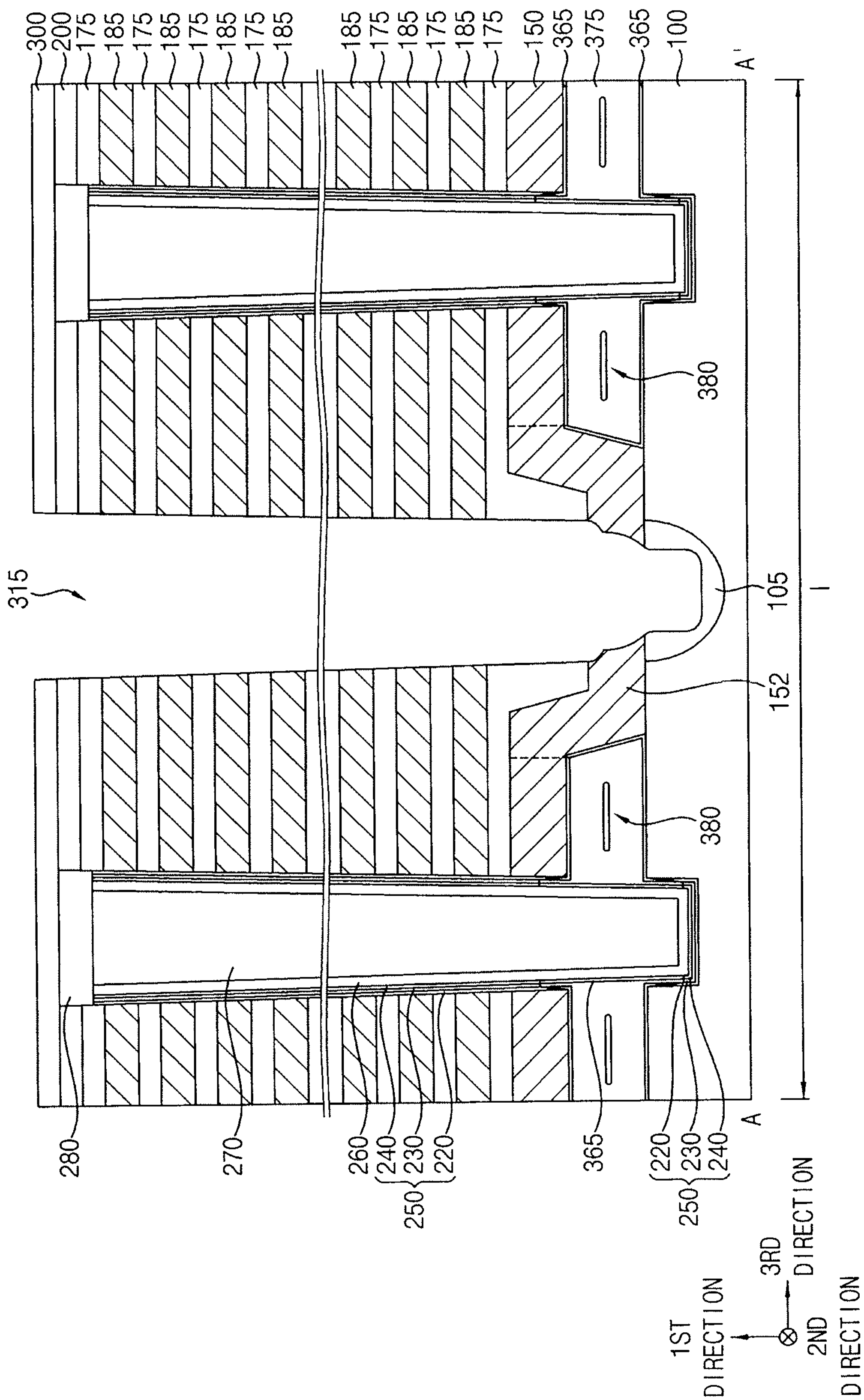
Figure 34:
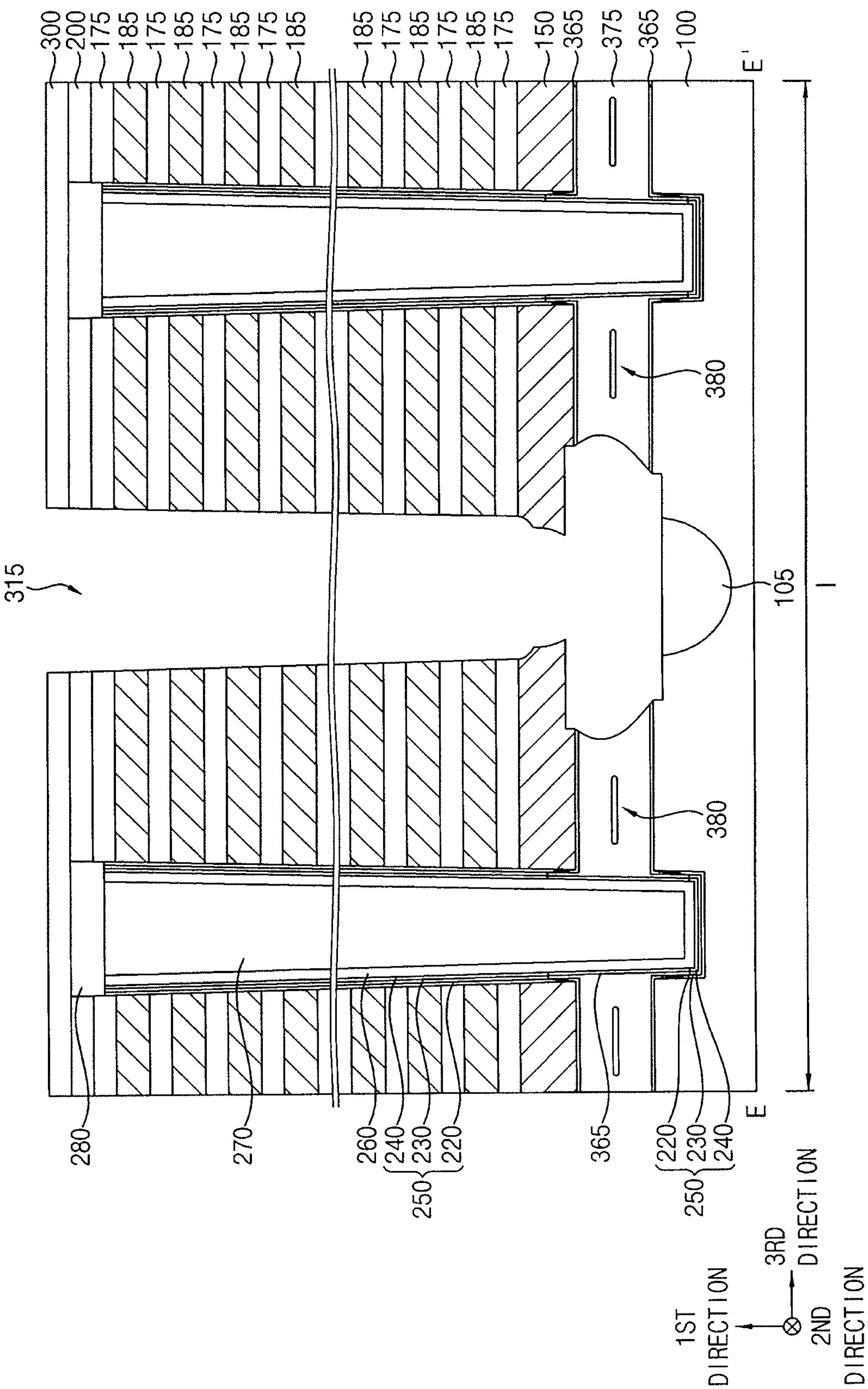

Referring to FIGS. 33 and 34, the channel connecting layer 370 may be partially removed to form a channel connecting pattern 375 in the second gap 350.

In an implementation, the channel connecting pattern 375 may be formed by an etch back process so that a portion of the channel connecting layer 370 in the ninth opening 315 may be removed.

The channel connecting layer 370 may be formed not only in the ninth opening 315 but also in the tenth and eleventh openings 325 and 335, and in order to remove a portion of the channel connecting layer 370 in the eleventh opening 335, a portion thereof having the second thickness T2 at the second height H2 may be removed. For example, the etch back process may be performed such that the channel connecting layer 370 may be etched excessively. In an implementation, the air gap 380 may not be formed at an area of the second gap 350 adjacent the ninth opening 315, and even if the channel connecting layer 370 in the ninth opening 315 were to be excessively removed, the air gap 380 may not be exposed externally.

In an implementation, the seed layer 360 may be formed on the upper surface of the substrate 100, and the seed layer 360 may include impurities, e.g., carbon, nitrogen, oxygen, or the like, and may serve as an etch stop layer for protecting the substrate 100 during the removal of the channel connecting layer 370.

After forming the channel connecting pattern 375, a portion of the seed layer 360 may be removed, and a seed pattern 365 may remain between the channel connecting pattern 375 and the upper surface of the substrate 100 or the lower surface of the support layer 150.

For example, n-type impurities may be implanted into an upper portion of the substrate 100 exposed by the ninth opening 315 to form an impurity region 105. The impurity region 105 may reduce a contact resistance between the substrate 100 and first and second CSLs 440 and 450 and a third division layer 460 to be subsequently formed.

Figure 35:
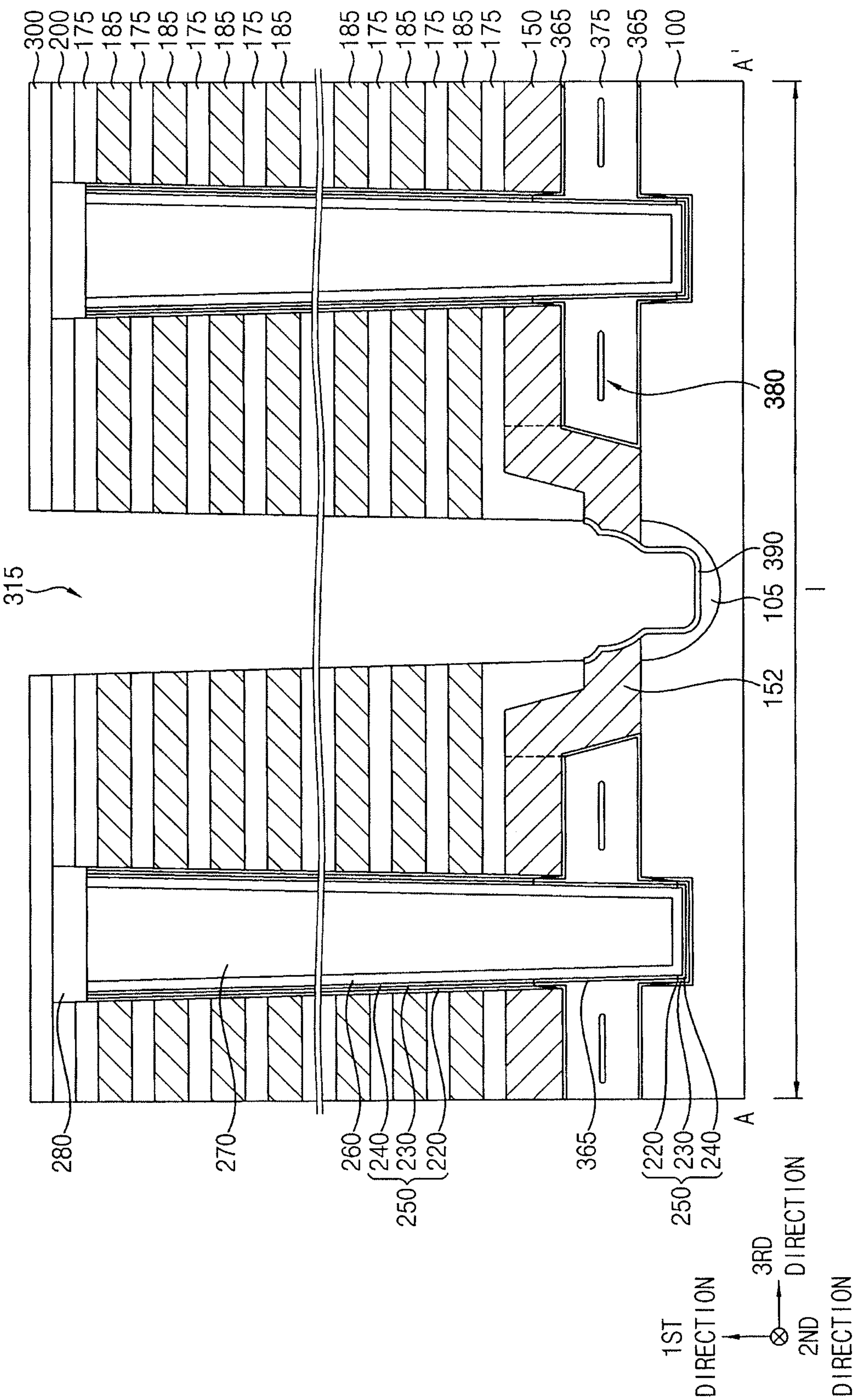
Figure 36:
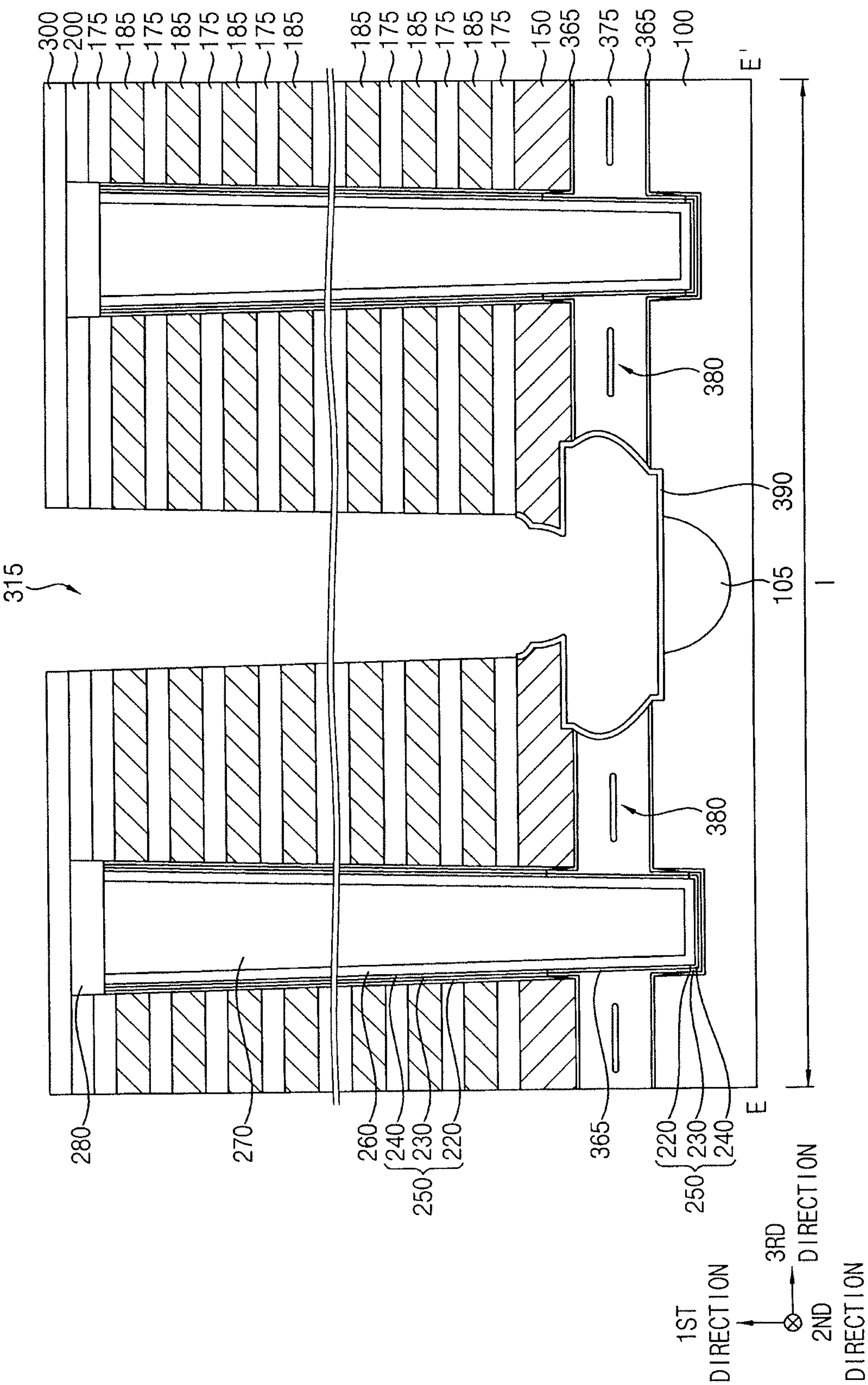

Referring to FIGS. 35 and 36, an oxidation process may be performed on the silicon-containing layers so that a first etch stop pattern 390 is formed on the upper surface of the substrate 100, the sidewall of the channel connecting pattern 375, the sidewalls of the first to third support patterns 152, 154 and 156, and the sidewall and the lower surface of the support layer 150.

The first etch stop pattern 390 may include, e.g., silicon oxide.

Figure 37:
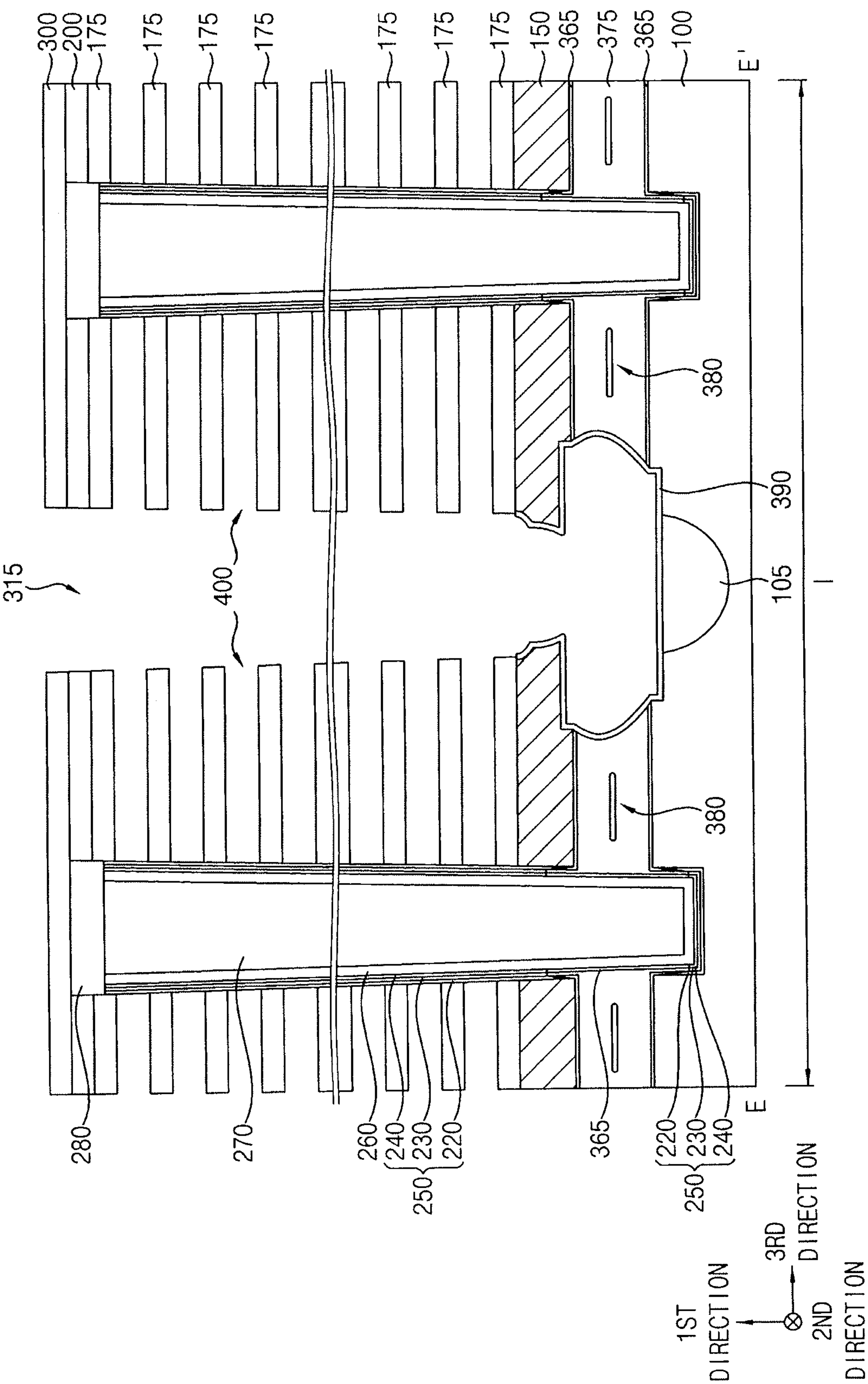

Referring to FIG. 37, the fourth sacrificial patterns 185 exposed by the ninth opening 315 may be removed to form a third gap 400 between neighboring ones of the insulation patterns 175 in the first direction, and an outer sidewall of the first blocking pattern 220 may be partially exposed by the third gap 400.

In an implementation, the fourth sacrificial patterns 185 may be removed by a wet etching process using phosphoric acid ($H_3PO_4$) or sulfuric acid ($H_2SO_4$). The first etch stop pattern 390, having been formed on the upper surface of the substrate 100, the sidewall of the channel connecting pattern 375, the sidewalls of the first to third support patterns 152, 154 and 156, and the sidewall and the lower surface of the support layer 150, may not be damaged during the wet etching process.

Figure 38:
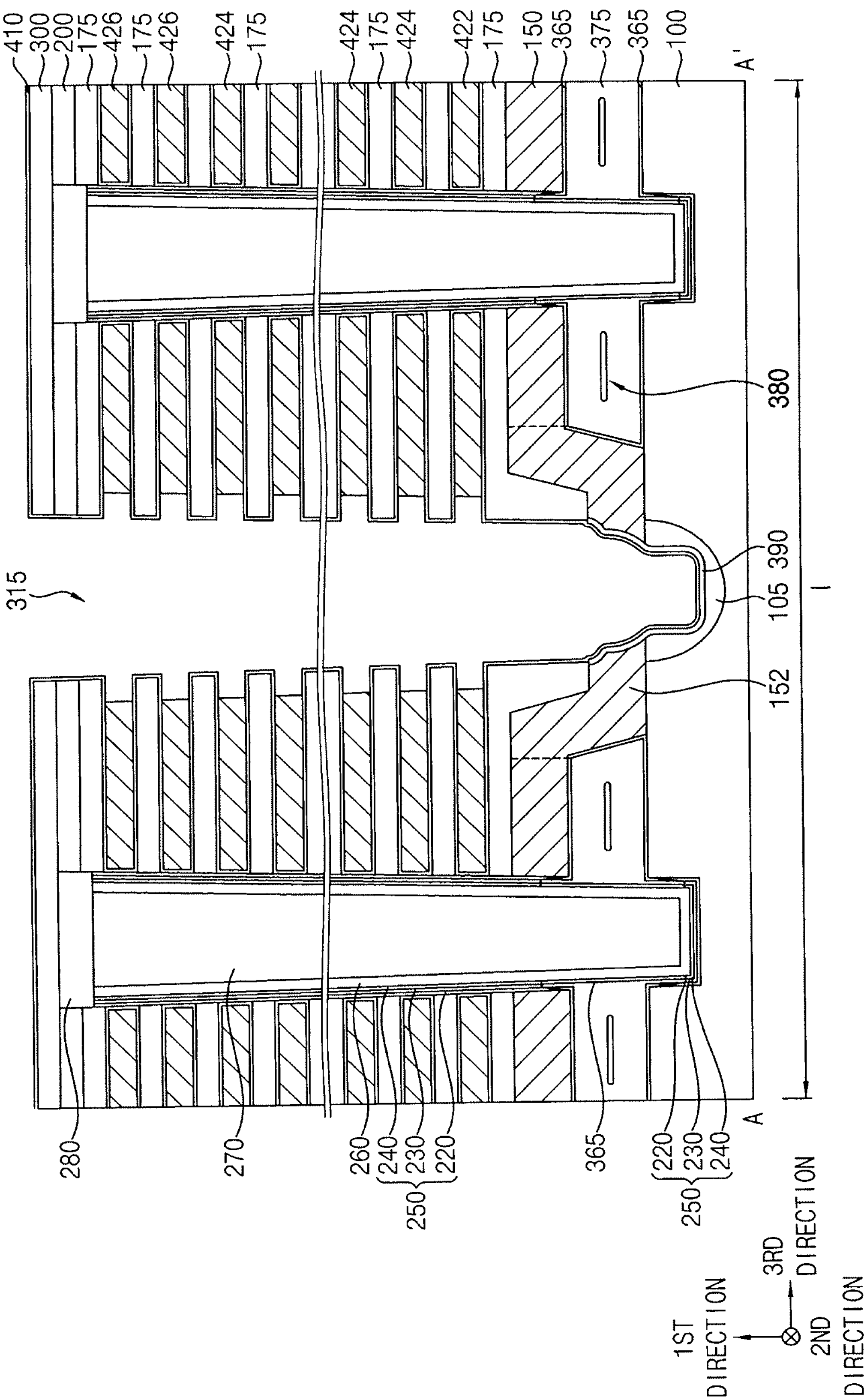
Figure 39:
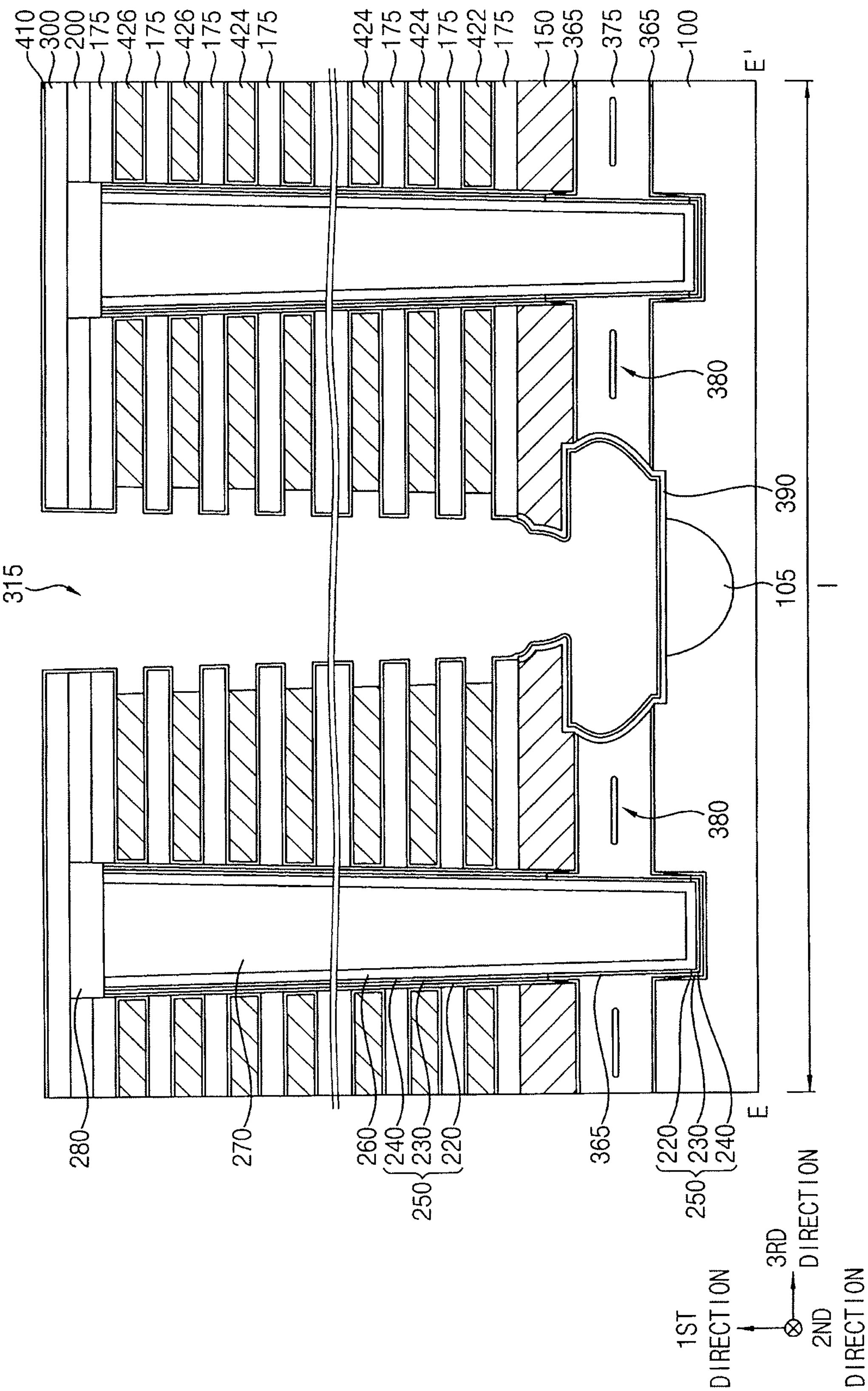
Figure 40:
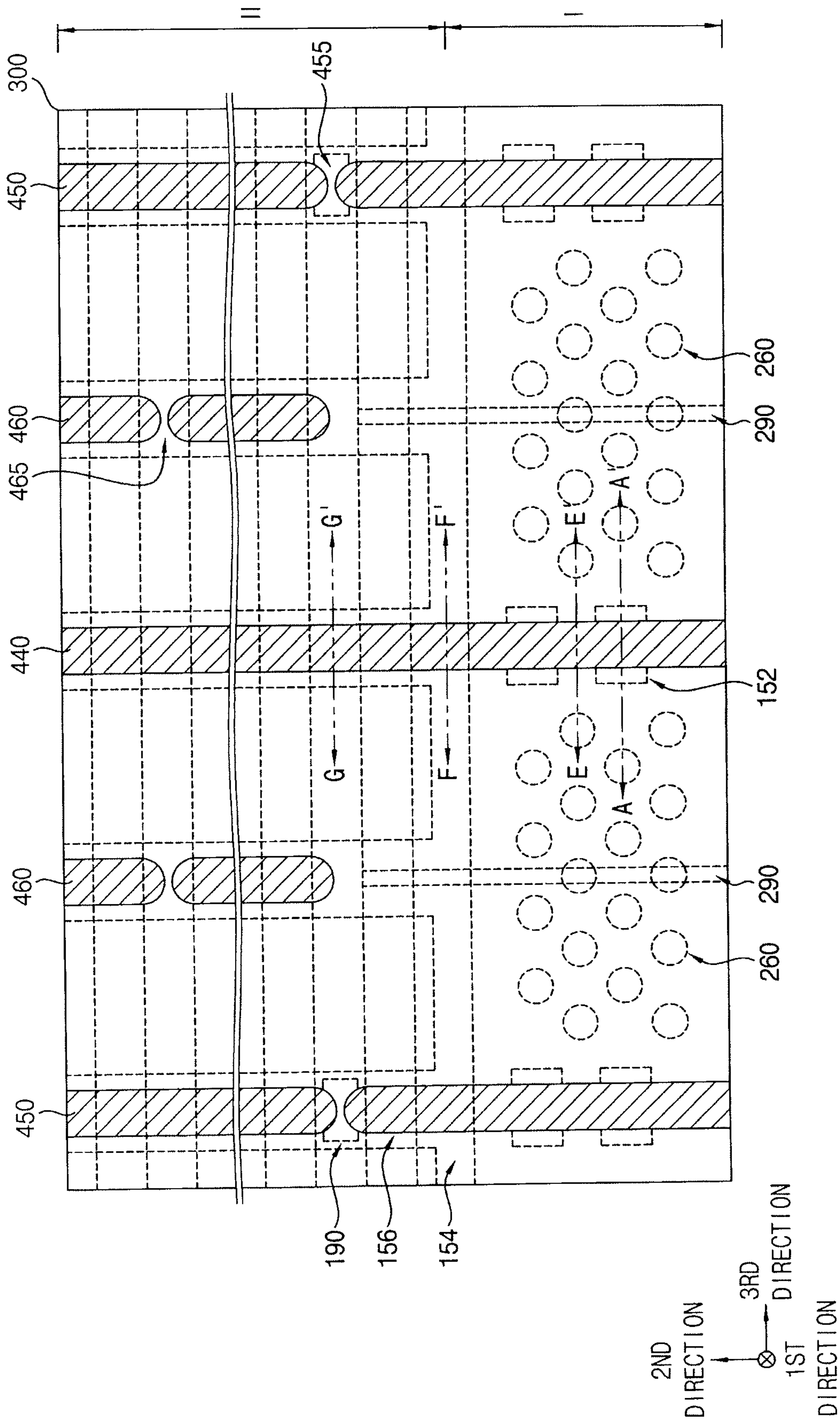
Figure 41:
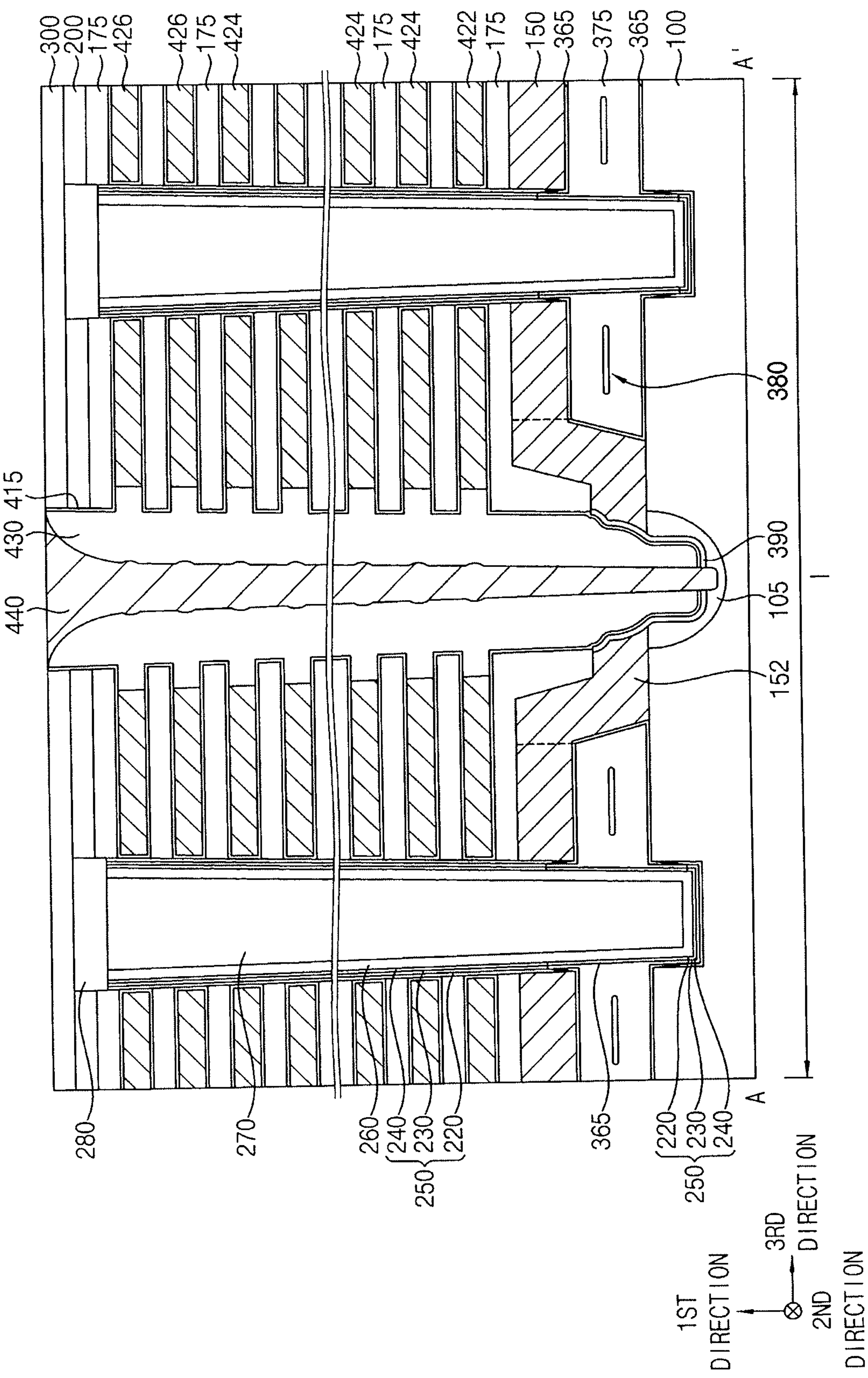
Figure 42:
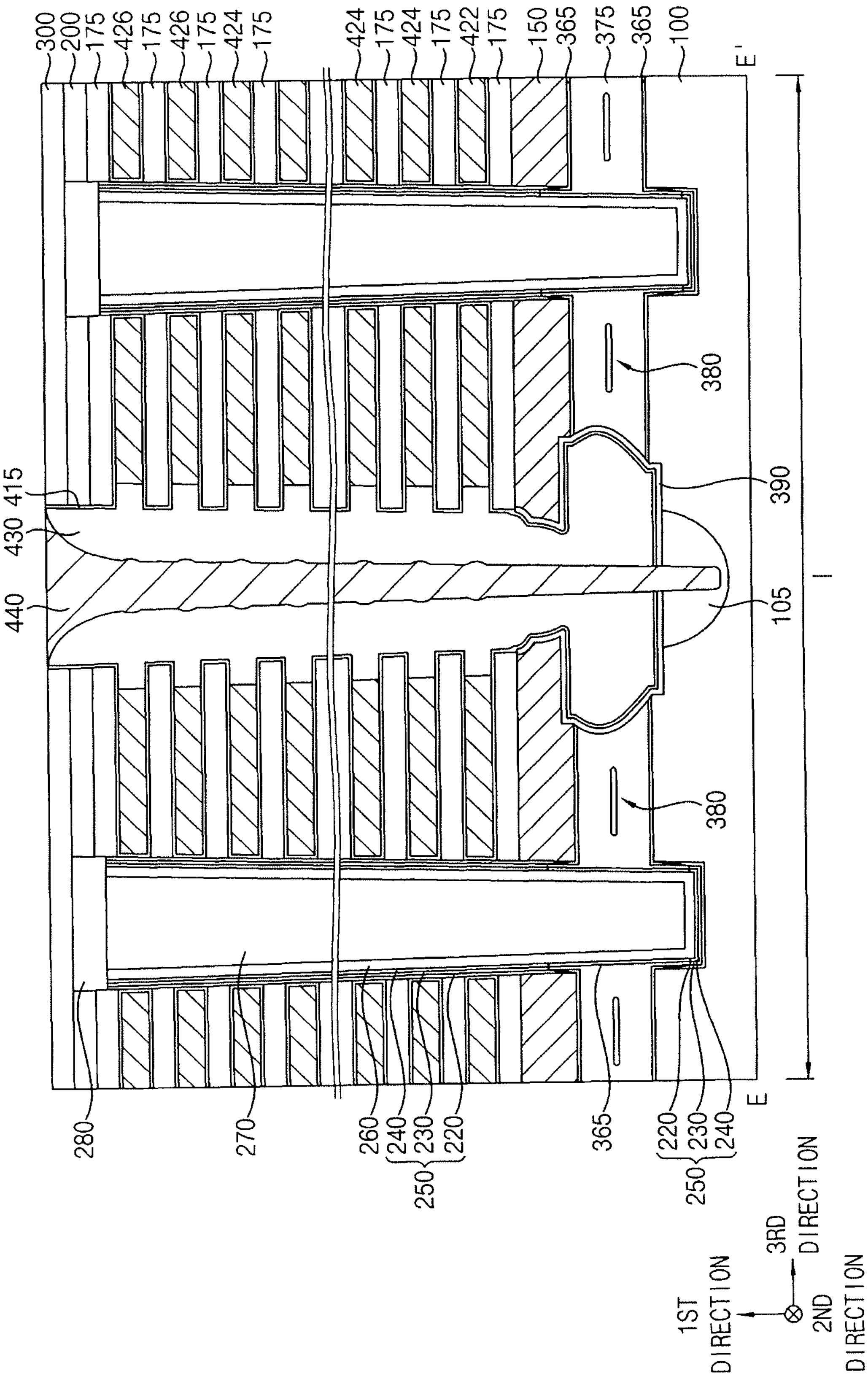

Referring to FIGS. 38 and 39, a second blocking layer 410 may be formed on the exposed outer sidewall of the first blocking pattern 220, inner walls of the third gaps 400, surfaces of the insulation patterns 175, the first etch stop pattern 390, and the upper surface of the second insulating interlayer 300, and a gate electrode layer may be formed on the second blocking layer 410.

The gate electrode layer may include a sequentially stacked gate barrier layer and gate conductive layer. The gate electrode layer may include a low resistance metal, e.g., tungsten, titanium, tantalum, platinum, or the like, and the gate barrier layer may include a metal nitride, e.g., titanium nitride, tantalum nitride, or the like. The second blocking layer 410 may include a metal oxide, e.g., aluminum oxide.

The gate electrode layer may be partially removed to form a gate electrode in each of the third gaps 400. In an implementation, the gate electrode layer may be partially removed by a wet etching process.

The gate electrode may extend in the second direction, and a plurality of gate electrodes may be formed (e.g., spaced apart) in the third direction. In an implementation, a plurality of gate electrodes may be formed in the third direction. For example, the gate electrodes, each of which may extend in the second direction, may be spaced apart from each other by the ninth opening 315. In an implementation, the gate electrodes, each of which may extend in the second direction, may be spaced apart from each other by the tenth opening 325. In an implementation, these gate electrodes may be electrically connected to each other by the first conductive connecting portion 455, which may be formed on the second region II of the substrate 100 to overlap the first division layer 190.

Each gate electrode extending in the second direction on the second region II of the substrate 100 at each level except for two upper levels may be additionally divided in the third direction by the eleventh opening 335. In an implementation, the gate electrodes at opposite sides of the eleventh opening 335 may be electrically connected to each other by the second conductive connecting portion 465.

The gate electrodes at the plurality of levels may form a gate electrode structure. The gate electrode structure may include first, second, and third gate electrodes 422, 424, and 426. In an implementation, the gate electrode structure may include at least one first gate electrode 422, a plurality of second gate electrodes 424, and at least one third gate electrode 426. In an implementation, each of the first to third gate electrodes 422, 424 and 426 may be formed at one level or a plurality of levels.

The gate electrodes may be formed by replacing the fourth sacrificial patterns 185 forming the staircase structure on the second region II of the substrate 100, and the staircase structure of the fourth sacrificial patterns 185 may be referred to as a staircase structure of the gate electrodes hereinafter.

Referring to FIGS. 40 to 44, a second spacer layer may be formed on the second blocking pattern 410 and anisotropically etched to form a second spacer 430 on the sidewall of the ninth opening 315, and an upper surface of the second blocking pattern 410 on the first etch stop pattern 390 may be partially exposed.

A portion of the second blocking pattern 410 not covered by the second spacer 430 may be etched to form a second blocking pattern 415, and a portion of the second blocking layer 410 on the upper surface of the second insulating interlayer 300 may be removed. In an implementation, an upper portion of the first etch stop pattern 390 and an upper portion of the impurity region 105 may be partially removed.

A conductive layer may be formed on the upper surface of the impurity region 105, the second spacer 430, and the second insulating interlayer 300 to fill a remaining portion of the ninth opening 315, and may be planarized until the upper surface of the second insulating interlayer 300 is exposed to form a first CSL 440. When the first CSL 440 is formed, a second CSL 450 may be formed in the tenth opening 325, and a third division layer 460 may be formed in the eleventh opening 335. The first and second CSLs 440 and 450 and the third division layer 460 may include a metal, e.g., tungsten.

Referring to FIGS. 1 to 7 again, after forming a third insulating interlayer 470 on the second insulating interlayer 300, the first and second CSLs 440 and 450, the third division layer 460, the second spacer 430, and the second blocking pattern 415, a first contact plug 480 may be formed through the second and third insulating interlayers 300 and 470 to contact an upper surface of the pad 280 on the first region I of the substrate 100, and a second contact plug 490 may be formed through the first to third insulating interlayers 200, 300 and 470, the insulation patterns 175 and the second blocking pattern 415 to contact an upper surface of each gate electrode.

A bit line may be formed to contact an upper surface of the first contact plug 480, and an upper wiring may be formed to contact an upper surface of the second contact plug 490 may be formed, so that the vertical memory device may be manufactured.

As described above, the first and third sacrificial layers 110 and 130 exposed by the ninth opening 315 may be partially removed to form the first gap 330, surfaces of the support layer 150 and the substrate 100 exposed by the first gap 330 may be oxidized and removed to enlarge the entrance of the first gap 330, the first to third sacrificial layers 110, 120 and 130 may be removed to form the second gap 350, and the channel connecting layer 370 may fill the second gap 350. For example, the air gap 380 may be formed at an area in the channel connecting layer 370 far from the ninth opening 315.

In an implementation, before forming the channel connecting layer 370, the seed layer 360 (including amorphous silicon) may be formed on the silicon-containing layers, e.g., the upper surface of the substrate 100, the lower surface and the sidewall of the support layer 150, and the outer sidewall of the channel 260, and the air gap 380 may not be enlarged or formed at an area in the channel connecting layer 370 adjacent the ninth opening 315 or the channel 260 due to the crystallinity difference between the silicon-containing layers when the channel connecting layer 370 is formed. The seed layer 360 may include doped polysilicon, and, when the channel connecting layer 370 is etched to form the channel connecting pattern 375, the substrate 100 or the support layer 150 may not be damaged.

In an implementation, the first etch stop pattern 390 may be formed by oxidizing the upper surface of the substrate 100, the sidewall of the channel connecting pattern 375, and the lower surface and the sidewall of the support layer 150, and when the third gap 400 is formed, the substrate 100, the channel connecting pattern 375, and the support layer 150 may not be damaged.

Figure 45A:
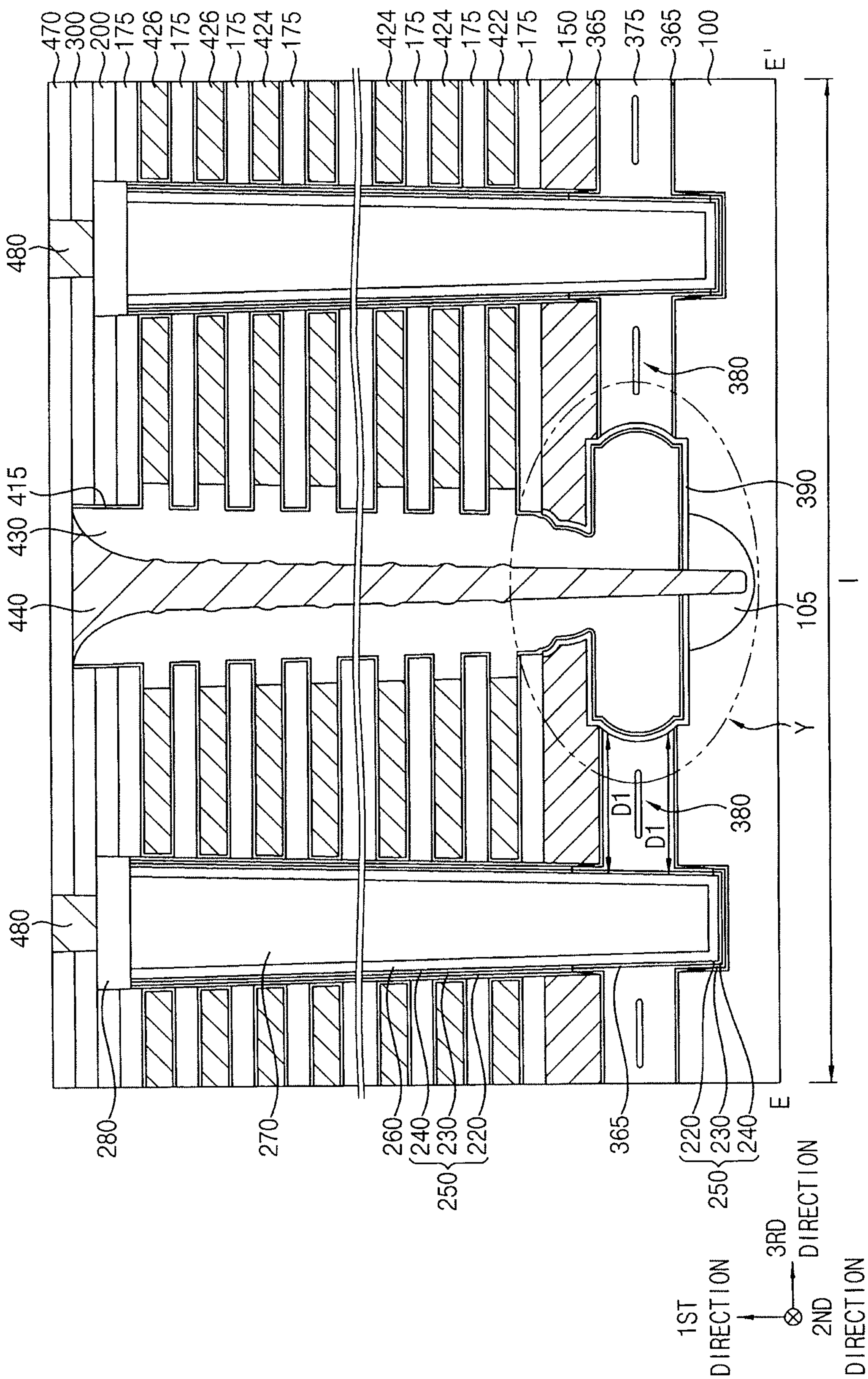
FIGS. 45A and 45B illustrate cross-sectional views of a vertical memory device in accordance with example embodiments.
Figure 45B:
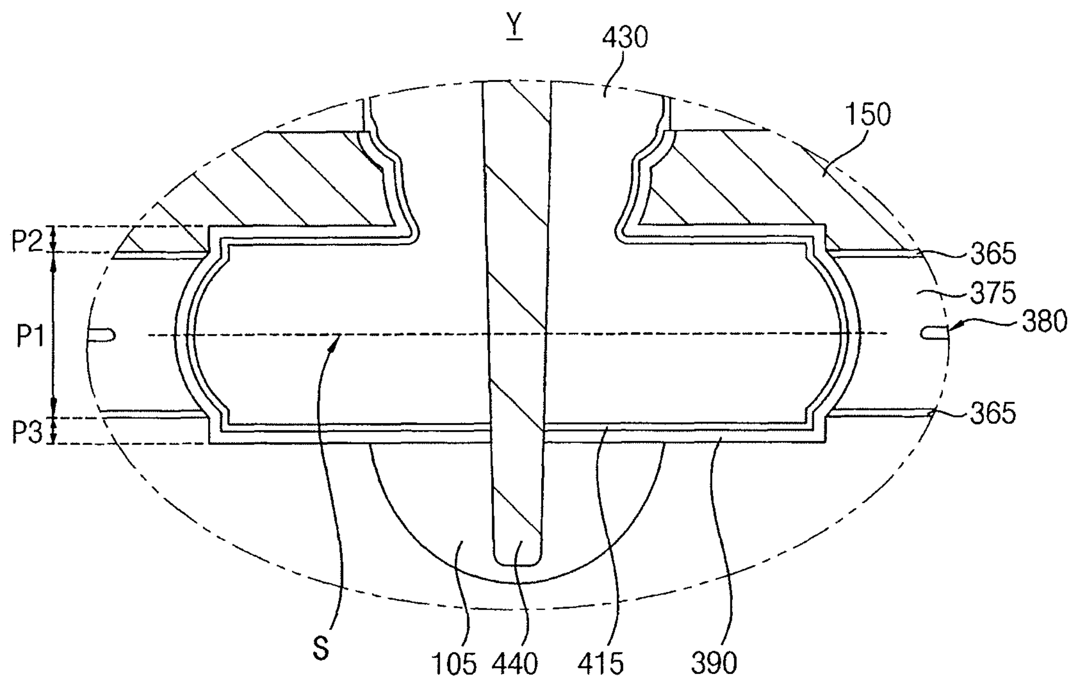

FIGS. 45A and 45B illustrate cross-sectional views of a vertical memory device in accordance with example embodiments. FIG. 45B illustrates an enlarged cross-sectional view of a region Y of FIG. 45A. This vertical memory device may be substantially the same as or similar to that of FIGS. 1 to 7, except for the shape of the channel connecting pattern and/or the second spacer. Thus, like reference numerals refer to like elements, and repeated descriptions thereof may be omitted herein.

Referring to FIGS. 45A and 45B, the sidewall of the end of the channel connecting pattern 375 may be symmetrical with respect to or about (e.g., in the first direction) the imaginary line S passing through a central portion of or bisecting the channel connecting pattern 375. For example, a distance in the third direction from one of the channels 260 to an upper portion of the sidewall of the end of the channel connecting pattern 375 may be substantially the same as a distance in the third direction from the one of the channels 260 to a lower portion of the sidewall of the end of the channel connecting pattern 375, which may be the first distance D1.

In an implementation, a distance from one channel 260 to the second portion P2 of the first etch stop pattern 390 may be substantially the same as a distance from the channel 260 to the third portion P3 of the first etch stop pattern 390.

Figure 46:
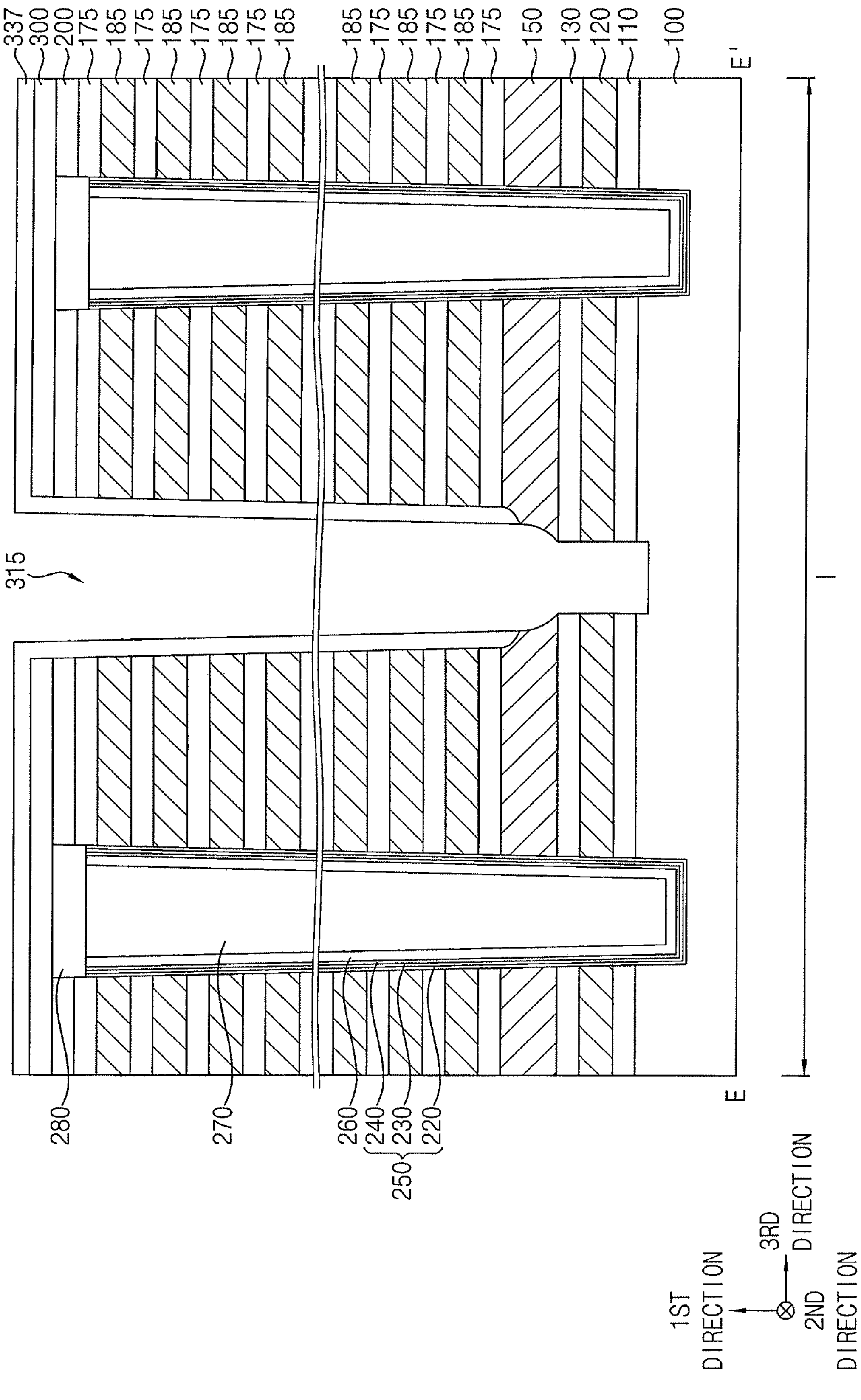
FIGS. 46 to 48 illustrate cross-sectional views of stages in a method of manufacturing a vertical memory device in accordance with example embodiments.
Figure 47:
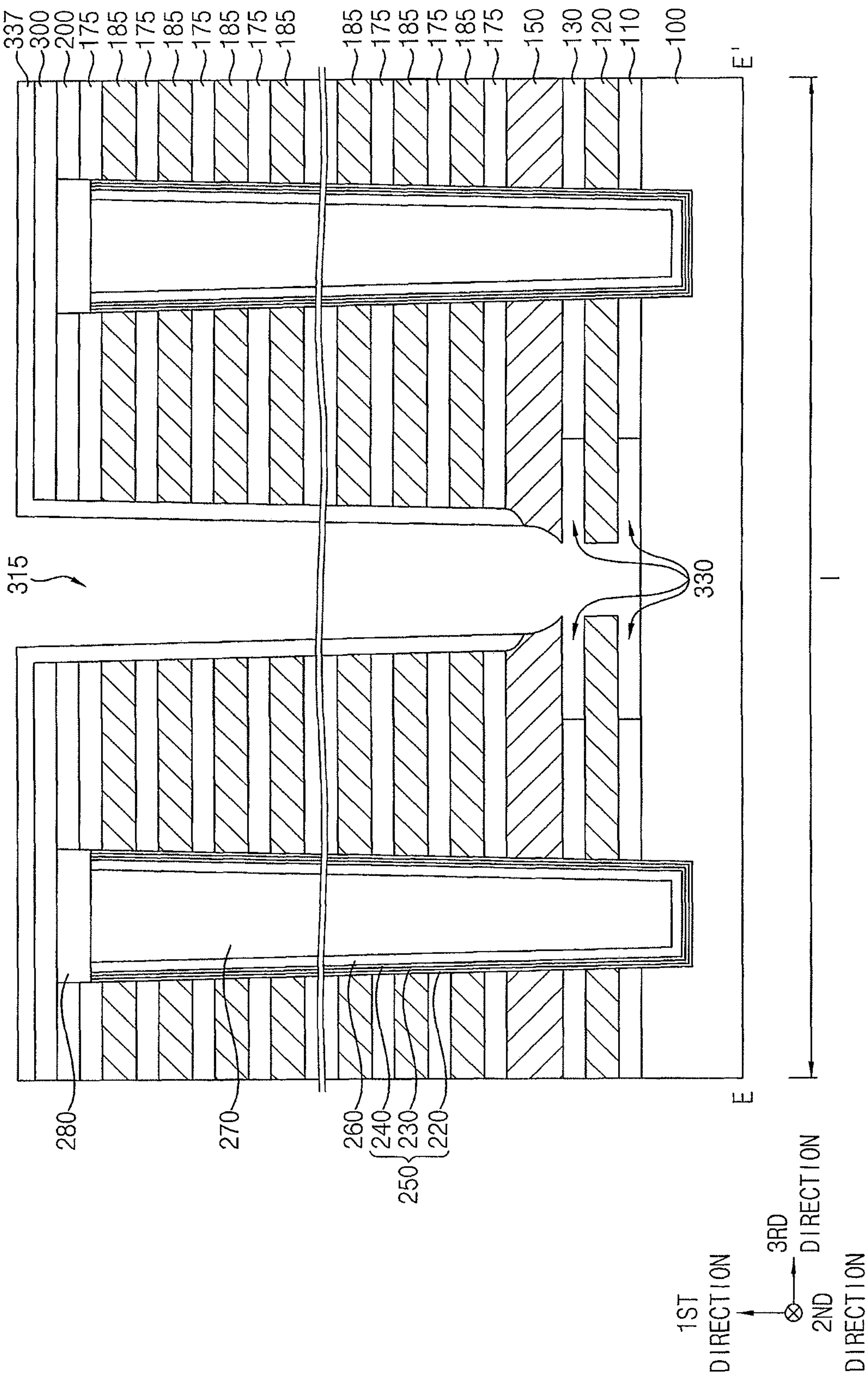
Figure 48:
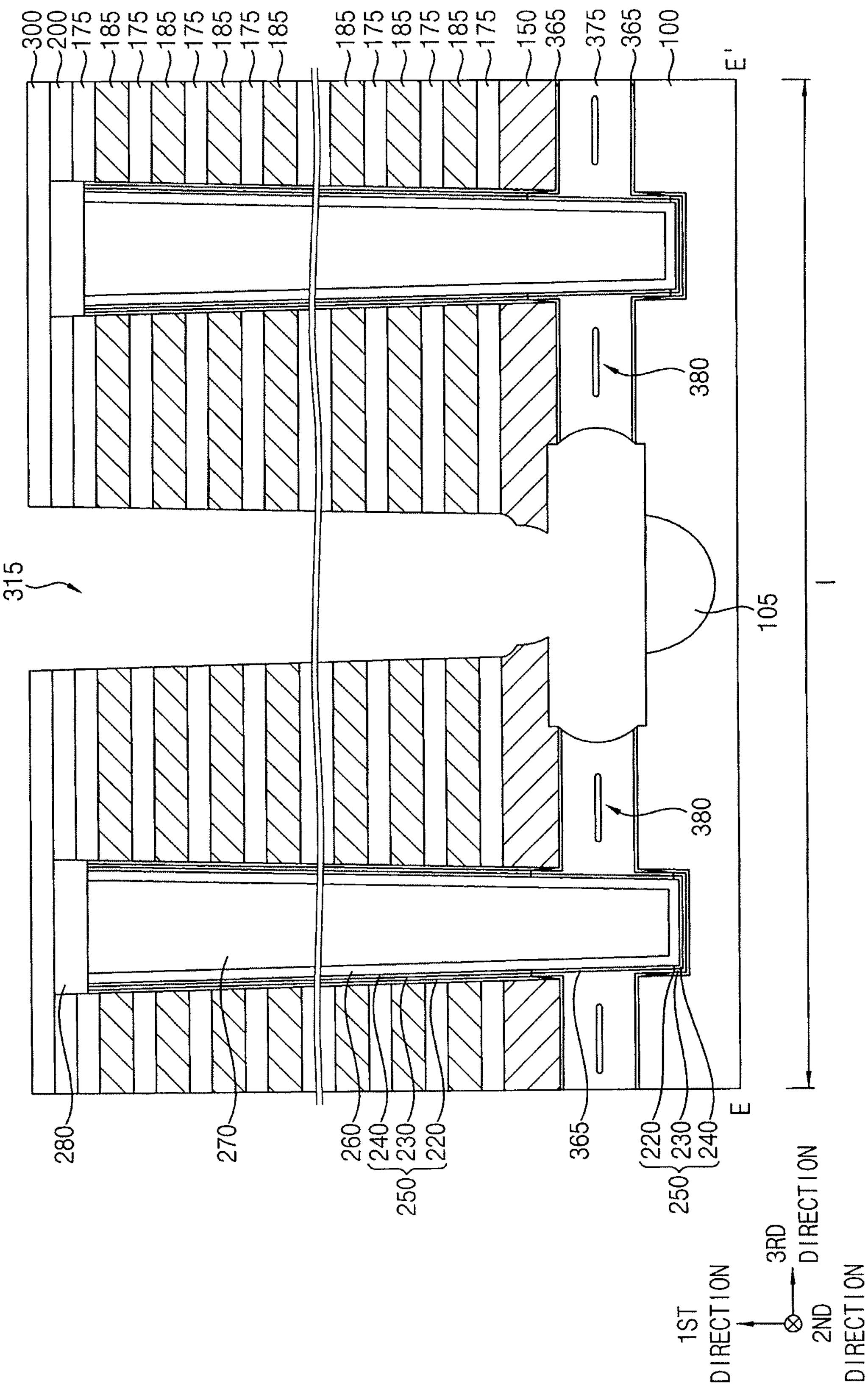

FIGS. 46 to 48 illustrate cross-sectional views of stages in a method of manufacturing a vertical memory device in accordance with example embodiments. This method may include processes substantially the same as or similar to those illustrated with reference to FIGS. 8 to 44 and FIGS. 1 to 7, and repeated descriptions thereof may be omitted herein.

Referring to FIG. 46, processes substantially the same as or similar to those illustrated with reference to FIGS. 8 to 24 may be performed.

According to the present embodiment, the ninth opening 315 may further extend through the first sacrificial layer 110 so that an upper surface of the substrate 100 is exposed.

Referring to FIG. 47, processes substantially the same as or similar to those illustrated with reference to FIG. 25 may be performed.

For example, portions of the first and third sacrificial layers 110 and 130 adjacent to the ninth opening 315 may be removed to form the first gaps 330, and upper and lower ones of the first gaps 330 may have the same width in the third direction.

Referring to FIG. 48, processes substantially the same as or similar to those illustrated with reference to FIGS. 26 to 34 may be performed.

For example, the sidewall of the end of the channel connecting pattern 375 may be symmetrical with reference to an imaginary line passing by a central portion of the channel connecting pattern 375.

Referring to FIGS. 45A and 45B again, processes substantially the same as or similar to those illustrated with reference to FIGS. 35 to 44 and FIGS. 1 to 7 may be performed so as to complete the fabrication of the vertical memory device.

Figure 49A:
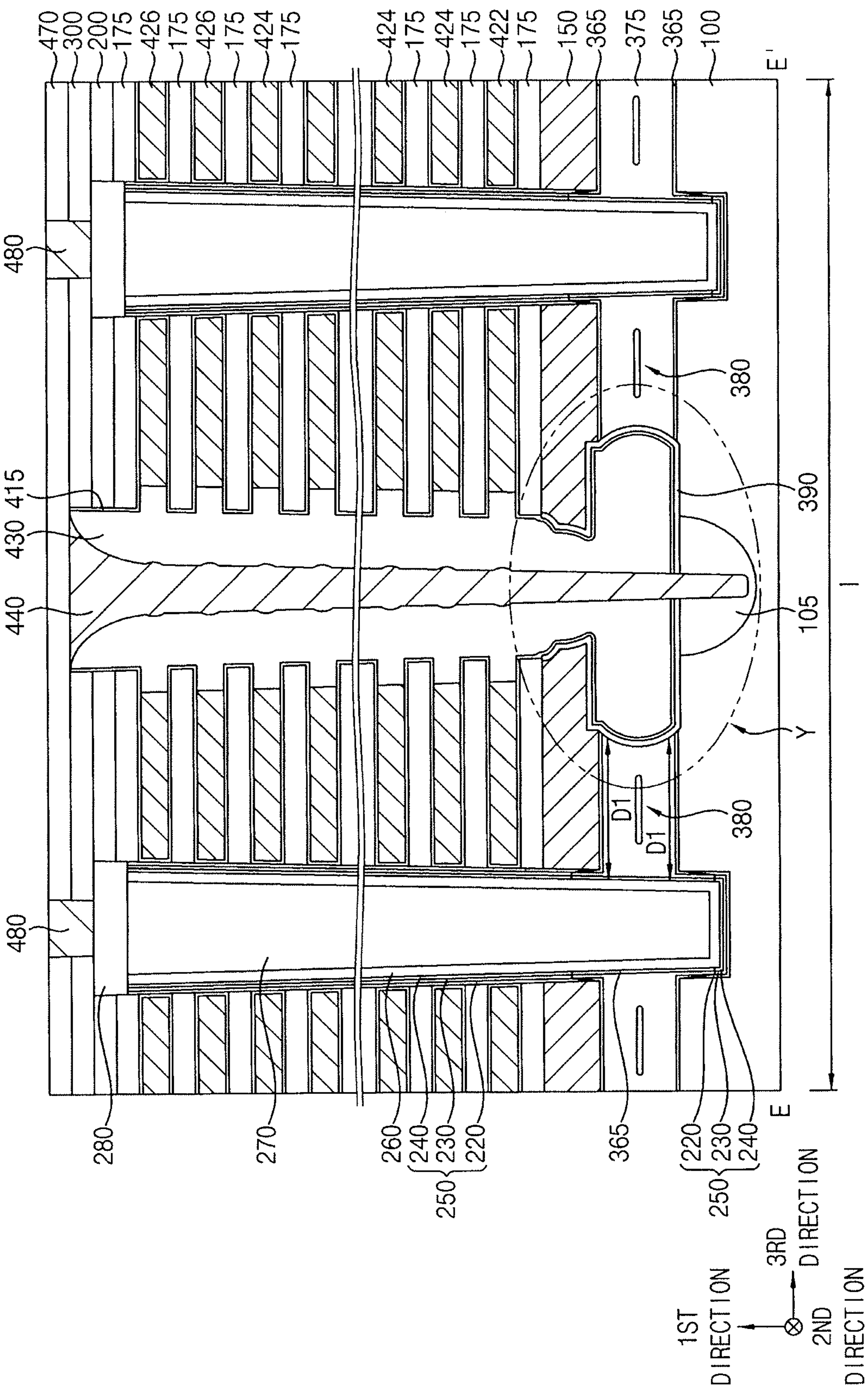
FIGS. 49A and 49B illustrate cross-sectional views of a vertical memory device in accordance with example embodiments.
Figure 49B:
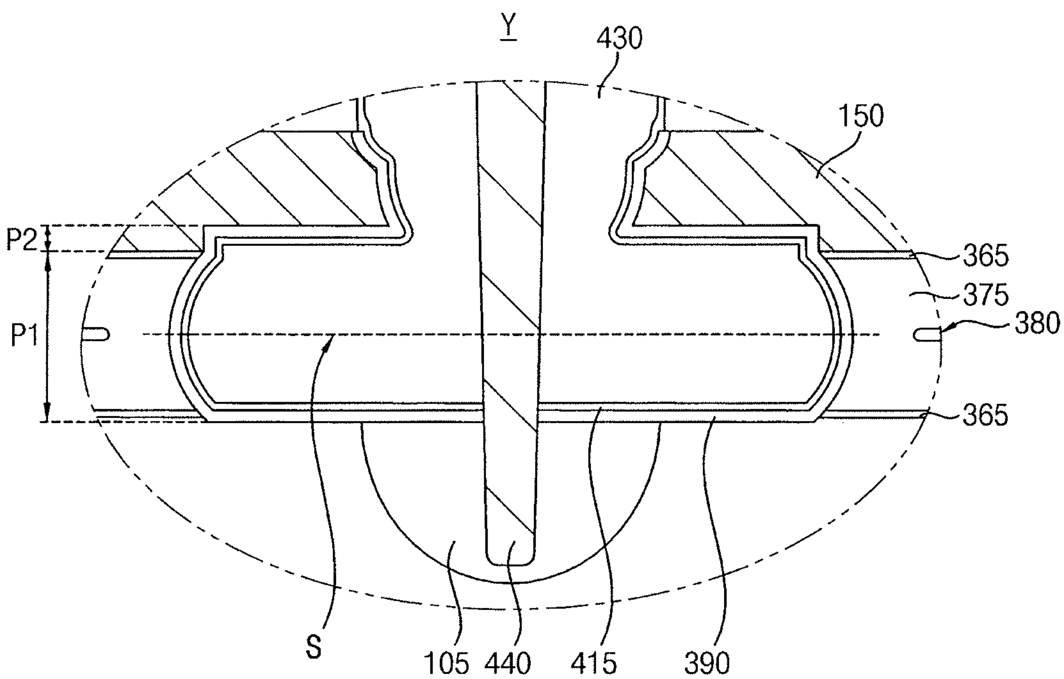

FIGS. 49A and 49B illustrate cross-sectional views of a vertical memory device in accordance with example embodiments. FIG. 49B illustrates an enlarged cross-sectional view of a region Y of FIG. 49A. This vertical memory device may be substantially the same as or similar to that of FIGS. 1 to 7, except for the shape of the channel connecting pattern and/or the second spacer. Thus, like reference numerals refer to like elements, and repeated descriptions thereof may be omitted.

Referring to FIGS. 49A and 49B, the sidewall of the end of the channel connecting pattern 375 may be symmetrical with reference to or about (e.g., in the first direction) an imaginary line passing by a central portion of, e.g., bisecting) the channel connecting pattern. For example, a distance in the third direction from one of the channels 260 to an upper portion of the sidewall of the end of the channel connecting pattern 375 may be substantially the same as a distance in the third direction from the one of the channels 260 to a lower portion of the sidewall of the end of the channel connecting pattern 375, which may be the first distance D1.

In an implementation, unlike that of FIGS. 1 to 7, the first etch stop pattern 390 may include the first and second portions P1 and P2, and may not include the third portion P3.

Figure 50:
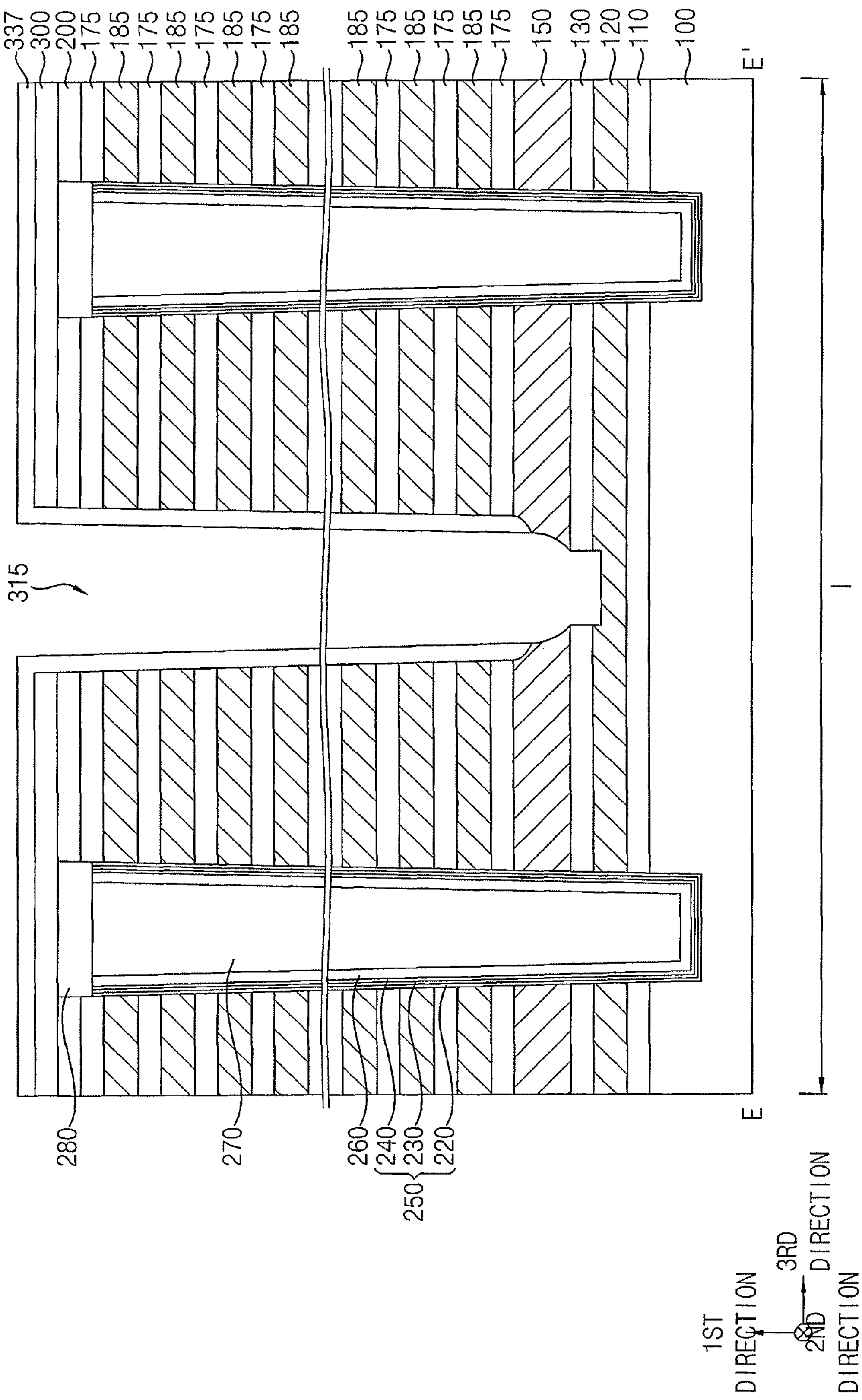
FIGS. 50 to 52 illustrate cross-sectional views of stages in a method of manufacturing a vertical memory device in accordance with example embodiments.
Figure 51:
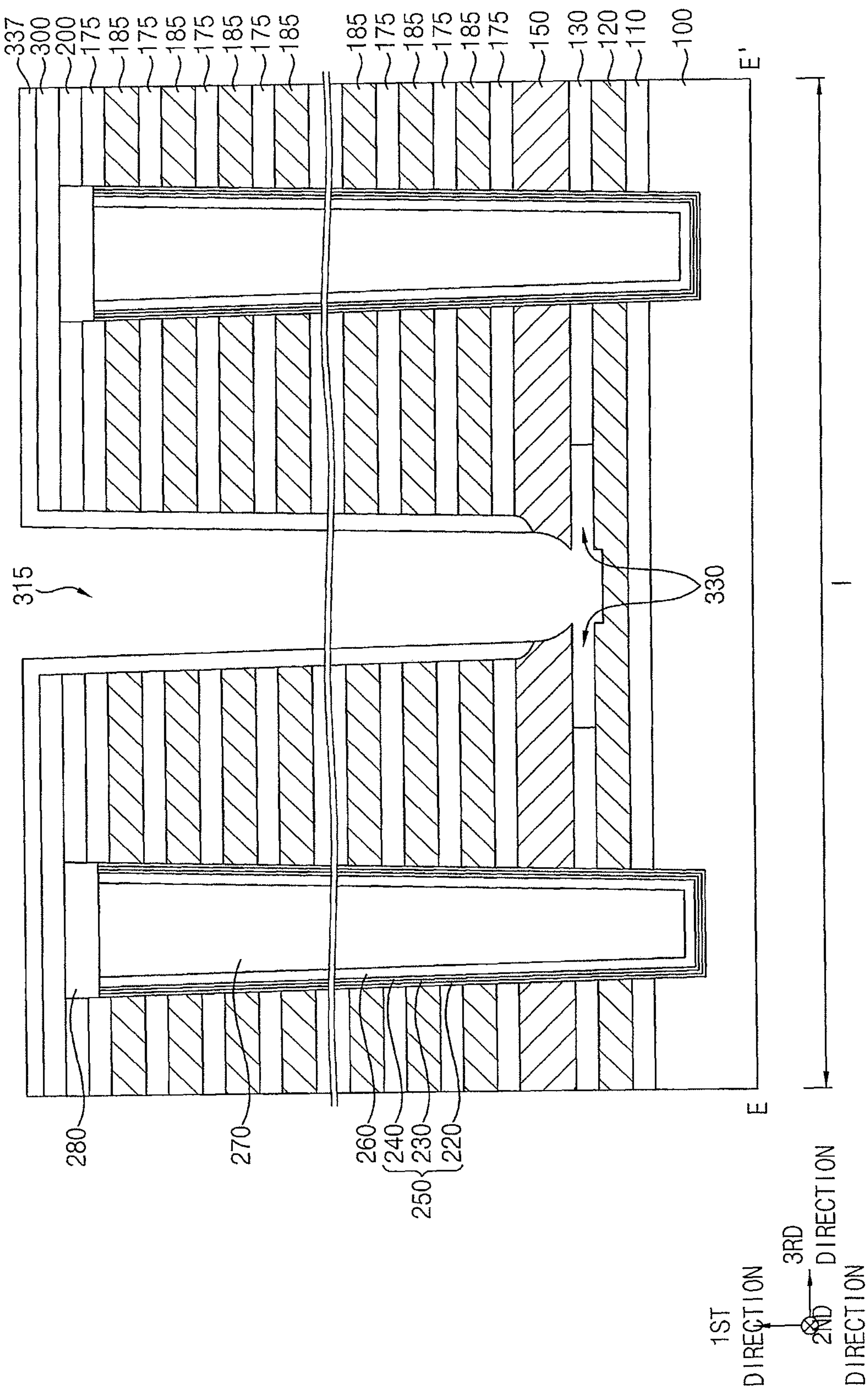
Figure 52:
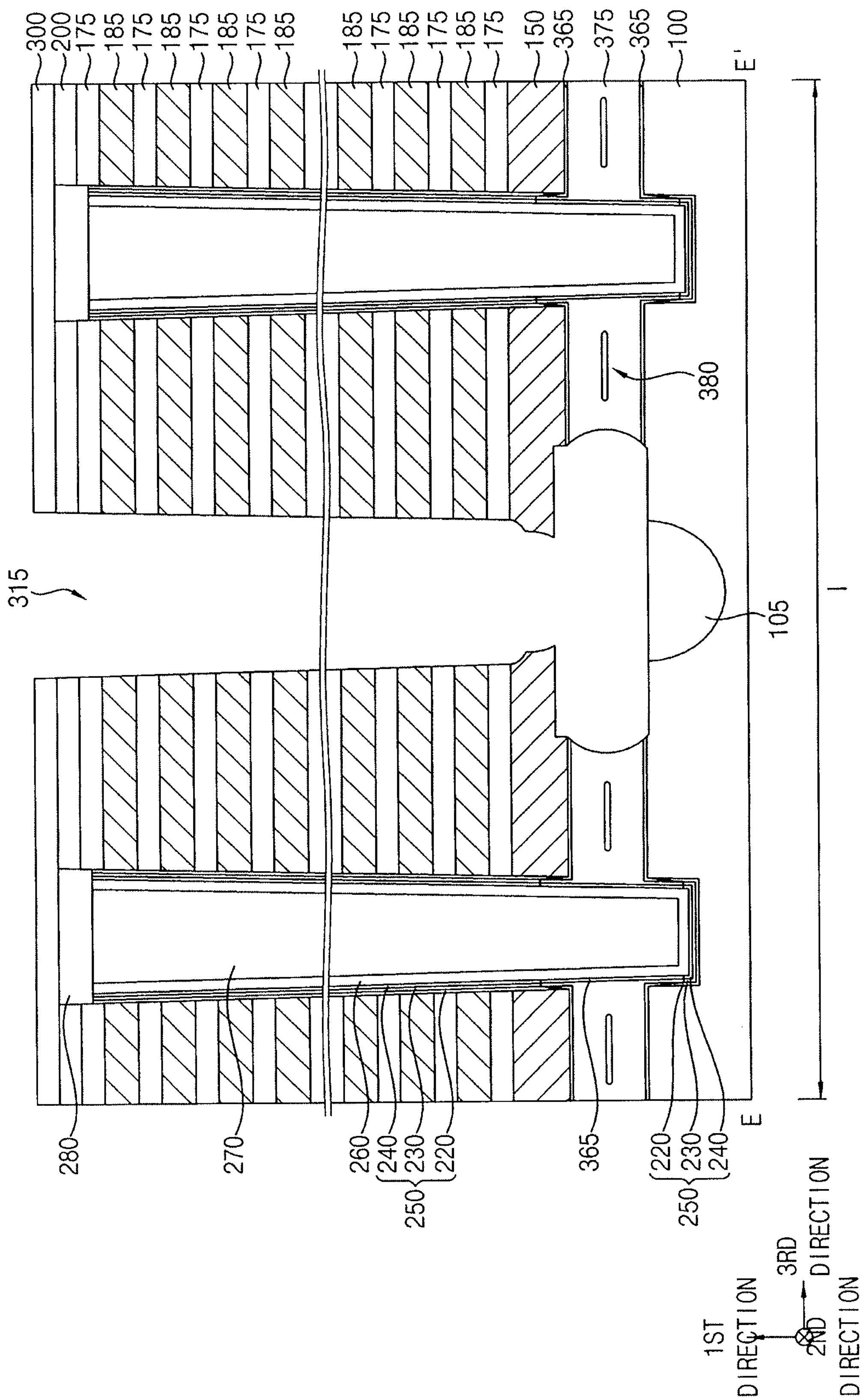

FIGS. 50 to 52 illustrate cross-sectional views of stages in a method of manufacturing a vertical memory device in accordance with example embodiments. This method may include processes substantially the same as or similar to those illustrated with reference to FIGS. 8 to 44 and FIGS. 1 to 7, and thus repeated descriptions thereof may be omitted.

Referring to FIG. 50, processes substantially the same as or similar to those illustrated with reference to FIGS. 8 to 24 may be performed.

In an implementation, the ninth opening 315 may not expose the first sacrificial layer 110, and may expose an upper surface of the second sacrificial layer 120.

Referring to FIG. 51, processes substantially the same as or similar to those illustrated with reference to FIG. 25 may be performed.

In an implementation, only a portion of the first sacrificial layer 110 adjacent the ninth opening 315 may be removed to form the first gaps 330.

Referring to FIG. 52, processes substantially the same as or similar to those illustrated with reference to FIGS. 26 to 34 may be performed.

In an implementation, the sidewall of the end of the channel connecting pattern 375 may be symmetrical with reference to an imaginary line passing by a central portion of the channel connecting pattern 375. In an implementation, a lower portion of the ninth opening 315 adjacent the channel connecting pattern 375 may not be symmetrical with reference to the imaginary line.

Referring to FIGS. 49A and 49B again, processes substantially the same as or similar to those illustrated with reference to FIGS. 35 to 44 and FIGS. 1 to 7 may be performed so as to complete the fabrication of the vertical memory device.

Figure 53A:
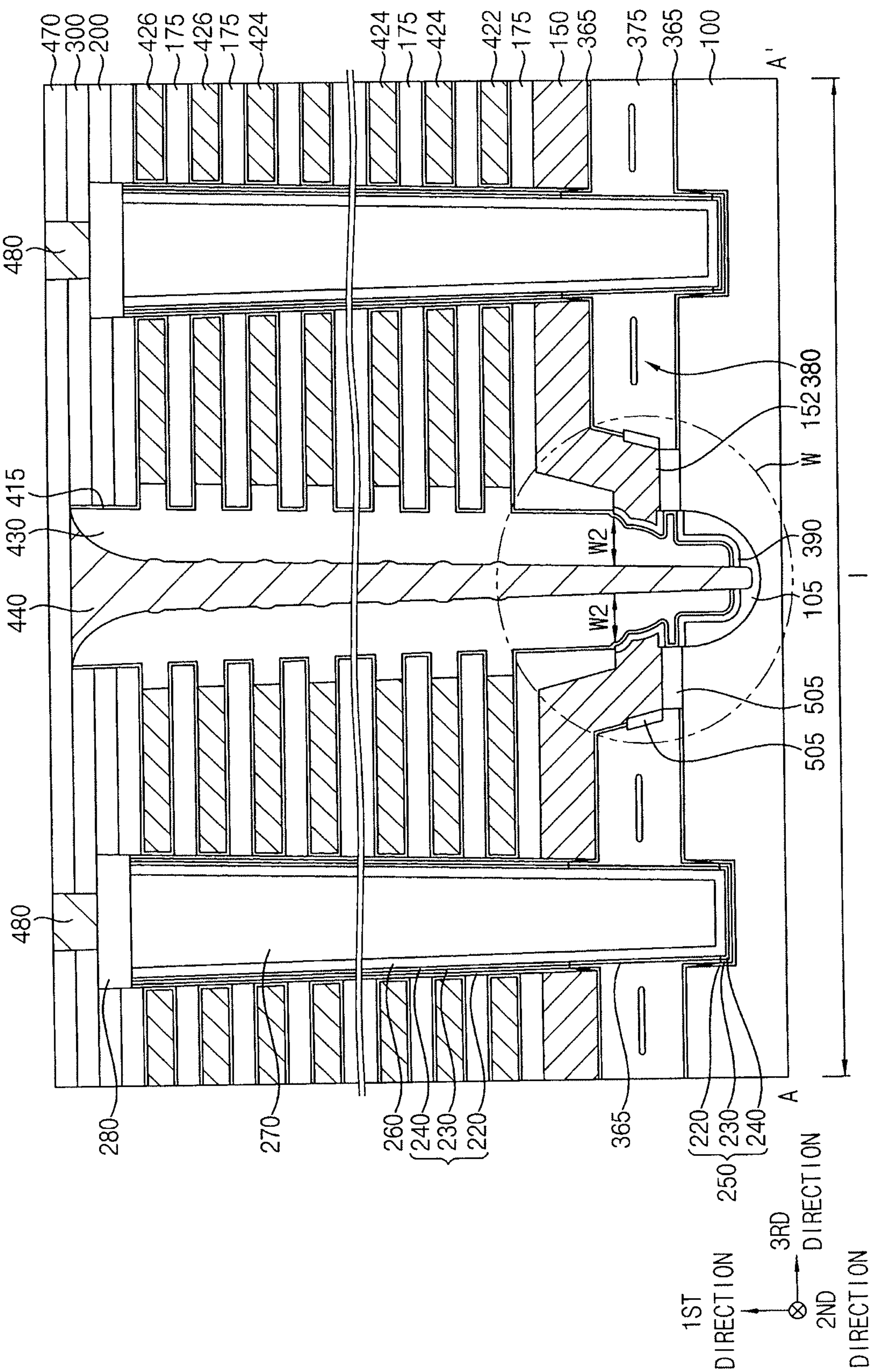
FIGS. 53A, 53B, and 54 illustrate cross-sectional views of a vertical memory device in accordance with example embodiments.
Figure 53B:
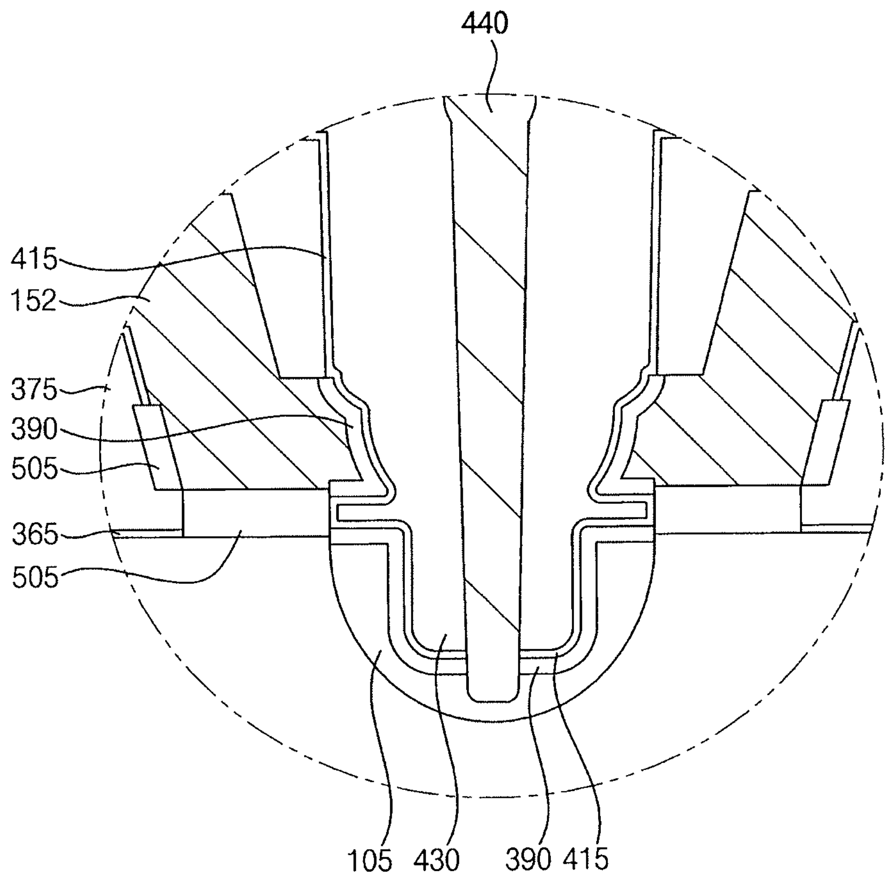
Figure 54:
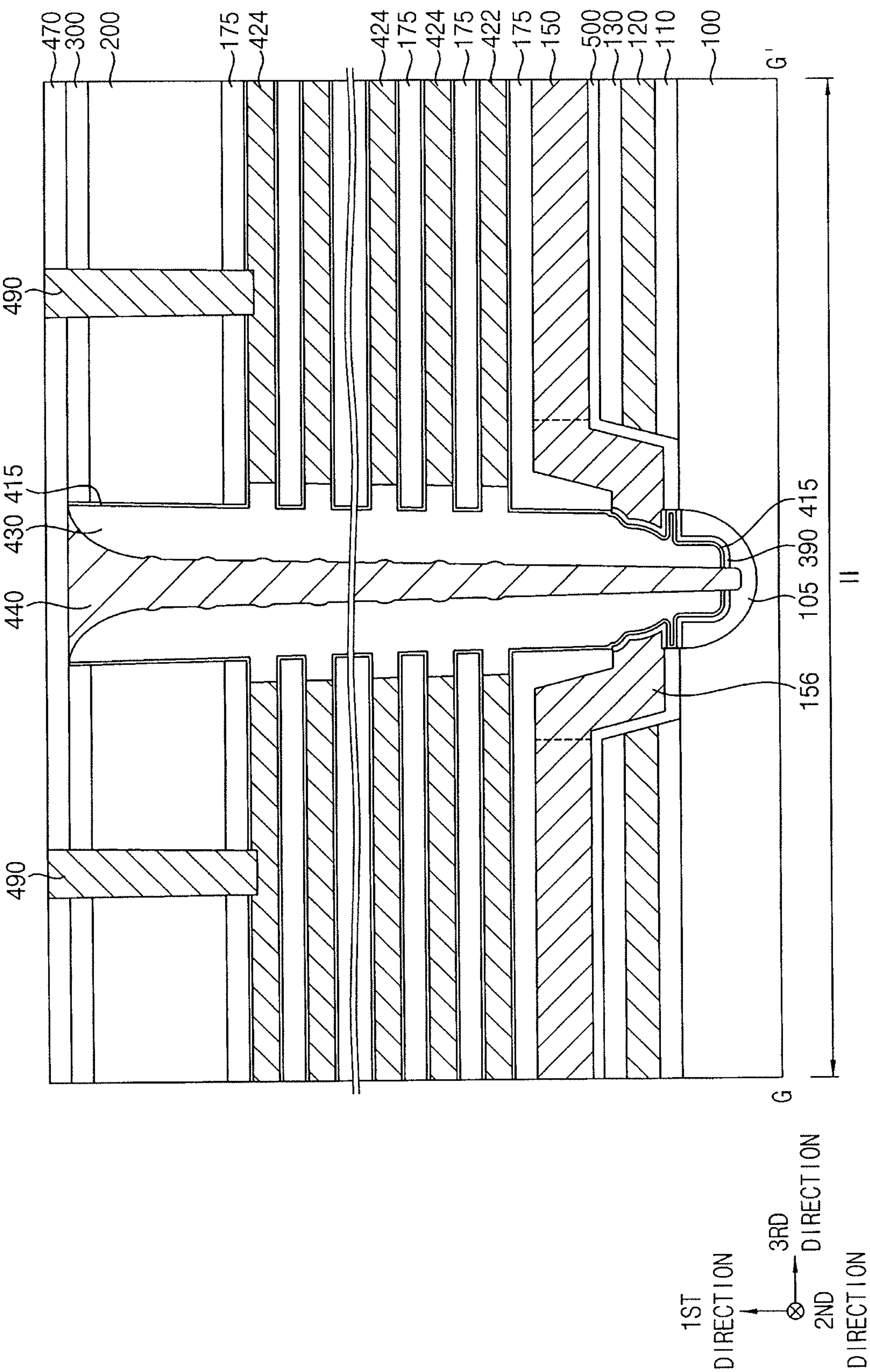

FIGS. 53A, 53B, and 54 illustrate cross-sectional views of a vertical memory device in accordance with example embodiments. FIGS. 53A and 53B illustrate cross-sectional views taken along lines A-A' of corresponding plan views, and FIG. 54 illustrates a cross-sectional view taken along a line G-G' of a corresponding plan view. FIG. 53B illustrates an enlarged cross-sectional view of a region W of FIG. 53A.

This vertical memory device may be substantially the same as or similar to that of FIGS. 1 to 7, except for a second etch stop layer and a second etch stop pattern. Thus, like reference numerals refer to like elements, and repeated descriptions thereof may be omitted.

Referring to FIGS. 53A, 53B, and 54, the vertical memory device may further include a second etch stop pattern 505 between an upper surface of the substrate 100 and the first support pattern 152, and on a portion of a sidewall of the first support pattern 152 on the first region I of the substrate 100. A portion of the second etch stop pattern 505 between the upper surface of the substrate 100 and the first support pattern 152 may have a sidewall facing the first CSL 440, which may contact the second blocking pattern 415, and may further contact the first etch stop pattern 390 on and beneath the second blocking pattern 415. For example, the first etch stop pattern 390 may be divided into two pieces at an area adjacent the sidewall of the portion of the second etch stop pattern 505.

In an implementation, the vertical memory device may further include a second etch stop layer 500 between an upper surface of the substrate 100 and each of the second and third support patterns 154 and 156, and between the sacrificial layer structure and the support layer 150 on the second region II of the substrate 100. A portion of the second etch stop layer 500 between the upper surface of the substrate 100 and each of the second and third support patterns 154 and 156 may have a sidewall facing the first CSL 440, which may contact the second blocking pattern 415, and may further contact the first etch stop pattern 390 on and beneath the second blocking pattern 415. For example, the first etch stop pattern 390 may be divided into two pieces at an area adjacent the sidewall of the portion of the second etch stop layer 500.

The second etch stop layer 500 and the second etch stop pattern 505 may include a material having an etching selectivity with respect to the support layer 150, e.g., an oxide such as silicon oxide.

Figure 55:
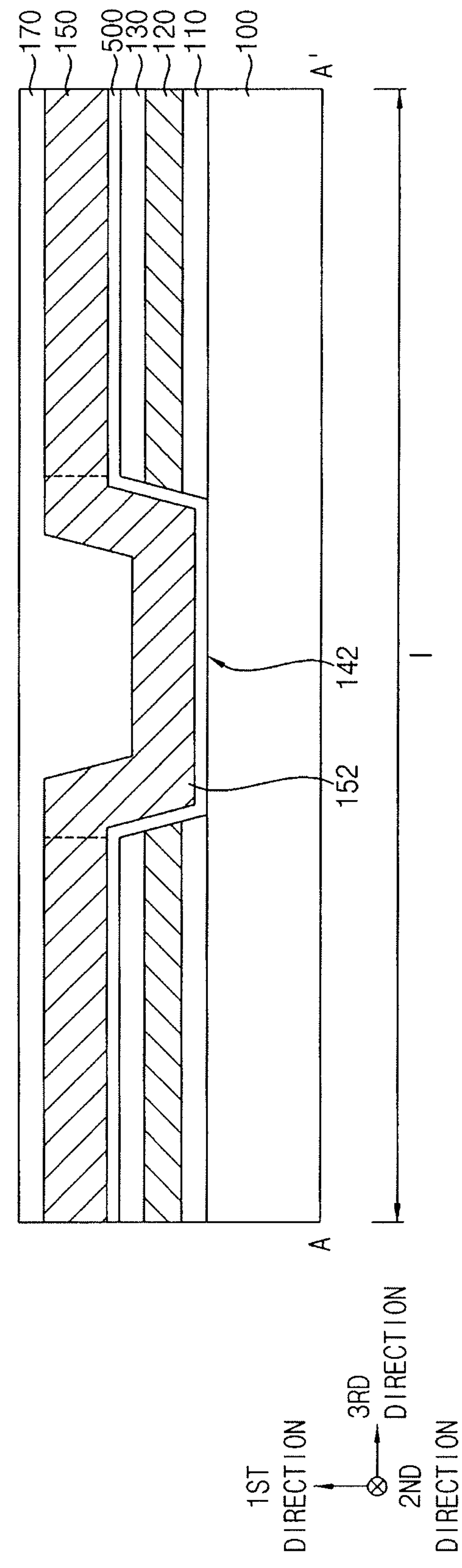
FIGS. 55 to 61 illustrate cross-sectional views of stages in a method of manufacturing a vertical memory device in accordance with example embodiments.
Figure 56:
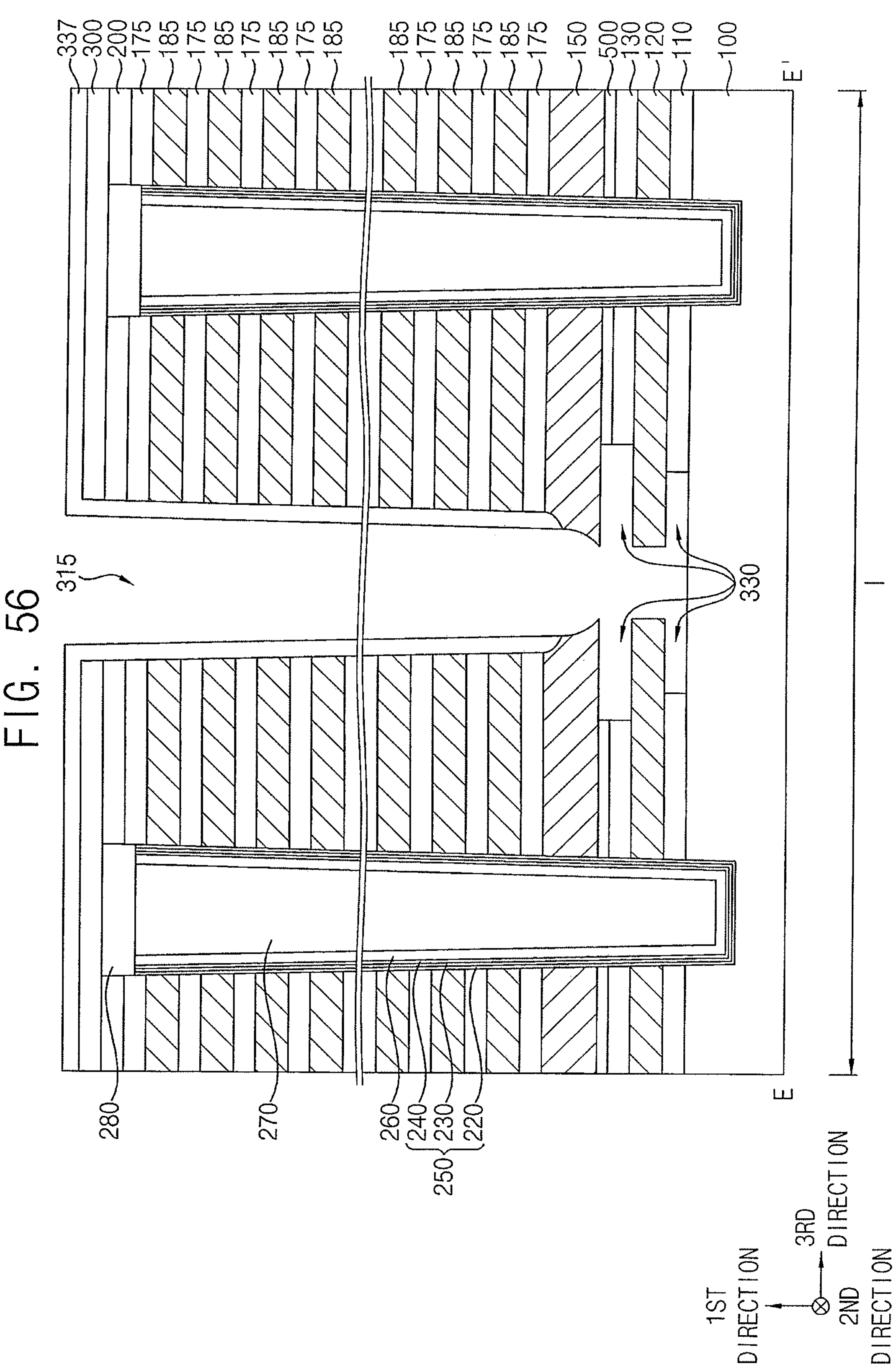
Figure 57:
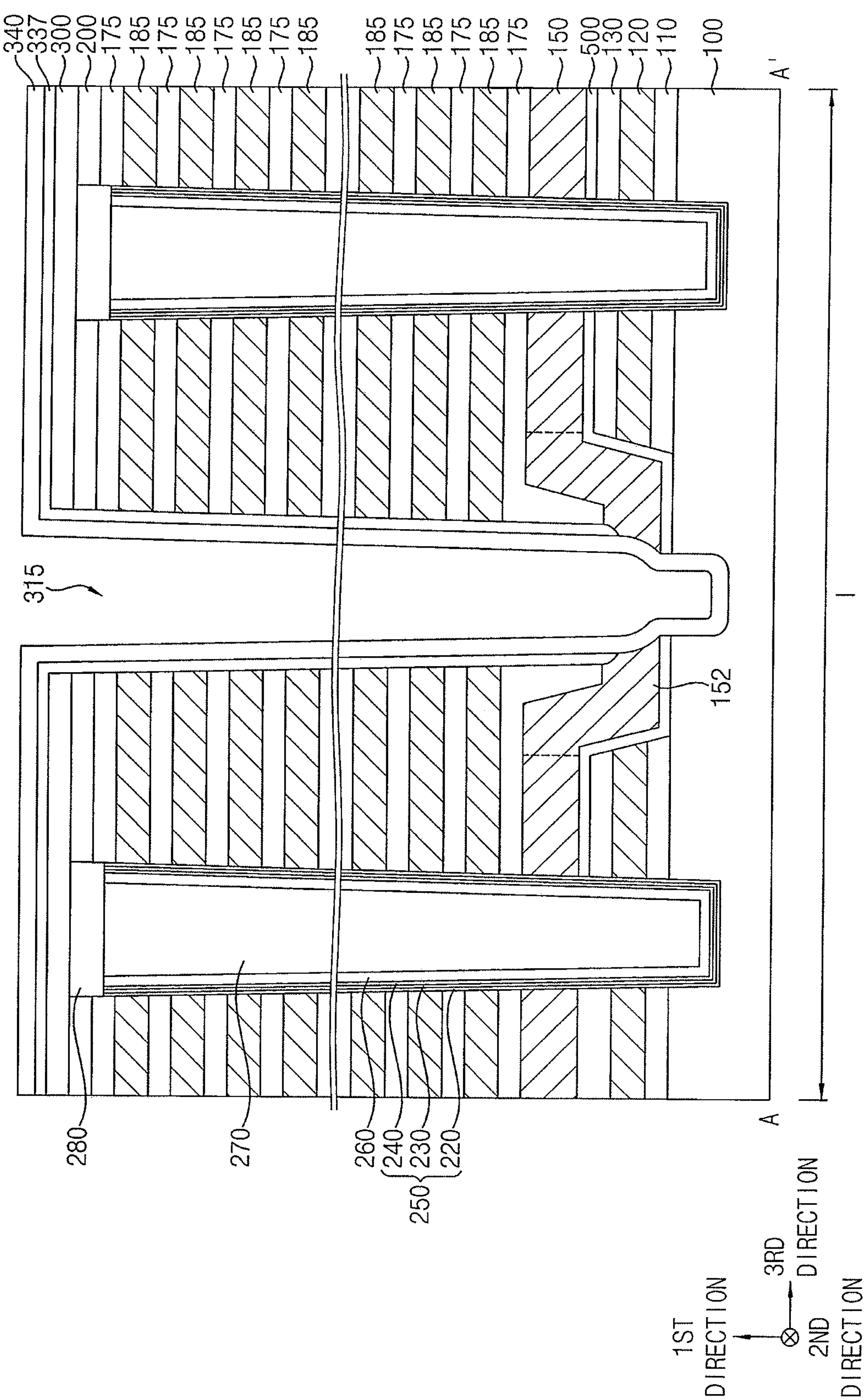
Figure 58:
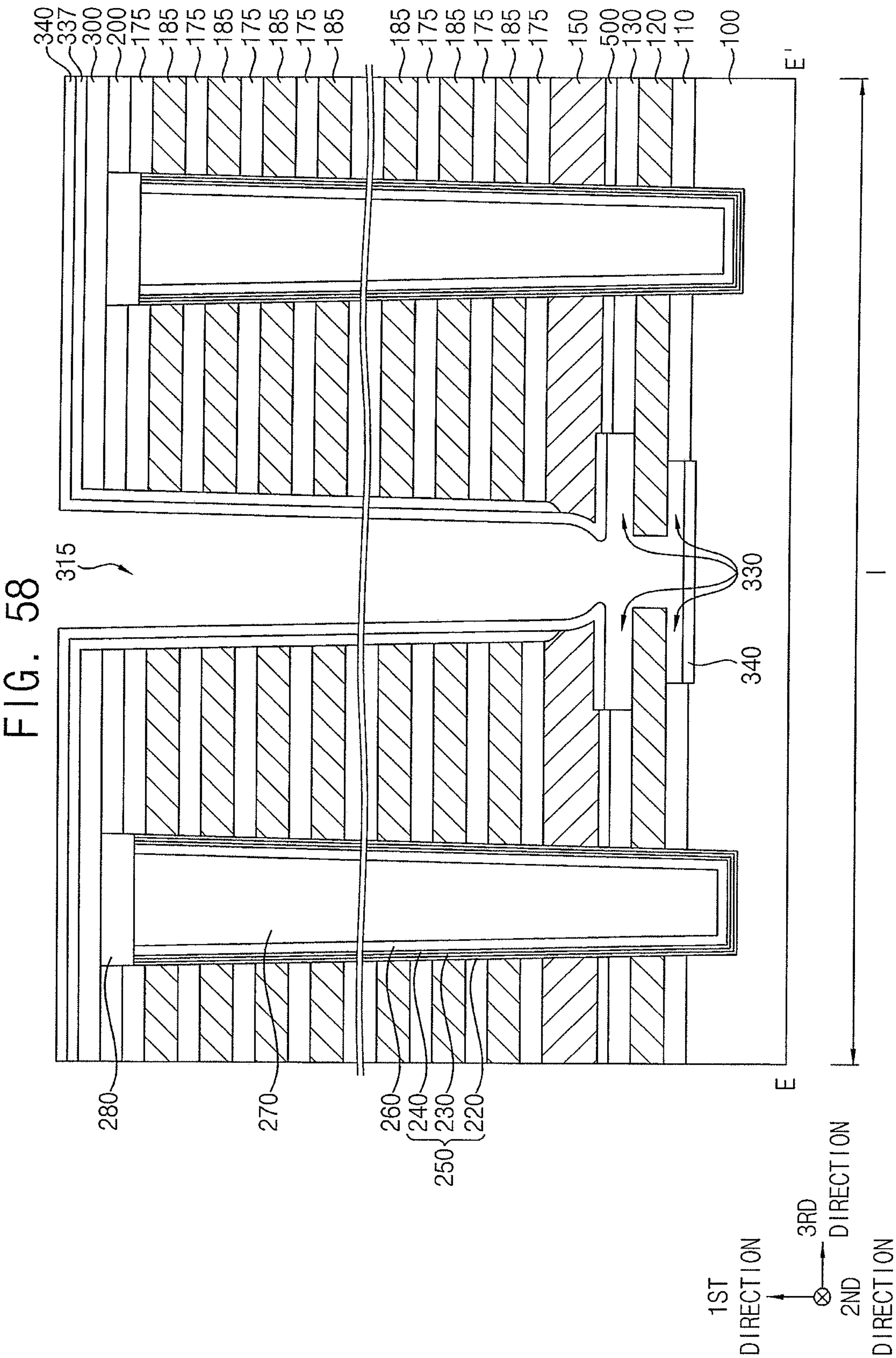
Figure 59:
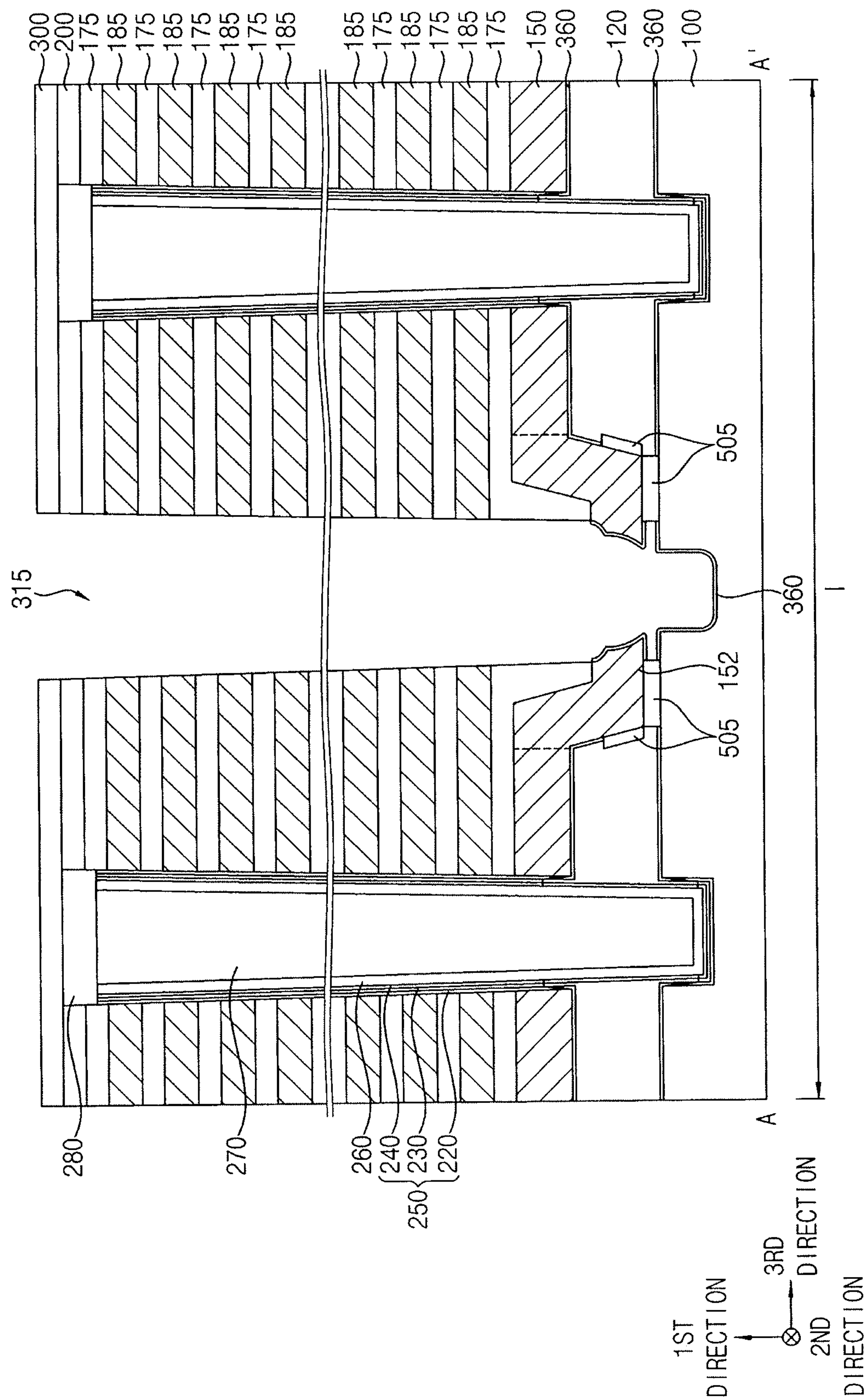
Figure 60:
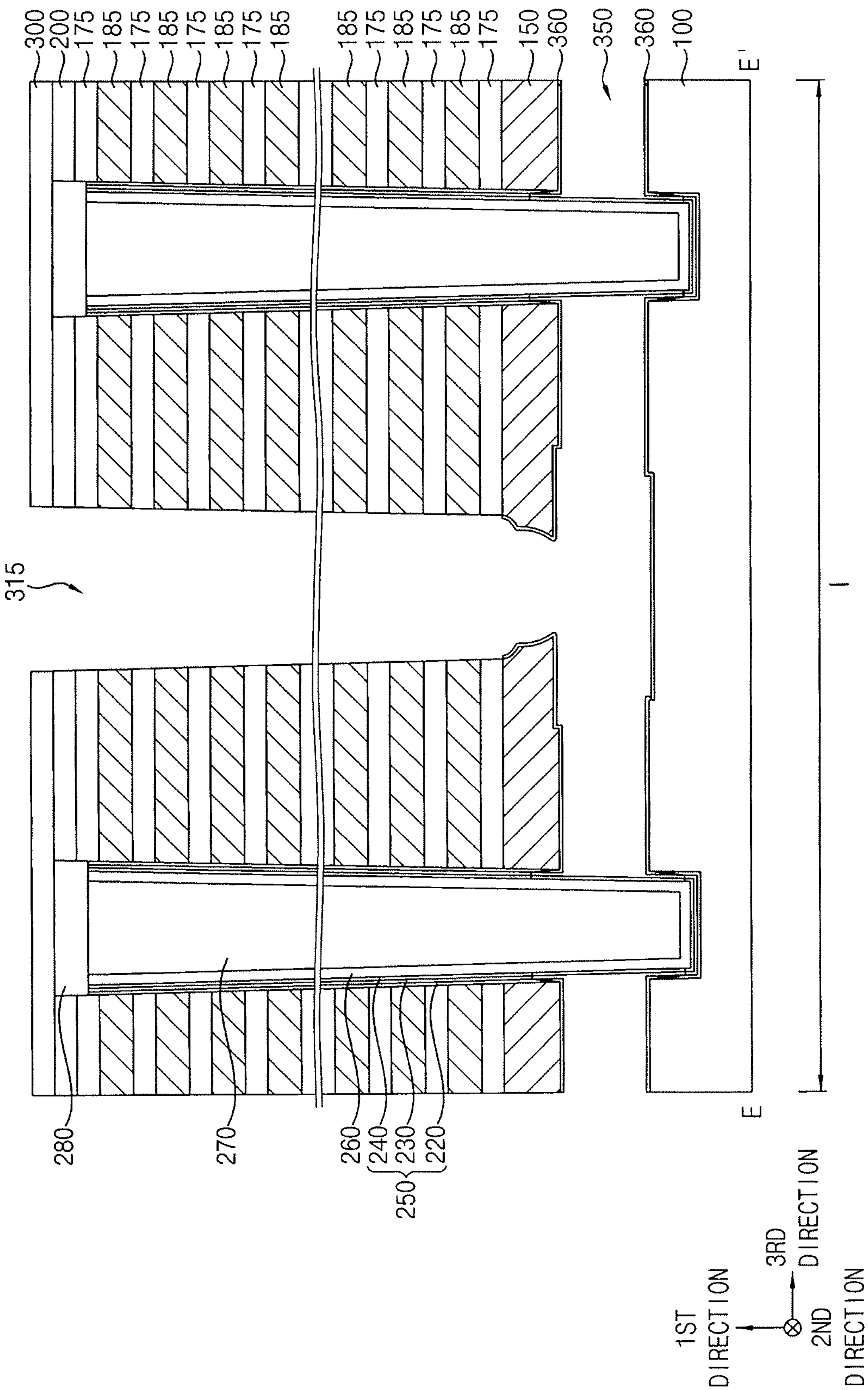

FIGS. 55 to 61 illustrate cross-sectional views of stages in a method of manufacturing a vertical memory device in accordance with example embodiments. FIGS. 55, 57, 59 and 61 illustrate cross-sectional views taken along lines A-A' of corresponding plan views, and FIGS. 56, 58 and 60 illustrate cross-sectional views taken along lines E-E' of corresponding plan views.

Referring to FIG. 55, processes substantially the same as or similar to those illustrated with reference to FIGS. 8 and 9 may be performed.

In an implementation, after partially removing the first to third sacrificial layers 110, 120 and 130 to form the first to third openings 142, 144 and 146, respectively, exposing upper surfaces of the substrate 100, a second etch stop layer 500 and the support layer 150 may be sequentially formed on the substrate 100 and the third sacrificial layer 130 to at least partially fill each of the first to third openings 142, 144 and 146.

The second etch stop layer 500 may include a material having an etching selectivity with respect to the support layer 150, e.g., an oxide such as silicon oxide. In an implementation, the second etch stop layer 500 may be partially merged with the third sacrificial layer 130 and/or the first sacrificial layer 110.

The insulation layer 170 may be formed on the support layer 150 to fill the first recesses, and an upper portion thereof may be planarized.

Referring to FIG. 56, processes substantially the same as or similar to those illustrated with reference to FIGS. 10 to 25 may be performed.

In an implementation, only the first and third sacrificial layers 110 and 130 and the second etch stop layer 500 exposed by the ninth opening 315 may be removed to form the first gaps 330.

Referring to FIGS. 57 and 58, processes substantially the same as or similar to those illustrated with reference to FIGS. 26 and 27 may be performed.

In an implementation, the upper portion of the substrate 100, the upper portions of the first to third support patterns 152, 154, and 156 and the lower portion of the support layer 150 exposed by the ninth opening 315 and the first gaps 330, and a surface of the first spacer 337 may be oxidized to be converted into the fifth sacrificial pattern 340.

Referring to FIGS. 59 and 60, processes substantially the same as or similar to those illustrated with reference to FIGS. 28 and 29 may be performed.

In an implementation, the fifth sacrificial pattern 340 and the first and third sacrificial layers 110 and 130 may be removed, and the second sacrificial layer 120 may be removed to form the second gap 350.

In example embodiments, the fifth sacrificial pattern 340 and the first to third sacrificial layers 110, 120 and 130 may be removed by a wet etching process using, e.g., hydrofluoric acid (HF), and the second etch stop layer 500 may be partially removed and partially remain.

For example, portions of the second etch stop layer 500 between the upper surface of the substrate 100 and the first support pattern 152 and between the sidewall of the second sacrificial layer 120 and the sidewall of the first support pattern 152 opposite thereto may remain on the first region I of the substrate 100, which may be referred to as a second etch stop pattern 505 hereinafter. The second etch stop pattern 505 may remain at an area that is relatively far from or distal to the ninth opening 315 between the upper surface of the substrate 100 and the first support pattern 152, and may remain on a portion of the sidewall of the first support pattern 152.

Referring to FIG. 54 again, a portion of the second etch stop layer 500 adjacent the ninth opening 315 between the upper surface of the substrate 100 and the third support pattern 156 may be removed and other portions thereof may remain on the second region II of the substrate 100.

The second sacrificial layer 120 may be removed by a wet etching process using, e.g., phosphoric acid ($H_3PO_4$), and the support layer 150 or support patterns 152, 154, and 156 including doped polysilicon may be partially removed. In an implementation, portions of the support layer 150 and the support patterns 152, 154, and 156 covered by the second etch stop layer 500 or the second etch stop pattern 505 including silicon oxide may not be removed by the wet etching process.

The first spacer 337 may be removed, and the seed layer 360 may be formed on the silicon-containing layers, e.g., the upper surface of the substrate 100, the upper surfaces of the first to third support patterns 152, 154, and 156, the lower surface and the sidewall of the support layer 150, and the exposed outer sidewall of the channel 260.

Figure 61:
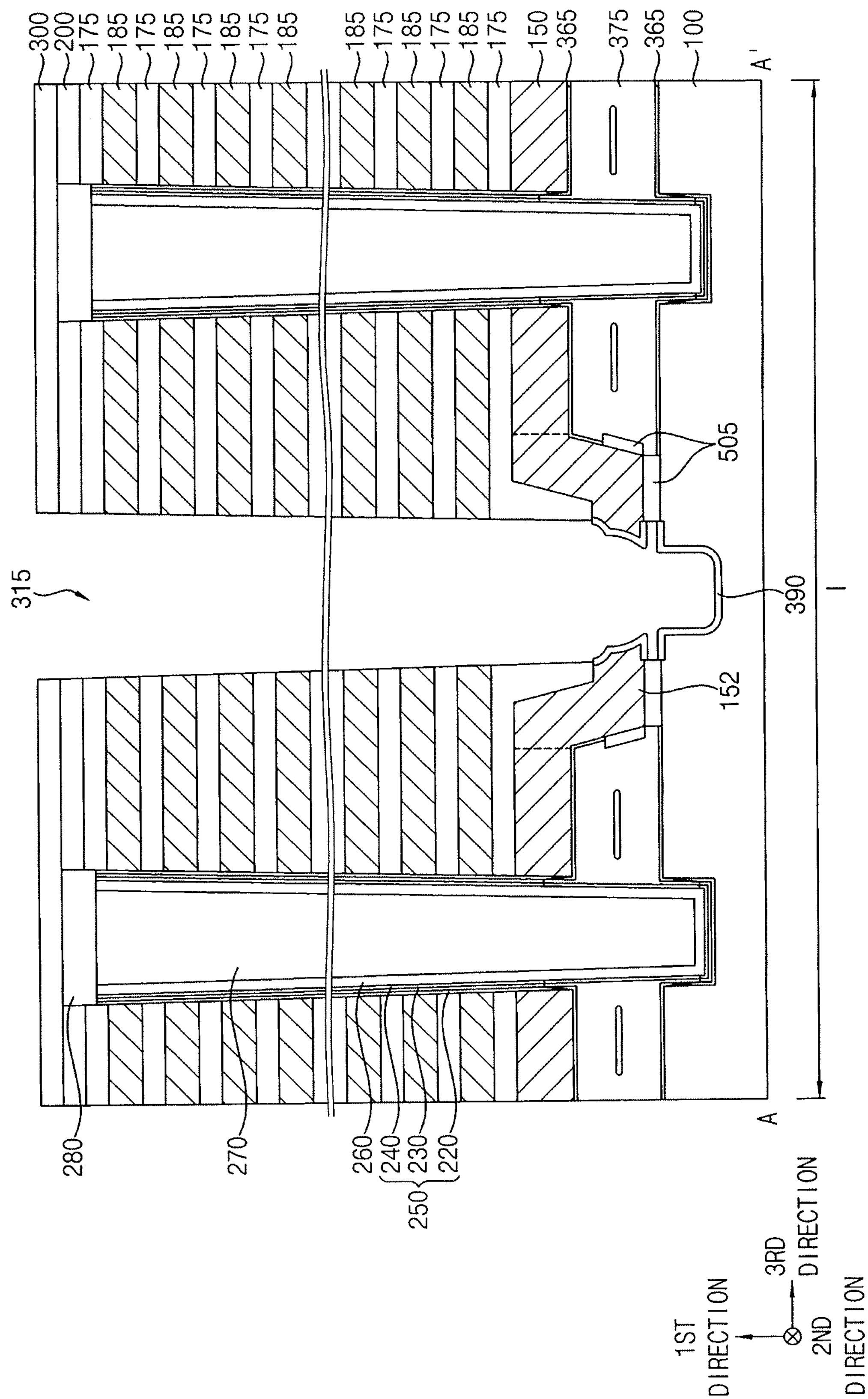

Referring to FIG. 61, processes substantially the same as or similar to those illustrated with reference to FIGS. 30 to 36 may be performed.

In an implementation, an oxidation process may be performed on the silicon-containing layers to form the first etch stop pattern 390 on the upper surface of the substrate 100, the sidewall of the channel connecting pattern 375, the sidewalls of the first to third support patterns 152, 154, and 156, and the lower surface and the sidewall of the support layer 150.

Referring to FIGS. 53 and 54 again, processes substantially the same as or similar to those illustrated with reference to FIGS. 37 to 44 and FIGS. 1 to 7 may be performed to complete the fabrication of the vertical memory device.

Figure 62A:
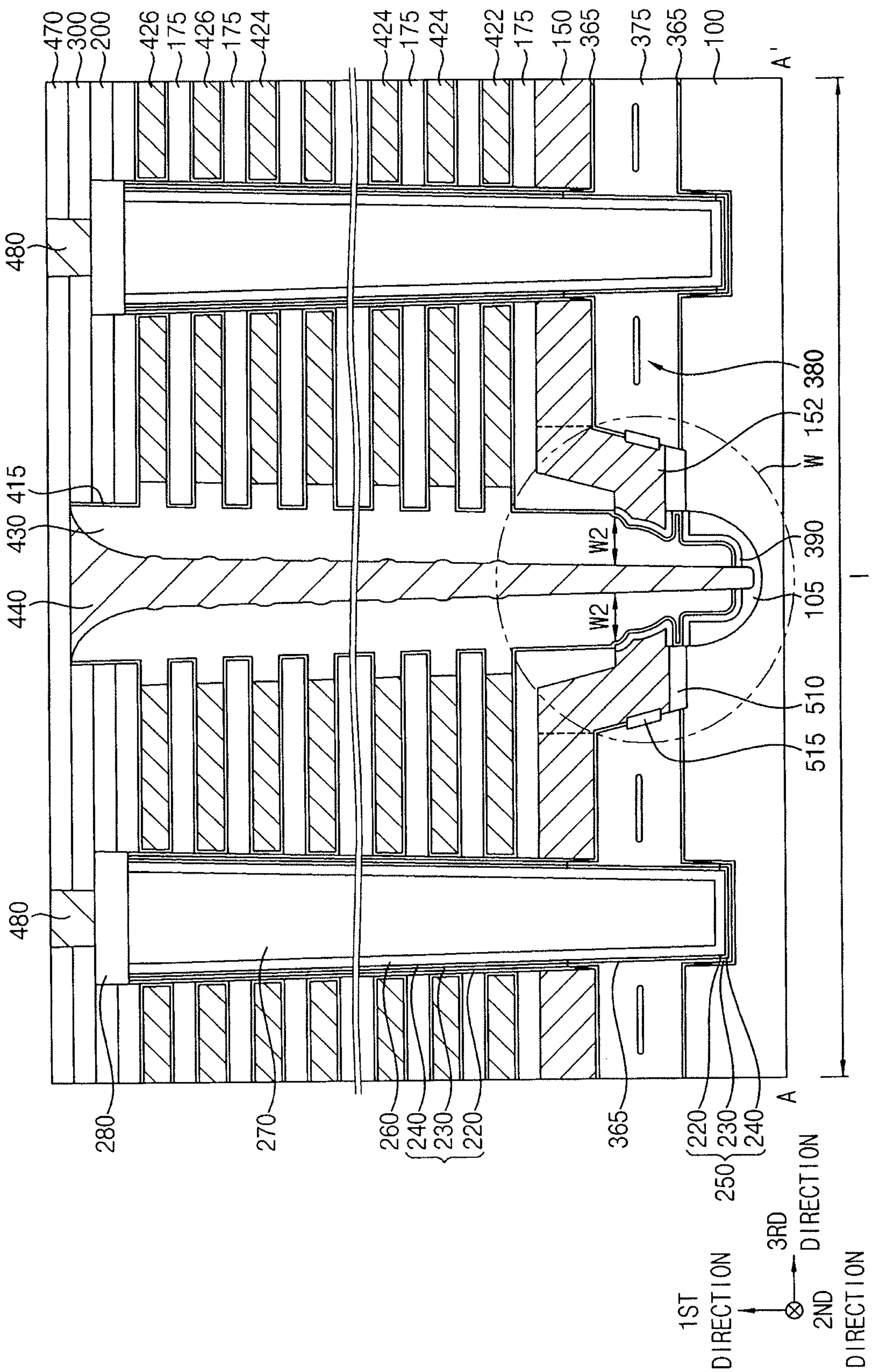
FIGS. 62A, 62B, and 63 illustrate cross-sectional views of a vertical memory device in accordance with example embodiments.
Figure 62B:
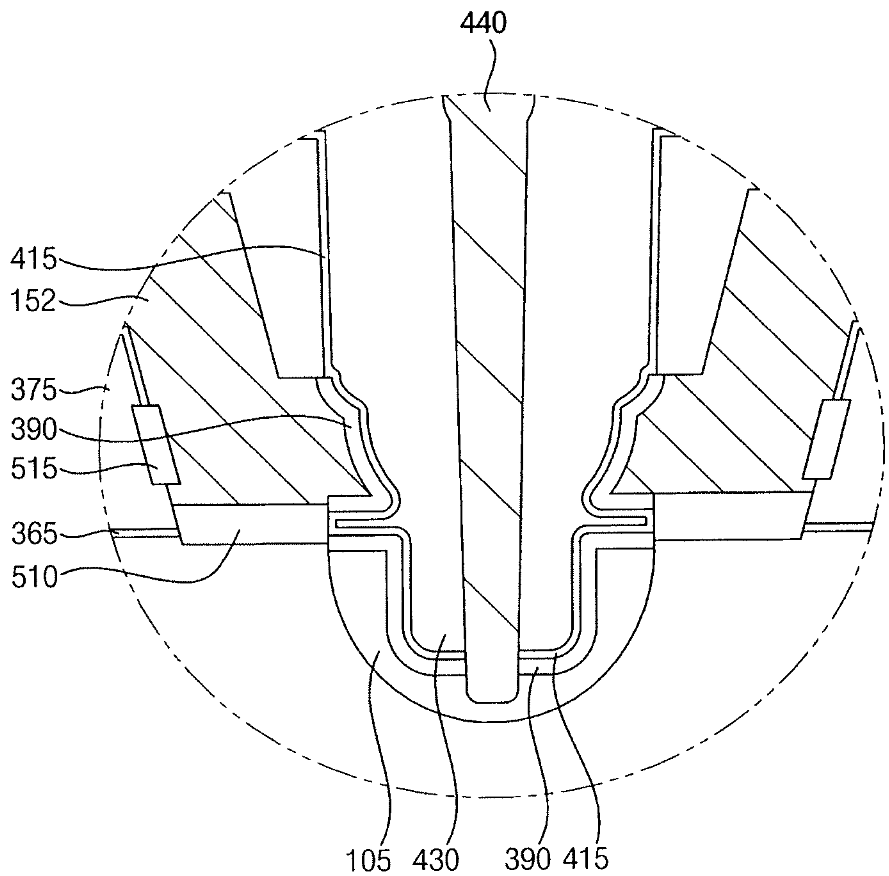
Figure 63:
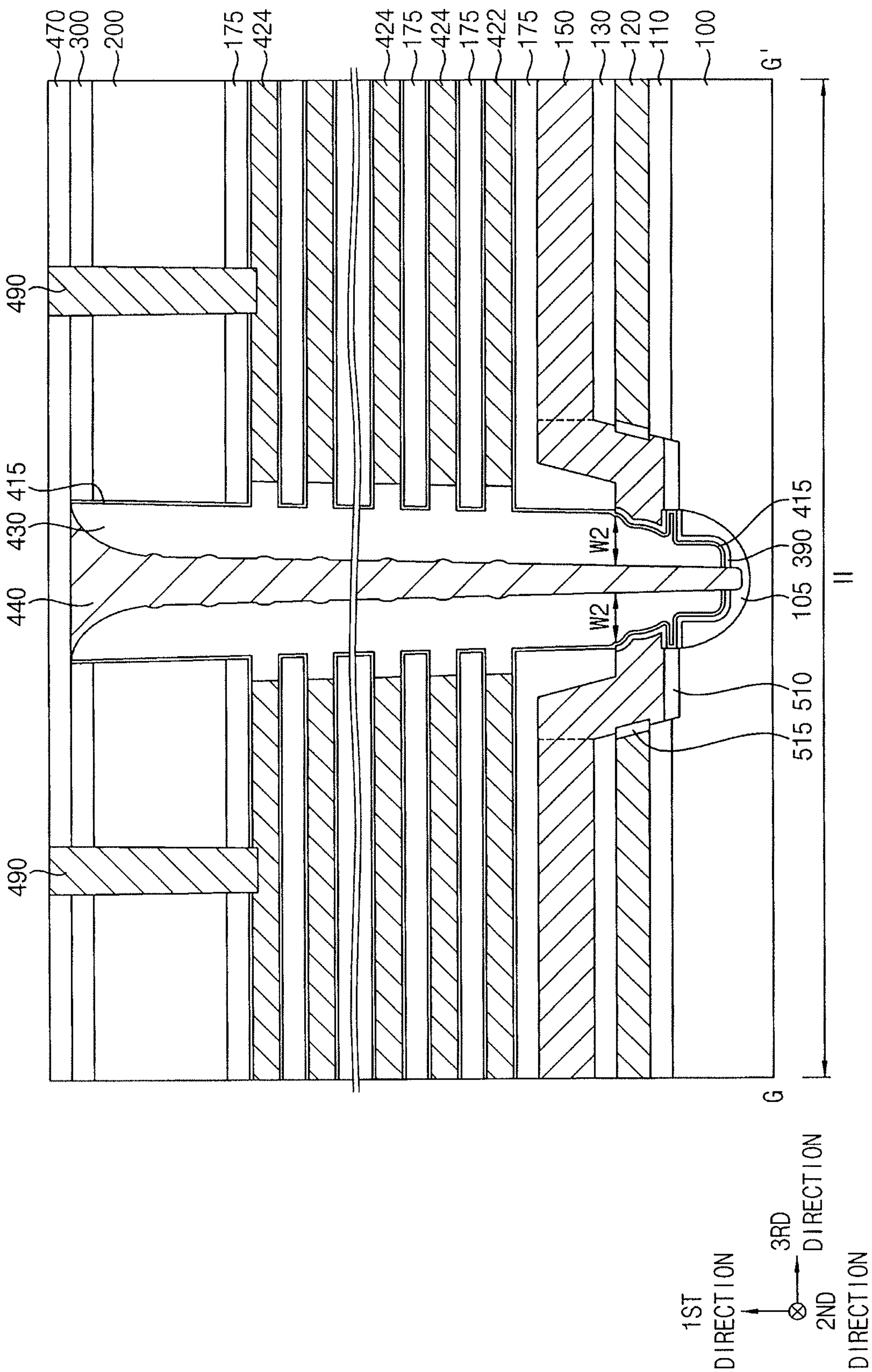

FIGS. 62A, 62B, and 63 illustrate cross-sectional views illustrating a vertical memory device in accordance with example embodiments. FIGS. 62A and 62B illustrate cross-sectional views taken along lines A-A' of corresponding plan views, and FIG. 63 illustrates a cross-sectional view taken along a line G-G' of a corresponding plan view. FIG. 62B illustrate an enlarged cross-sectional view of a region W of FIG. 62A.

This vertical memory device may be substantially the same as or similar to that of FIGS. 1 to 7, except for including third and fourth etch stop patterns instead of the second etch stop layer and the second etch stop pattern. Thus, like reference numerals refer to like elements, and repeated descriptions thereof may be omitted herein.

Referring to FIGS. 62A, 62B, and 63, on the first region I of the substrate 100, the vertical memory device may further include third second etch stop pattern 510 between an upper surface of the substrate 100 and the first support pattern 152, and a fourth etch stop pattern 515 on a portion of the sidewall of the first etch stop pattern 390.

An upper surface of the third etch stop pattern 510 may be higher than that of the substrate 100 and a lower surface of the third etch stop pattern 510 may be lower than the upper surface of the substrate 100. A sidewall of the third etch stop pattern 510 facing the first CSL 440 may contact the second blocking pattern 415.

The fourth etch stop pattern 515 may protrude from the sidewall of the channel connecting pattern 375 in the third direction, and may have a convex shape toward the central portion of the channel connecting pattern 375 in the third direction.

On the second region II of the substrate 100, the vertical memory device may further include the third second etch stop pattern 510 between an upper surface of the substrate 100 and each of the second and third support patterns 154 and 156, and the fourth etch stop pattern 515 between each of the second and third support patterns 154 and 156 and the sidewall of the second sacrificial layer 120 of the sacrificial layer structure.

An upper surface of the third etch stop pattern 510 may be higher than that of the substrate 100 and a lower surface of the third etch stop pattern 510 may be lower than the upper surface of the substrate 100. A sidewall of the third etch stop pattern 510 facing the first CSL 440 may contact the second blocking pattern 415.

The fourth etch stop pattern 515 may protrude from the sidewall of each of the second and third support patterns 154 and 156 in the third direction, and may have a convex shape toward the second sacrificial layer 120 in the third direction.

The third etch stop pattern 510 may include an oxide of a material included in the substrate 100, e.g., silicon oxide doped with impurities, and the fourth etch stop pattern 515 may include an oxide of a material included in the second sacrificial layer 120, e.g., oxynitride.

Figure 64:
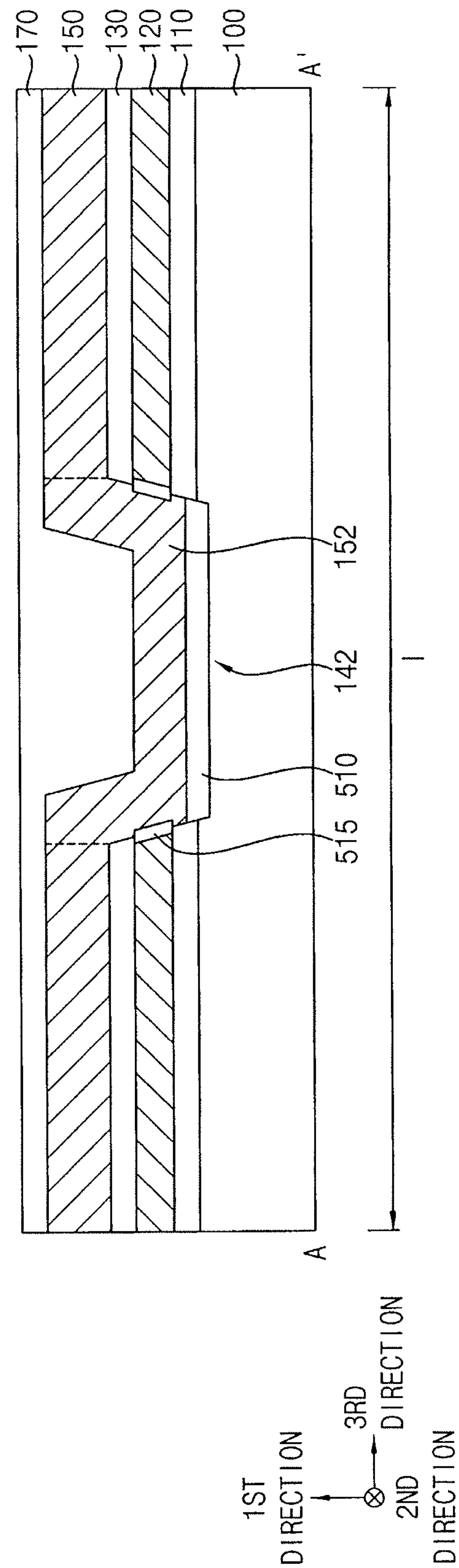
FIG. 64 illustrates a cross-sectional view of a stage in a method of manufacturing a vertical memory device in accordance with example embodiments, and a cross-sectional view taken along a line A-A' of a corresponding plan view.

FIG. 64 illustrates a cross-sectional view of a stage in a method of manufacturing a vertical memory device in accordance with example embodiments, and a cross-sectional view taken along a line A-A' of a corresponding plan view. This method may include processes substantially the same as or similar to those illustrated with reference to FIGS. 55 to 61, 62A, 62B and 63, and thus repeated explanations thereof may be omitted herein.

Referring to FIG. 64, processes substantially the same as or similar to those illustrated with reference to FIG. 55 may be performed.

In an implementation, instead of forming the second etch stop layer 500, an oxidation process may be performed on the silicon-containing layers to form third and fourth etch stop patterns 510 and 515. For example, the upper surface of the substrate 100 exposed by the first to third openings 142, 144, and 146 may be oxidized to form the third etch stop pattern 510, and the sidewall of the second sacrificial layer 120 exposed by the first to third openings 142, 144, and 146 may be oxidized to form the fourth etch stop pattern 515.

In an implementation, the third etch stop pattern 510 may include silicon oxide doped with impurities, and the fourth etch stop pattern 515 may include an oxynitride (e.g., silicon oxynitride).

Processes substantially the same as or similar to those illustrated with reference to FIGS. 56 to 61, 62A, 62B and 63 may be performed to complete the fabrication of the vertical memory device.

Figure 65:
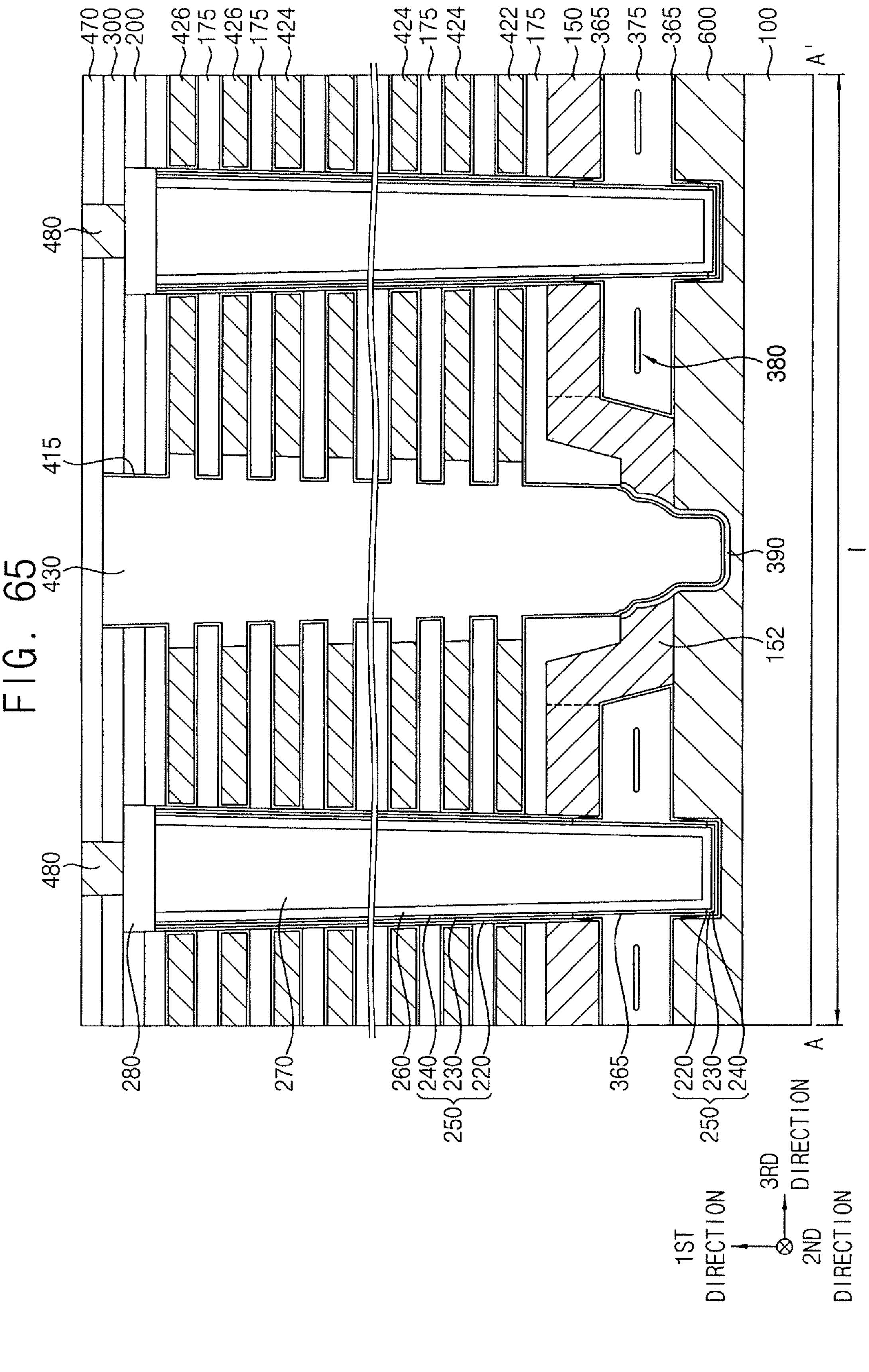
FIGS. 65 and 66 illustrate cross-sectional views of a vertical memory device in accordance with example embodiments.
Figure 66:
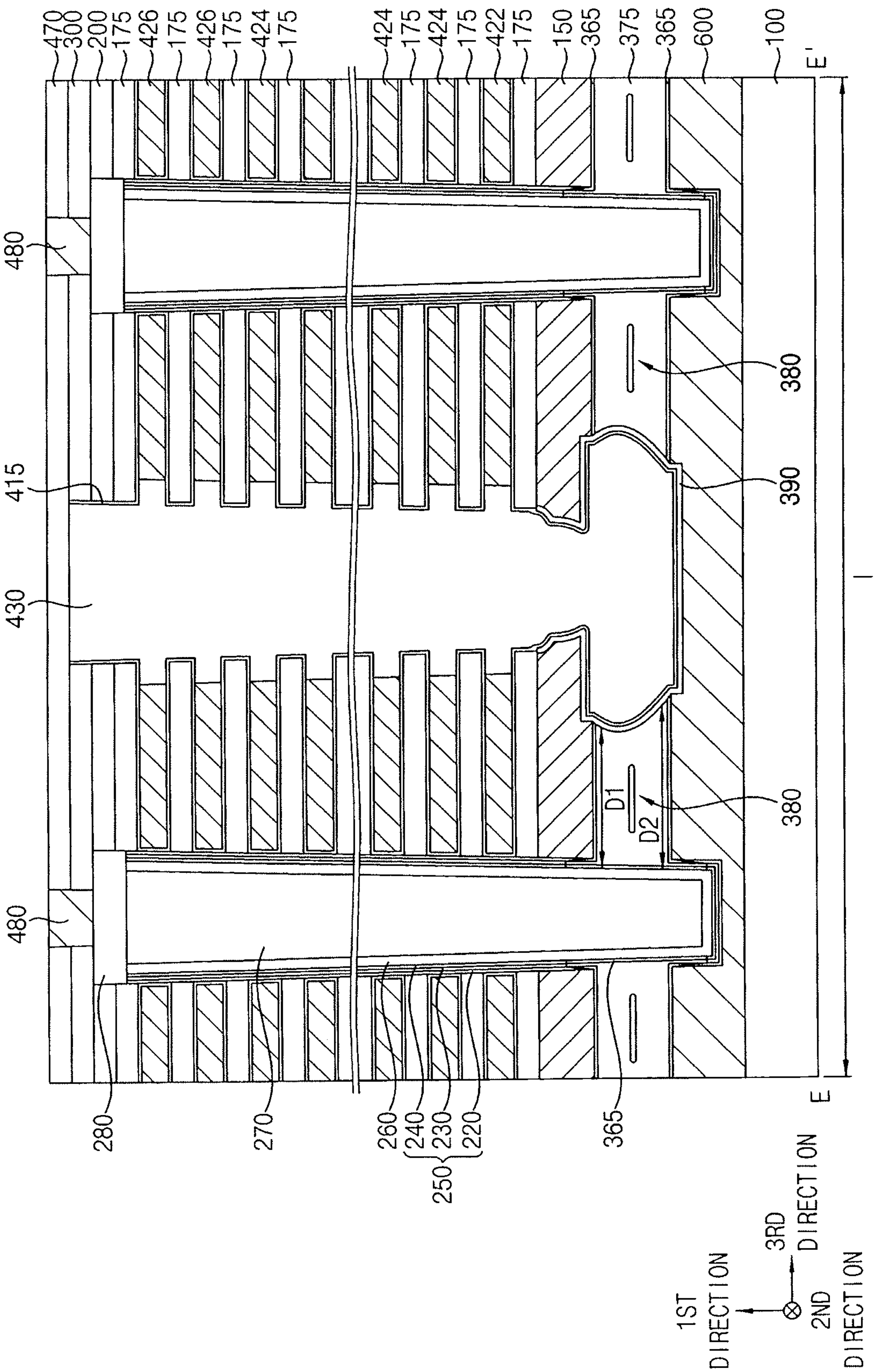

FIGS. 65 and 66 illustrate cross-sectional views of a vertical memory device in accordance with example embodiments. FIG. 65 illustrates a cross-sectional view taken along a line A-A' of a corresponding plan view, and FIG. 66 illustrates a cross-sectional view taken along a line E-E' of a corresponding plan view.

This vertical memory device may be substantially the same as or similar to that of FIGS. 1 to 7, except for the CSL and a CSL plate. Thus, like reference numerals refer to like elements, and repeated descriptions thereof may be omitted herein.

Referring to FIGS. 65 and 66, the vertical memory device may further include a CSL plate 600 between the substrate 100 and the channel connecting pattern 375 and the first to third support patterns 152, 154, and 156, and no CSL extending in the first direction may be formed.

For example, only the second spacer 430 may be formed in each of the ninth to eleventh openings 315, 325, and 335, and no impurity region may be formed at an upper portion of the substrate 100.

The CSL plate 600 may include, e.g., a metal, a metal nitride, a metal silicide, or the like, and the channels 260 may be electrically connected to the CSL plate 600 on the substrate 100 through the channel connecting pattern 375.

By way of summation and review, if polysilicon layers do not fill gaps completely, voids could be generated in the polysilicon layers.

One or more embodiments may provide a vertical memory device having improved characteristics.

In the vertical memory device in accordance with example embodiments, an air gap in the channel connecting pattern may be formed far from the CSL, and the deterioration of the characteristics due to the penetration of metal into the air gap may be prevented. Additionally, the upper surface of the substrate adjacent the channel connecting pattern may be protected by the seed pattern and the etch stop pattern, and the vertical memory device may have enhanced characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A vertical memory device, comprising:

a substrate;

channels on the substrate, each of the channels extending in a first direction perpendicular to an upper surface of the substrate;

a channel connecting pattern extending in a second direction parallel to the upper surface of the substrate to cover outer sidewalls of the channels, the channel connecting pattern connecting the channels with each other;

gate electrodes on the channel connecting pattern and spaced apart from each other in the first direction, each of the gate electrodes extending in the second direction to surround the channels; and an etch stop pattern and a blocking pattern sequentially stacked in a third direction on an end of the channel connecting pattern, the third direction being parallel to the upper surface of the substrate and crossing the second direction, and the etch stop pattern and the blocking pattern including different materials from each other.

2. The vertical memory device as claimed in claim 1, wherein:

the channel connecting pattern includes doped polysilicon, the etch stop pattern includes silicon oxide, and the blocking pattern includes a metal oxide.

3. The vertical memory device as claimed in claim 1, wherein a sidewall of the end of the channel connecting pattern is recessed in the third direction toward a central portion of the channel connecting pattern.

4. The vertical memory device as claimed in claim 3, wherein the sidewall of the end of the channel connecting pattern has a non-symmetrical shape in the first direction with respect to an imaginary line passing through a central portion of the channel connecting pattern.

5. The vertical memory device as claimed in claim 4, wherein a distance from one of the channels to an upper portion of the sidewall of the end of the channel connecting pattern in the third direction is less than a distance from the one of the channels to a lower portion of the sidewall of the end of the channel connecting pattern in the third direction.

6. The vertical memory device as claimed in claim 3, wherein the sidewall of the end of the channel connecting pattern has a symmetrical shape in the first direction with respect to an imaginary line passing through a central portion of the channel connecting pattern.

7. The vertical memory device as claimed in claim 1, further comprising a support layer between the channel connecting pattern and a lowermost one of the gate electrodes, the support layer including doped polysilicon.

8. The vertical memory device as claimed in claim 7, wherein the etch stop pattern and the blocking pattern are on a sidewall and a lower surface of the support layer.

9. The vertical memory device as claimed in claim 7, wherein:

the support layer extends in the second direction, and a bottom surface of an end of the support layer is higher than bottom surfaces of other portions thereof.

10. The vertical memory device as claimed in claim 7, further comprising at least one support pattern contacting the upper surface of the substrate and being connected to the end of the support layer, the at least one support pattern including a material substantially the same as that of the support layer.

11. The vertical memory device as claimed in claim 10, wherein the at least one support pattern includes a plurality of support patterns spaced apart from each other in the second direction.

12. The vertical memory device as claimed in claim 10, wherein:

the substrate includes a first region on which the channels are formed and a second region surrounding the first region, and the at least one support pattern includes:

at least one first support pattern on the first region of the substrate;

a second support pattern on a boundary between the first region and the second region of the substrate, the second support pattern extending in the third direction; and at least one third support pattern on the second region of the substrate, the at least one third support pattern extending from the second support pattern in the second direction.

13. The vertical memory device as claimed in claim 12, wherein:

the at least one first support pattern includes a plurality of first support patterns spaced apart from each other in the second direction, the at least one third support pattern includes a plurality of third support patterns spaced apart from each other in the third direction.

14. The vertical memory device as claimed in claim 13, further comprising an oxide layer, a nitride layer, and an oxide layer sequentially stacked in the first direction between the substrate and the support layer, the oxide layer, the nitride layer and the oxide layer being between neighboring ones of the plurality of third support patterns in the third direction.

15. The vertical memory device as claimed in claim 1, further comprising a seed pattern between the substrate and the channel connecting pattern, the seed pattern including silicon and impurities.

16. A vertical memory device, comprising:

a substrate;

a channel connecting pattern on the substrate;

gate electrodes on the channel connecting pattern and spaced apart from each other in a first direction perpendicular to an upper surface of the substrate, each of the gate electrodes extending in a second direction parallel to the upper surface of the substrate;

a channel on the substrate and extending in the first direction through the gate electrodes and the channel connecting pattern; and a seed pattern between the substrate and the channel connecting pattern and between the channel and the channel connecting pattern, the seed pattern including silicon and impurities.

17. The vertical memory device as claimed in claim 16, wherein the impurities include carbon, nitrogen, or oxygen.

18. A vertical memory device, comprising:

a substrate including a first region and a second region surrounding the first region;

channels on the first region of the substrate, each of the channels extending in a first direction perpendicular to an upper surface of the substrate;

a channel connecting pattern on the first region of the substrate and extending in a second direction parallel to the upper surface of the substrate, the channel connecting pattern covering outer sidewalls of the channels and connecting the channels with each other;

a sacrificial layer structure on the second region of the substrate and extending in the second direction at a height substantially equal to that of the channel connecting pattern, the sacrificial layer structure including a first sacrificial layer, a second sacrificial layer, and a third sacrificial layer sequentially stacked in the first direction;

a support layer on the channel connecting pattern and the sacrificial layer structure; and gate electrodes on the support layer and spaced apart from each other in the first direction, each of the gate electrodes extending in the second direction to surround the channels.

19. The vertical memory device as claimed in claim 18, wherein the first sacrificial layer, the second sacrificial layer, and the third sacrificial layer include an oxide, a nitride and an oxide, respectively.

20. The vertical memory device as claimed in claim 18, further comprising a support pattern structure connected to the support layer, the support pattern structure including:

at least one first support pattern on the first region of the substrate and adjacent to an end of the channel connecting pattern in a third direction parallel to the upper surface of the substrate and crossing the second direction;

a second support pattern on a boundary between the first region and the second region of the substrate, the second support pattern extending in the third direction; and at least one third support pattern on the second region of the substrate, the at least one third support pattern contacting the sacrificial layer structure and extending from the second support pattern in the second direction.

* * * * *